(12) United States Patent
Uno et al.

(10) Patent No.: US 12,200,384 B2
(45) Date of Patent: Jan. 14, 2025

(54) SYSTEM, METHOD, DEVICE AND DATA STRUCTURE FOR DIGITAL PIXEL SENSORS

(71) Applicant: BRILLNICS SINGAPORE PTE. LTD., Singapore (SG)

(72) Inventors: Masayuki Uno, Tokyo (JP); Rimon Ikeno, Tokyo (JP); Ken Miyauchi, Tokyo (JP); Kazuya Mori, Tokyo (JP); Hideki Owada, Tokyo (JP)

(73) Assignee: BRILLNICS SINGAPORE PTE. LTD., Singapore (SG)

( * ) Notice: Subject to any disclaimer, the term of this patent is extended or adjusted under 35 U.S.C. 154(b) by 67 days.

(21) Appl. No.: 17/999,693

(22) PCT Filed: May 24, 2021

(86) PCT No.: PCT/SG2021/050286
§ 371 (c)(1),
(2) Date: Nov. 22, 2022

(87) PCT Pub. No.: WO2021/236021
PCT Pub. Date: Nov. 25, 2021

(65) Prior Publication Data
US 2023/0300497 A1    Sep. 21, 2023

Related U.S. Application Data

(60) Provisional application No. 63/029,057, filed on May 22, 2020.

(51) Int. Cl.
*H04N 25/772*    (2023.01)
*H01L 27/146*    (2006.01)
(Continued)

(52) U.S. Cl.
CPC ..... *H04N 25/772* (2023.01); *H01L 27/14612* (2013.01); *H04N 25/77* (2023.01); *H04N 25/78* (2023.01)

(58) Field of Classification Search
CPC ...... H04N 25/772; H04N 25/77; H04N 25/78; H04N 25/46; H04N 25/79;
(Continued)

(56) References Cited

U.S. PATENT DOCUMENTS

2012/0175685 A1    7/2012  Kim
2014/0252437 A1    9/2014  Oh
(Continued)

FOREIGN PATENT DOCUMENTS

EP    3 468 168 A1    4/2019

OTHER PUBLICATIONS

Patent Cooperation Treaty, International Search Report issued in PCT/SG2021/050286, Aug. 10, 2021, pp. 1-5.
(Continued)

*Primary Examiner* — Shahbaz Nazrul
(74) *Attorney, Agent, or Firm* — Pillsbury Winthrop Shaw

(57) ABSTRACT

Some embodiments relate to an imaging system including an active pixel a comparator, a write control circuit, and an analog-to-digital conversion (ADC) memory. The active pixel may include a photodiode and a plurality of transistors. The comparator may be operative coupled to the active pixel and configured to receive an output of the active pixel. The write control circuit may be operative coupled to the comparator and configured to receive an output from the comparator. The ADC memory may be operatively coupled to the write control circuit. A data structure may be stored in the ADC memory, and may be configured to store at least a first (Continued)

data string, which may include a set of flag bits for identifying each ADC operation performed and a set of ADC data bits.

18 Claims, 34 Drawing Sheets

(51) Int. Cl.
*H04N 25/77* (2023.01)
*H04N 25/78* (2023.01)

(58) Field of Classification Search
CPC ......... H01L 27/14612; H01L 27/14603; H01L 27/1461; H01L 27/14641
See application file for complete search history.

(56) References Cited

U.S. PATENT DOCUMENTS

| | | | |
|---|---|---|---|
| 2014/0320716 A1* | 10/2014 | Huang | .................. H04N 25/78 348/302 |
| 2018/0152650 A1 | 5/2018 | Sakakibara et al. | |
| 2019/0115931 A1* | 4/2019 | Hurwitz | .............. H03M 1/1295 |
| 2019/0187260 A1 | 6/2019 | Van Der Tempel | |
| 2019/0273114 A1 | 9/2019 | Liu | |
| 2020/0068189 A1 | 2/2020 | Chen et al. | |
| 2020/0228738 A1 | 7/2020 | Ogawa et al. | |
| 2021/0168314 A1 | 6/2021 | Mehta | |
| 2022/0116565 A1 | 4/2022 | Tsai et al. | |
| 2022/0264045 A1 | 8/2022 | Miyata | |
| 2023/0239594 A1* | 7/2023 | Uno | .................. H01L 27/14603 348/308 |
| 2023/0300493 A1* | 9/2023 | Uno | .................... H01L 27/1461 348/207.99 |

OTHER PUBLICATIONS

Crooks et al., "A CMOS Image Sensor With In-Pixel ADC, Timestamp, and Sparse Readout", IEEE Sensors Journal, IEEE Service Center, Jan. 1, 2009, pp. 20-28, pp. 20-28, vol. 9(1).
Patent Cooperation Treaty, International Search Report issued in PCT/SG2021/050288, Sep. 16, 2021, pp. 1-3.
Patent Cooperation Treaty, International Search Report issued in PCT/SG2021/050284, Aug. 11, 2021, pp. 1-4.
U.S. Patent Office, Official Action issued in U.S. Appl. No. 17/999,690, filed Jun. 21, 2024, pp. 1-13.
United States Patent and Trademark Office, Non-Final Office Action issued in U.S. Appl. No. 17/999,682, filed Jul. 2, 2024, pp. 1-10.
European Patent Office, Official Action issued in EP Patent Application No. 21729667.2, Jun. 26, 2024, pp. 1-5.
European Patent Office, Official Action issued in EP Patent Application No. 21729975.9, Jun. 26, 2024, pp. 1-7.
Patent Cooperation Treaty, International Search Report issued in PCT/SG2021/050284, Aug. 11, 2021, pp. 1-2.
United States Patent and Trademark Office, 892 issued in U.S. Appl. No. 17/999,682, filed Nov. 6, 2024, p. 1.

* cited by examiner

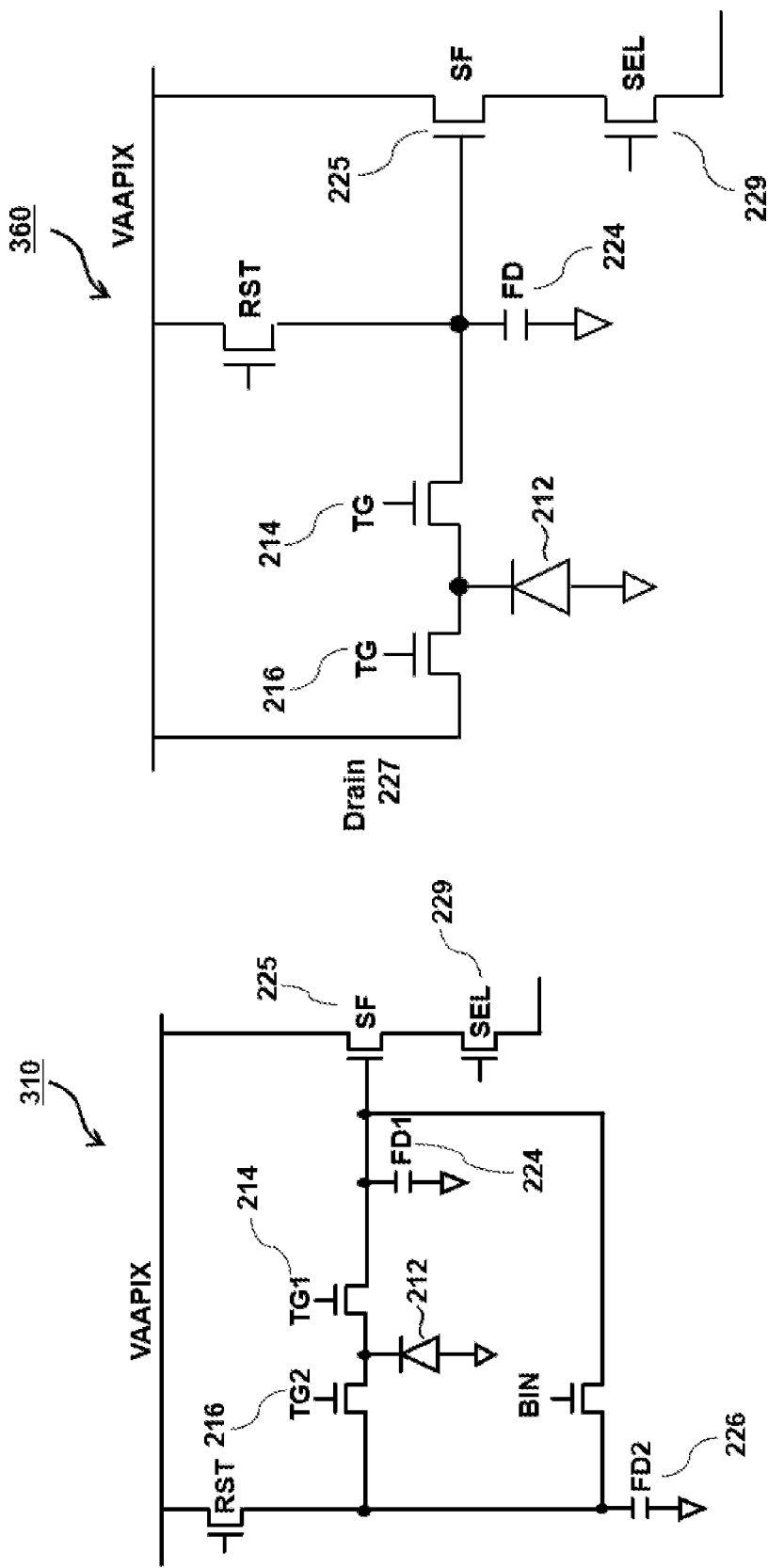

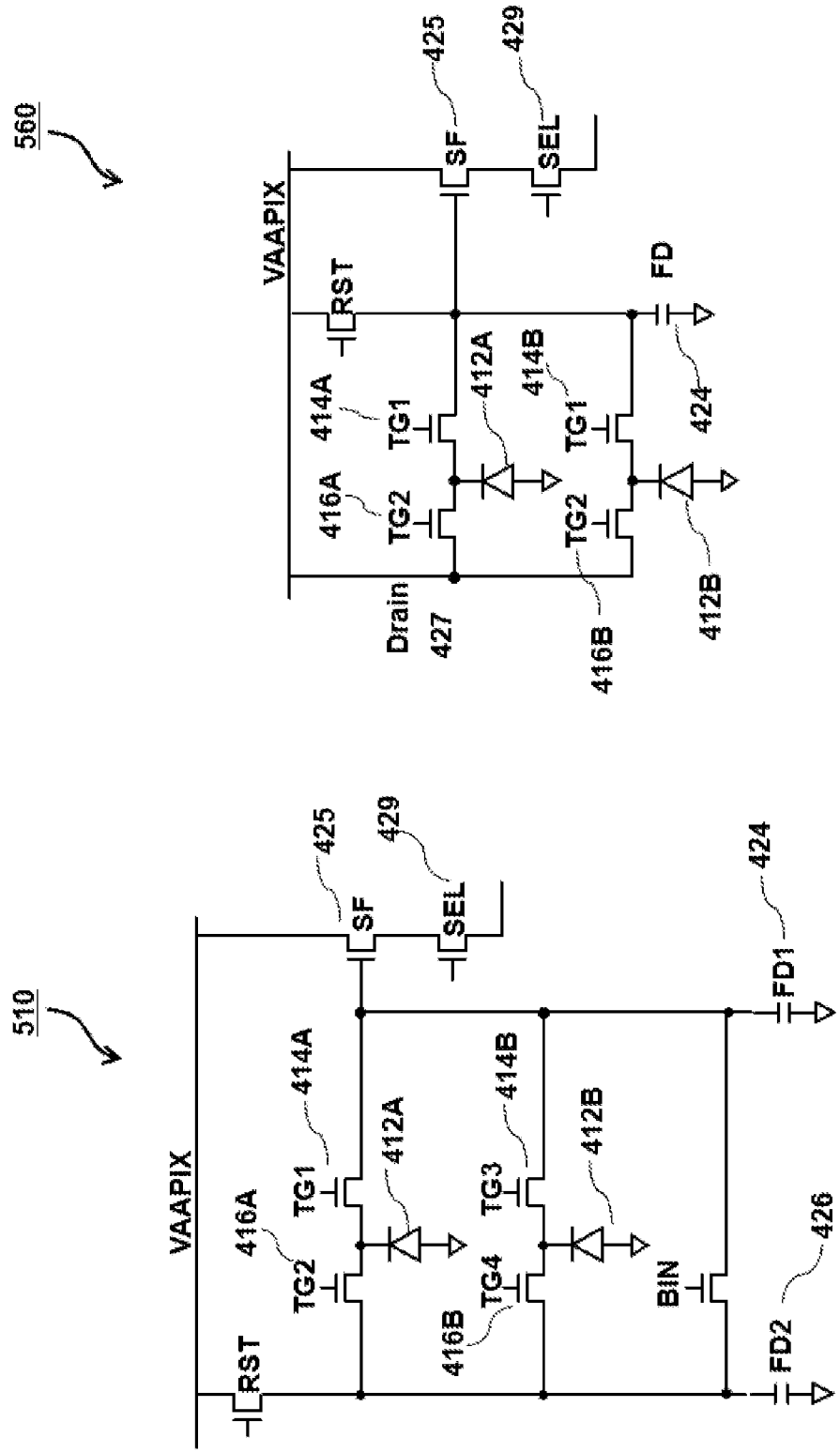

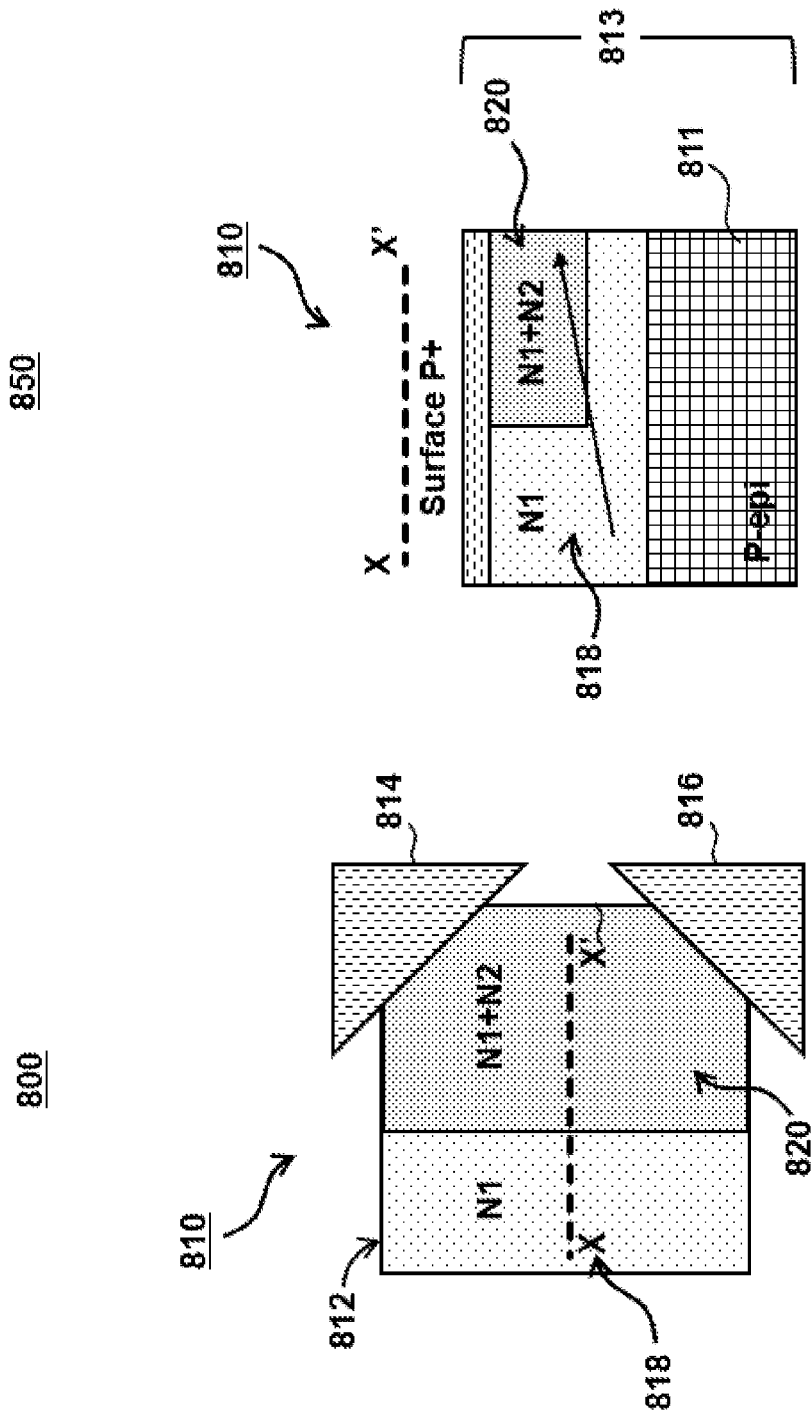

SYSTEM, METHOD, DEVICE AND DATA STRUCTURE FOR DIGITAL PIXEL SENSORS

CROSS-REFERENCE TO RELATED APPLICATIONS

This application claims the benefit of U.S. Provisional Patent Application No. 63/029,057, entitled "System, Method, Device and Data Structure for Digital Pixel Sensors," which was filed on May 22, 2020, the disclosure of which is hereby incorporated by reference in its entirety.

BACKGROUND

Digital Pixel Sensors (DPS) used for image sensing applications are known. Image sensor systems utilizing Complementary Metal-Oxide Semiconductors (CMOS) photodiodes used in active pixel structures for pixel regions having multiple transfer gates are also known. However, these known DPS systems are unable to achieve full charge transfer from the pixel regions when scaling pixel size. Lack of full charge transfer can negatively affect noise, fill factor, lag, and other attributes of DPS.

DPS systems including a photo-conversion part and an application specific integrated circuits (ASICs) part for signal processing are also known. However, because these DPS systems implement a flag bit that is separated from an analog-to-digital conversion (ADC) data bit, a technical problem arises in that these DPS systems necessitates the use of a complex readout procedure because of a need for an independent readout control signal for the flag bit on write control and readout. Another technical problem thus arising of these DPS systems is that the complex readout procedure causes an increased number of wires to be used for, which can disturb DPS systems having small pixel sizes.

SUMMARY

Accordingly, one or more aspects of the present disclosure relate to an image sensor system. The image sensor system includes one or more active pixels each coupled to an analog-to-digital conversion (ADC). In some embodiments, the ADC includes a comparator, a memory coupled to a data bus, and a write control circuit. Some aspects relate to a solid-state device for use in a DPS imaging system. In some embodiments, the solid-state device includes at least one pixel region configured for two-way charge transfer. The solid-state device includes a first transfer gate and a second transfer gate having first poly layer and a first charge well layer and are configured for causing an electron drift current from a first side of the pixel region to a second side of the pixel region thereby providing the two-way charge transfer based on an operation of the first and second transfer gates.

Another aspect of the present disclosure relates to an apparatus for use in DPS image sensors comprising a pixel circuit. In some embodiments, the pixel circuit includes at least two transfer gates, a photodiode region, and a floating diffusion region. In some embodiments, the pixel circuit is configured for optimized charge movement from the photodiode region to the floating diffusion region by an induced electric field of the first and second transfer gates.

Another aspect of the present disclosure relates to a method of forming a DPS semiconductor device. In some embodiments, the method includes providing a substrate layer and forming, on the substrate layer, a first implant layer having a first conductive property. In some embodiments, the method includes forming, on at least a portion of the first layer, a second implant layer having a second conductive property and forming at least a first transfer gate and a second transfer gate, on the second implant layer. In some embodiments, an operation of the first and second transfer gate causes an electron drift current from the first implant layer to the second implant layer. In some embodiments, the electron drift current corresponds to a two-way charge transfer from the substrate layer to the first implant layer, and from the first implant layer to the first gate or the second gate.

Yet another aspect of the present disclosure relates to DPS device for use in indirect time of flight measurements. In some embodiments, the DPS device includes a photodiode, a first floating diffusion, a second floating diffusion, a first transfer gate, and a second transfer gate. In some embodiments, the DPS device is configured to implement a method for determining a physical distance to an object proximate to the DPS device. In some embodiments, the method includes transferring charge collected by the photodiode to the first floating diffusion or the second floating diffusion by switching either the first transfer gate or the second transfer gate, and determining a delay in a received impulse based on the charge in the first or second floating diffusion. In some embodiments, determining a distance to the physical object is based on the delay.

Some aspects of the present disclosure relate to a data structure for use in an image sensor systems having at least one ADC, write control circuitry, state latch, and ADC memory. In some embodiments, the data structure includes a flag bit and an ADC bit. In some embodiments, wherein the flag bit is configured for state control for the at least one ADC utilizing the write control circuit and data latch for communicating the data structure.

These and other objects, features, and characteristics of the present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the disclosure.

BRIEF DESCRIPTION OF THE DRAWINGS

FIGS. 3A-3B are circuit diagrams of the example active pixels of FIGS. 2A-2B, in accordance with one or more embodiments;

FIGS. 5A-5B are circuit diagrams of the example active pixels of FIGS. 4A-4B, in accordance with one or more embodiments;

FIGS. 8A-8B are schematic representation of a top view and a side view of an example active pixels, in accordance with one or more embodiments;

DETAILED DESCRIPTION OF EXEMPLARY EMBODIMENTS

Figure 1A:
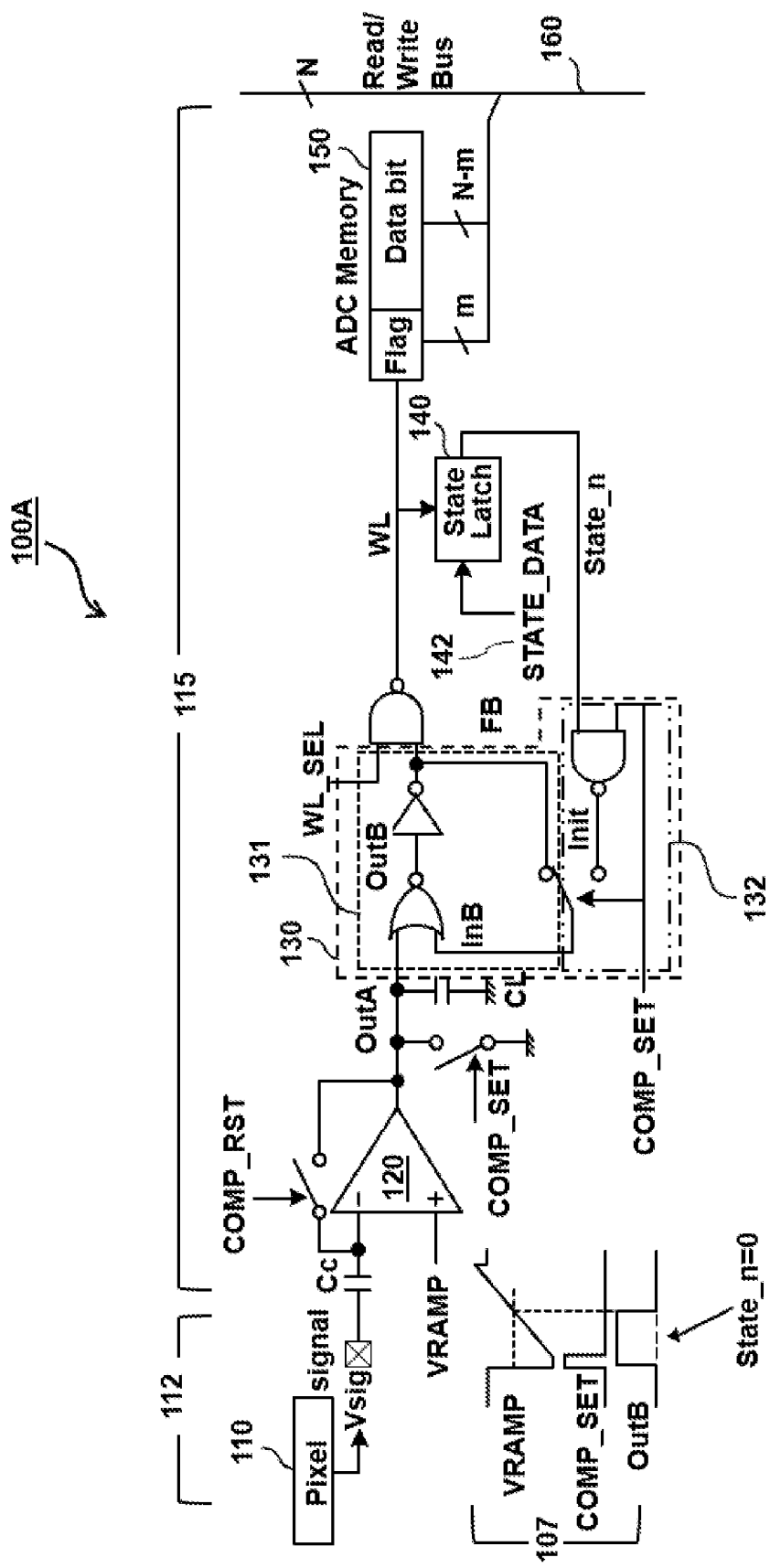
FIG. 1A is a schematic representation of an exemplary DPS image sensing system, in accordance with one or more embodiments.

The present application will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements.

Moreover, where certain elements of the present invention can be partially or fully implemented using known components, only those portions of such known components that are necessary for an understanding of the present application will be described, and detailed descriptions of other portions of such known components will be omitted so as not to obscure the invention. As used herein, the singular form of "a", "an", and "the" include plural references unless the context clearly dictates otherwise. As used herein, the statement that two or more parts or components are "coupled" shall mean that the parts are joined or operate together either directly or indirectly (i.e., through one or more intermediate parts or components, so long as a link occurs).

Embodiments described as being implemented in hardware should not be limited thereto, but can include embodiments implemented in software, or combinations of software and hardware, and vice-versa, as will be apparent to those skilled in the art, unless otherwise specified herein. In the exemplary embodiments described herein, an embodiment showing a singular component should not be considered limiting; rather, other embodiments including a plurality of the same component, and vice-versa, unless explicitly stated otherwise herein are also encompassed. Moreover, there is no intention for any term in the specification or claims to be ascribed an uncommon or special meaning unless explicitly set forth as such. Further, the present application encompasses present and future known equivalents to the known components referred to herein by way of illustration.

As used herein, "directly coupled" means that two elements are directly in contact with each other. As used herein, "fixedly coupled" or "fixed" means that two components are coupled so as to move as one while maintaining a constant orientation relative to each other. As used herein, "operatively coupled" means that two elements are coupled in such a way that the two elements function together. It is to be understood that two elements "operatively coupled" does not require a direct connection or a permanent connection between them.

As used herein, the word "unitary" means a component is created as a single piece or unit. That is, a component that includes pieces that are created separately and then coupled together as a unit is not a "unitary" component or body. As employed herein, the statement that two or more parts or components "engage" one another shall mean that the parts exert a force against one another either directly or through one or more intermediate parts or components. As employed herein, the term "number" shall mean one or an integer greater than one (i.e., a plurality). Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

As discussed in further detail below, methods, systems, devices, and apparatuses of the embodiments describe herein may include an active-pixel sensor (e.g., a complementary metal-oxide semiconductor (CMOS) sensor) configured for complete charge transfer in a photodiode via generation of an electric field. Discussed in further detail below, the generated electric field may be facilitated by an operation of two transfer gates. The operation of the two transfer gates may induce a drift current in two directions, thereby providing two-way and complete charge transfer from the photodiode to floating diffusion regions. Therefore, a technical effect of reducing lag can be achieved.

FIG. 1A is a schematic representation of an exemplary DPS image sensing system 100A, in accordance with one or more embodiments. DPS image sensing system 100A may include a sensing front-end circuit 112 operatively coupled to a back-end ADC and memory circuit 115. A back-end ADC and memory circuit may be referred to herein interchangeably as an Back-end ADC and memory circuit. In some embodiments, sensing front-end circuit 112 may be operatively coupled to back-end ADC and memory circuit 115 via coupling capacitor Cc. In some embodiments, the sensing front-end circuit 112 may include an active pixel 110. As described herein, the term "active pixel" may be referred to interchangeably with the term "pixel device." In some embodiments, back-end ADC and memory circuit 115 may include a comparator 120, a write control circuit 130, a state latch 140, one or more instances of an ADC memory 150, coupling capacitor Cc, or other components. As described herein, the terms "pixel sensor," "pixel," "digital pixel," and "pixel portion" refer to one or more instances of one or more photodetectors, photodiodes, photovoltaic devices, solid-state transistor devices, or other image sensing components, and may be used herein interchangeably. Additionally, as described herein, the terms "photodiodes" and "photodetectors" refer to a two-terminal photovoltaic solid-state semiconductor device having electrical characteristics that are light-sensitive, and may be used herein interchangeably.

In some embodiments, DPS image sensing system 100A may be utilized in a 2D array of active pixels, each having dedicated signal processing circuits (e.g., comparator 120, write control circuit 130, ADC memory 150) coupled to a read/write data bus line 160. A time code may be supplied to read/write data bus line 160 from a time code generator (not shown). The time code is a count value as understood by those of ordinary skill in the art. The time code corresponds to an ADC-code, which is further described below. In some embodiments, the 2D array of active pixels having dedicated signal processing circuits may be packaged as a DPS-on-Chip. A DPS-on-Chip package may include bonding components, protective glass, and/or other components. For example, a DPS-on-Chip package may include contact pads for operatively coupling the DPS-on-Chip to a printed circuit board (PCB).

Comparator 120 may include a 1-bit comparator coupled to a latch (e.g., state latch 140). In some embodiments, comparator 120 may provide ADC functionality by converting an input voltage (e.g., Vsig) to a corresponding digital value (e.g., a midpoint value of VRAMP as shown in inlet 107 of FIG. 1A). In some embodiments, state latch 140 and write control circuit 130 of back-end ADC and memory circuit 115 may be in communication with ADC memory 150. In some embodiments, an output of state latch 140 is used to control ADC operations. For example, ADC operations may be controlled using a one bit Boolean control signal that may be latched at and output from state latch 140. The ADC operations may include one or more different modes. For example, the ADC operations may include a Time Stamp ADC operation, a high conversion gain ADC (HCG ADS), a low conversion gain ADC (LCG ADC).

Additional details related to state latch 140 and its functions may be found below with reference to FIG. 17.

ADC memory 150 may be configured to store a data bit corresponding to state data (e.g., STATE_DATA 142) held in state latch 140. In some embodiments, ADC memory 150 may include a gray code counter. In some embodiments, ADC memory 150 includes a flag bit and a data bit, which may utilize a DPS data structure described in further detail below.

Write control circuit 130 may include a positive feedback circuit 131 and an initializing circuit 132. In some embodiments, positive feedback circuit 131 is a multi-input logical gate, configured to take an output from comparator 120 as a first input and an output from positive feedback circuit 131 as a second input. For instance, the logical gate may be a NOR. Positive feedback circuit 131 may also include an inverter configured to take, as input, an output of the logical gate (e.g., the NOR gate). In some embodiments, initializing circuit 132 may include a pair of transistors configured to function as a NAND gate. For example, the pair of transistors may be a pair of pMOS transistors, which are described in greater detail with reference to FIG. 15. In some embodiments, when the signal (FB) from positive feedback circuit 131 is FB=1, positive feedback circuit 131 is locked. Initializing circuit 132 may be used to release positive feedback circuit 131 from being locked using a control signal received from state latch 140.

Figure 1B:
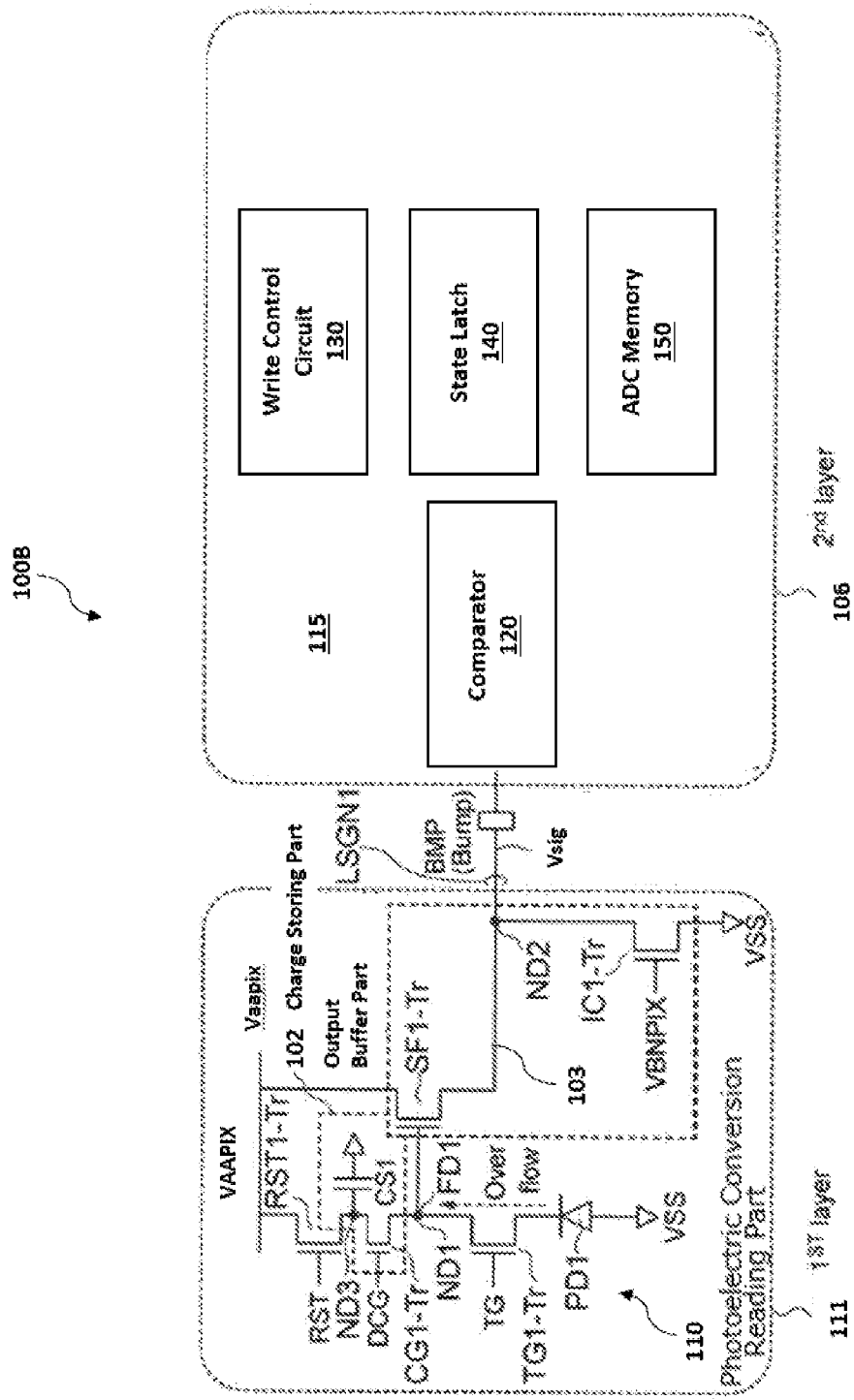
FIG. 1B is a schematic representation of another exemplary DPS image sensing system, in accordance with one or more embodiments.

FIG. 1B is a schematic representation of another exemplary DPS image sensing system 100B, in accordance with one or more embodiments. In some embodiments, an active pixel 110 is formed in a first substrate 111, and each element included in back-end ADC and memory circuit 115 (e.g., comparator 120, write control circuit 130, state latch 140, ADC memory 150) may be formed in a second substrate 106. The term "active pixel" may be referred to herein interchangeably as a "photoelectric conversion reading part." Active pixel 110 of DPS image sensing system 100B may includes a photodiode (a photoelectric conversion element) and an in-pixel amplifier. More specifically, active pixel 110 may include, for example, a photodiode PD1, which is a photoelectric conversion element. For the photodiode PD1, one transfer transistor TG1-Tr serving as a transferring element, one reset transistor RST1-Tr serving as a resetting element, one source follower transistor SF1-Tr serving as a source follower element, one current transistor IC1-Tr serving as a current source element, one storage transistor CG1-Tr, one storage capacitor CS1 serving as a storage capacitor element, one floating diffusion FD1 serving as an output node ND1, and one reading node ND2 are provided. As described above, active pixel 110 may include five transistors (5Tr), namely, a transfer transistor TG1-Tr, a reset transistor RST1-Tr, a source follower transistor SF1-Tr, a current transistor IC1-Tr, and a storage transistor CG1-Tr.

In some embodiments, the source follower transistor SF1-Tr, the current transistor IC1-Tr, and the reading node ND2 together constitute an output buffer part 103. In some embodiments, the storage transistor CG1-Tr and the storage capacitor CS1 serving as a storage capacitor element together constitute a charge storing part 102.

In some embodiments, reading node ND2 of an output buffer part 103 of active pixel 110 is connected to an input part of back-end ADC and memory circuit 115. In some embodiments, active pixel 110 may convert the charges in the floating diffusion FD1 serving as an output node into a voltage signal at a level corresponding to the amount of the charges and outputs the voltage signal VSL to back-end ADC and memory circuit 115.

Active pixel 110 may output, in a first comparing operation period PCMPR1 of back-end ADC and memory circuit 115, a voltage signal VSL corresponding to the overflow charges overflowing from the photodiode PD1, which is a photoelectric conversion element, to the floating diffusion FD1 serving as an output node in a storing period PI.

In some embodiments, active pixel 110 may output, in a second comparing operation period PCMPR2 of back-end ADC and memory circuit 115, a voltage signal VSL corresponding to the charges stored in the photodiode PD1 that are transferred to the floating diffusion FD1 serving as an output node in the transfer period PT following the storing period PI. Active pixel 110 may output a read-out reset signal (signal voltage) (VRST) and a read-out signal (signal voltage) (VSIG), as a pixel signal, to back-end ADC and memory circuit 115 in the second comparing operation period PCMPR2.

Furthermore, active pixel 110 may output, in a third comparing operation period PCMPR3 of back-end ADC and memory circuit 115, a voltage signal VSL corresponding to the sum of (adding together) the charges stored in a charge storing part 102 and the charges stored in the photodiode PD1 that are transferred to the floating diffusion FD1 serving as an output node in the transfer period PT following the storing period PI. Active pixel 110 may output a read-out reset signal (signal voltage) (VRST) and a read-out signal (signal voltage) (VSIG), as a pixel signal, to back-end ADC and memory circuit 115 in the third comparing operation period PCMPR3.

In some embodiments, active pixel 110 may perform a first conversion gain reset reading operation HCGRRD in a first reset period PR1 to read, from an output buffer part 103, a first read-out reset signal HCGVRST that is obtained by conversion with a first conversion gain (e.g., a high conversion gain: HCG) determined by a first amount of charges at the floating diffusion FD1, which is the output node ND1. Active pixel 110 may perform a first conversion gain signal reading operation HCGSRD in a reading period PRD following the transfer period PT1 after the first reset period PR1 to read, from output buffer part 103 a first read-out signal HCGVSIG that is obtained by conversion with the first conversion gain (HCG) determined by the first amount of charges at the floating diffusion FD1, which is the output node ND1.

Subsequently, active pixel 110 may perform a second conversion gain signal reading operation LCGSRD to read, from output buffer part 103, a second read-out signal LCGVSIG2 that is obtained by conversion with a second conversion gain (for example, a low conversion gain: LCG) determined by a second amount of charges equal to the sum of the charges at the storage capacitor CS1 and the charges at the floating diffusion FD1, which is the output node ND1. After this, active pixel 110 may perform a second conversion gain reset reading operation LCGRRD in a second reset period PR2 to read, from output buffer part 103, a second read-out reset signal LCGVRST that is obtained by conversion with a second conversion gain (LCG) determined by the second amount of charges.

As described above, in some embodiments, DPS image sensing system 100B, which may be a solid-state imaging device, may operate in a time stamp (TS) mode in the first comparing operation period PCMPR1 of back-end ADC and memory circuit 115, operates in an HCG (a first conversion gain) mode in the second comparing operation period PCMPR2, and operates in an LCG (second conversion gain) mode in the third comparing operation period PCMPR3.

The photodiode PD1 may generate signal charges (electrons) in an amount determined by the amount of the incident light and may store the same. Description will be hereinafter given of a case where signal charges are electrons and each transistor may be an n-type transistor. However, it is also possible that the signal charges can be holes or each transistor can be a p-type transistor. Further, in some embodiments, a plurality of photodiodes and transfer transistors may share the transistors.

In some embodiments, a photodiode (PD) in each digital pixel may be a pinned photodiode (PPD). On a substrate surface for forming the photodiodes (PD), there may be a surface level due to dangling bonds or other defects, and therefore, a lot of charges (dark current) can be generated due to heat energy, such that signals fail to be read out correctly. In a pinned photodiode (PPD), a charge storage part of the photodiode (PD) may be pinned in the substrate to reduce mixing of the dark current into signals.

The transfer transistor TG1-Tr of active pixel 110 may be connected between the photodiode PD1 and the floating diffusion FD1 and controlled by a control signal TG applied to the gate thereof through a control line. The transfer transistor TG1-Tr can remain selected and in the conduction state during a transfer period PT in which the control signal TG is at the high (H) level, to transfer to the floating diffusion FD1 the charges (electrons) produced by the photoelectric conversion and then stored in the photodiode PD1. After the photodiode PD1 and the floating diffusion FD1 are reset to a predetermined reset potential, the transfer transistor TG1-Tr may enter the non-conduction state with the control signal TG being set to the low (L) level and the photodiode PD1 enters a storing period PI. Under these circumstances, if the intensity of the incident light is very high (e.g., the amount of the incident light is very large), the charges above the amount of saturated charges may overflow into the floating diffusion FD1 as overflow charges through the overflow can pass under the transfer transistor TG1-Tr. If the incident light has very high illuminance, for example, the charges above the amount of saturated charges at the floating diffusion FD1 may overflow to the storage capacitor CS1 as overflow charges through the overflow may pass under the storage capacitor CG1-Tr.

The reset transistor RST1-Tr may be connected between the power supply line Vdd of the power supply voltage VDD and the floating diffusion FD1 and controlled by a control signal RST applied to the gate thereof through a control line. The reset transistor RST1-Tr may remain selected and in the conduction state during a reset period in which the control signal RST is at the H level, to reset the floating diffusion FD1 to the potential of the power supply line Vdd of the power supply voltage VDD.

The storage transistor CG1-Tr may be connected between the floating diffusion FD1 and the reset transistor RST1-Tr, and the storage capacitor CS1 may be connected between (i) the connection node ND3 between the floating diffusion FD1 and the reset transistor RST1-Tr and (ii) the reference potential VSS. The storage transistor CG1-Tr may be controlled by a control signal DCG applied to the gate thereof through a control line. The storage transistor CG1-Tr may remain selected and in the conduction state during a reset period in which the control signal DCG is at the H level so as to connect the floating diffusion FD1 and the storage capacitor CS1. Here, DPS image sensing system 100B may be also configured such that the active pixel 110 may selectively connect (couple) the floating diffusion FD1 serving as an output node and the storage capacitor CS1 depending on the illuminance of the signal.

The source follower transistor SF1-Tr serving as a source follower element may be connected at the source thereof to the reading node ND2, at the drain thereof to the power supply line Vdd, and at the gate thereof to the floating diffusion FD1. The drain and source of the current transistor IC1-Tr serving as a current source element may be connected between the reading node ND2 and the reference potential VSS (for example, GND). The gate of the current transistor IC1-Tr may be connected to the feeding line of a control signal VBNPIX. The signal line LSGN1 between the reading node ND2 and the input part of the back-end ADC and memory circuit 115 may be driven by the current transistor IC1-Tr serving as a current source element.

Figures 2A, 2B:
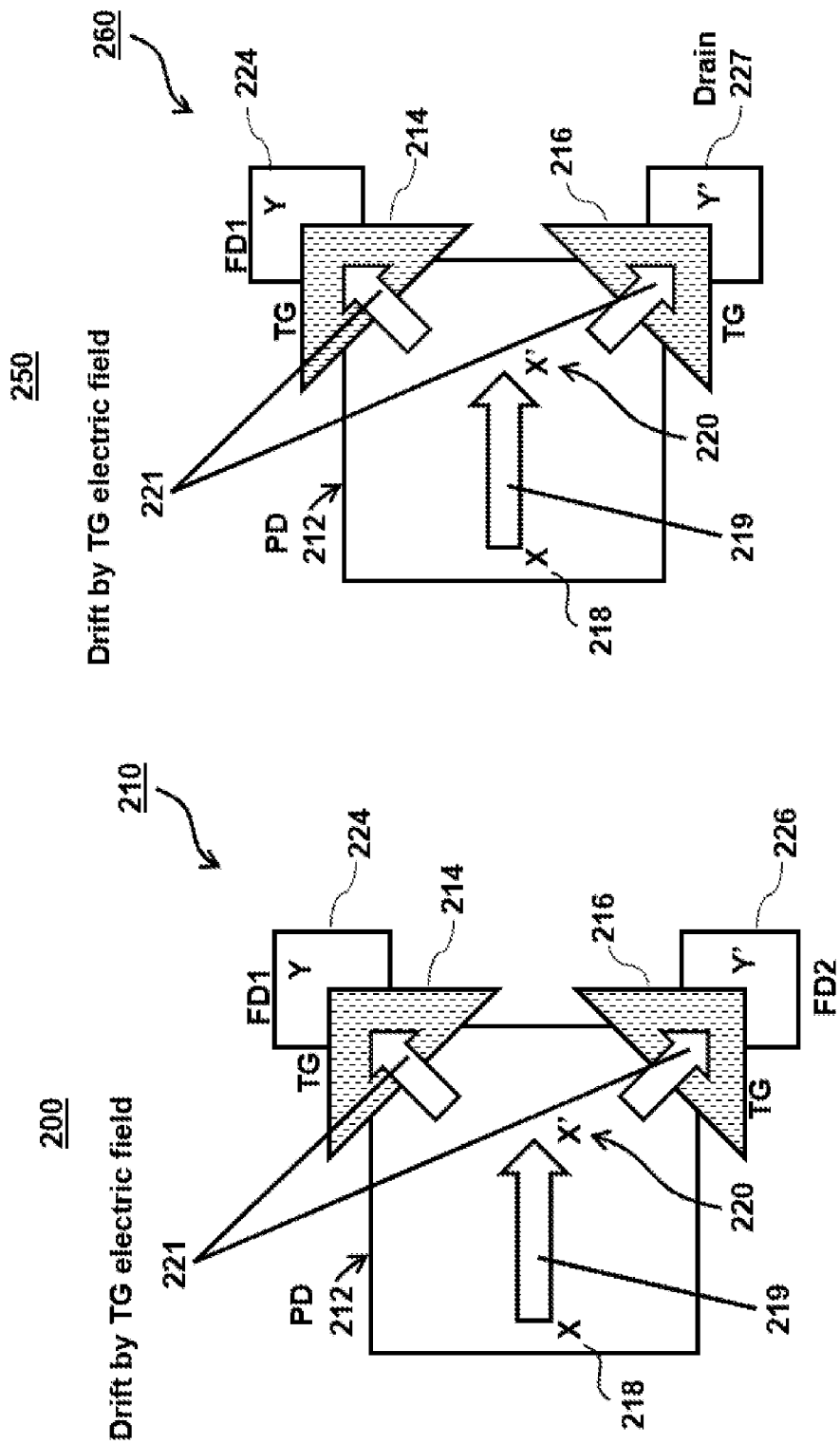
FIGS. 2A-2B are schematic representation of example active pixels, in accordance with one or more embodiments.

FIGS. 2A-2B are schematic representation of example active pixels 210 and 260, respectively, in accordance with one or more embodiments. FIG. 2A depicts a schematic representation of a top view 200 of an active pixel 210. FIG. 2B depicts a schematic representation of a top view 250 of an active pixel 260. In some embodiments, active pixel 210 may be the same or similar to active pixel 110 of FIG. 1A. Alternatively, with appropriate modifications, such as including a single transfer gate as opposed to two transfer gates, active pixel 210 may be the same or similar to active pixel 110 of FIG. 1B. In some embodiments, active pixel 210 corresponds to a non-shared floating diffusion structure including a two-way charge transfer photodiode (PD) 212. In some embodiments, active pixel 210 implements a backside illuminated pinned-photodiode. The phrase "non-shared" refers to floating diffusion nodes 224 and 226 being configured to receive charge transferred from a single instance of PD 212. In some embodiments, DPS image sensing system 100A of FIG. 1A or DPS image sensing system 100B of FIG. 1B may process a signal from shared floating diffusion nodes, which is discussed in further detail below.

Active pixel 210 may include PD 212 operatively coupled to transfer gates 214 and 216, which may also be referred to herein interchangeably as TDs 214 and 216. In some embodiments, transfer gates 214 and 216 reside asymmetrically on opposite sides of PD 212. For example, transfer gate 214 may reside at an upper right corner of PD 212, whereas transfer gate 216 may reside at a lower right corner of PD 212. Transfer gates 214 and 216 may include floating diffusion nodes 224 and 226, respectively. In some embodiments, transfer gates 214 and 216 may include an active layer intersecting a poly layer and a charge well layer configured as a floating diffusion layer. FIG. 2B is an illustrative diagram of an active pixel 260, which is similar to active pixel 210 of FIG. 2A, with the exception that transfer gate 216 output charge to a drain 227 instead of to floating diffusion node 226.

In some embodiments, transfer gates 214 and 216 may facilitate a complete intra-pixel charge transfer within PD 212 by causing an electron drift current to be generated. In FIGS. 2A and 2B, electron flow 219 corresponding to the electron drift current is depicted. Electron flow 219 may be directed from a first side 218 of PD 212 to a second side 220 of PD 212 region (e.g., from point X to point X'). In that case, a drift current may be directed from the second side 220 of PD 212 to the first side 218 of PD 212 region (e.g., from point X' to point X). Electron drift current may be caused by an electric field. The electric field applied to active pixel 210 causes electrons in PD 212 to move in a particular direction based on the applied electric field. In some embodiments, electric fields are generated by an impurity concentration gradient of PD 212, which is discussed in further detail below. Also, by forming electric fields in PD 212 (e.g., via implementation of an impurity concentration gradient of PD 212), and by an operation of two (2) transfer gates (e.g., transfer gates 214 and 216), a two-way charge transfer of electrons of PD 212 may be achieved. As described herein, "two-way charge transfer" refers to the number of charge transfer directions being two (2). Two-way charge transfer functionality, along with the complete intra-pixel charge transfer functionality of active pixel 210, may be used for a variety of applications. Some examples of applications that may implement two-way charge transfer functionality and complete intra-pixel charge transfer functionality include, but are not limited to, (which is not to suggest that other lists are limiting), high dynamic range readouts and time-of-flight (ToF) readouts, which are described in further detail below.

In some embodiments, transfer gates 214 and 216 may be configured to cause electron flow 219 corresponding to the electron drift current to be generated in a direction from a first side 218 of PD 212 to a second side 220 of PD 212 (e.g., from point X to point X'). Electron flow 219 may therefore produce a two-way charge transfer 221. In some embodiments, an electron drift current, such as electron drift current corresponding to electron flow 219, formed by an electric field being applied to active pixel 210, can increase a conductivity in a region encompassing first side 218 of PD 212 and a region encompassing second side 220 of PD 212. For example, the increased conductivity may induce charge transfer of a charge particle (e.g., an electron) from point X of first side 218 of PD 212 to point X' of second side 220 of PD 212. The electric field generating electron flow 219 may attract electrons from second 220 of PD 212. When operation of transfer gates 214 and 216 modulates the electric field near transfer gate 214 and 216, electrons may transfer from transfer gates 214 and 216 to floating diffusion node 224 or floating diffusion node 226, respectively. In active pixel 260, however, electrons may transfer from transfer gates 214 and 216 to floating diffusion node 224 or drain 227, respectively.

FIGS. 3A-3B are circuit diagrams of the example active pixels of FIGS. 2A-2B, in accordance with one or more embodiments. FIG. 3A includes active pixel 310, which may be the same or similar to active pixel 210 of FIG. 2A. FIG. 3B includes active pixel 360, which may be the same or similar to active pixel 260 of FIG. 2B. Active pixel 210 may include PD 212 operatively coupled with floating diffusion nodes 224 and 226. FIG. 3B differs from FIG. 3A in that transfer gate 216 is operatively coupled to drain 227. In some embodiments, PD 212 utilizes backside illumination (BSI) pinned photodiode or front illumination (FSI) pinned photodiode.

In some embodiments, charge collected by PD 212 is transferred to floating diffusion node 224. A voltage potential of floating diffusion node 224 may be monitored by source follower (SF) 225 of active pixel 310. Floating diffusion nodes 224 and 226 may be reset or binned by a transistor reset signal (RST) or a bin transistor (BIN) prior to charge transfer (e.g., charge transferred from regions of active pixel 310 or 360 to transfer gates 214 and 216 and then floating diffusion nodes 224 and 226, respectively; or transfer gate 214 to floating diffusion node 224 and transfer gate 216 to drain 227). In some embodiments, pixel binning of active pixel 310 or 360 may be implemented by BIN as part of a clocking scheme used to combine the charge collected by several adjacent pixels. This may have a technical effect of reducing noise and improve the signal-to-noise ratio and frame rate of DPS image sensing system 100A or DPS image sensing system 100B. In some embodiments, a row select transistor (SEL) 229 may be included in active pixel 310 and 360. Row select transistor 229 may be operatively coupled to source follower 225 with a read/write data bus line via Vsig.

Figure 4B:
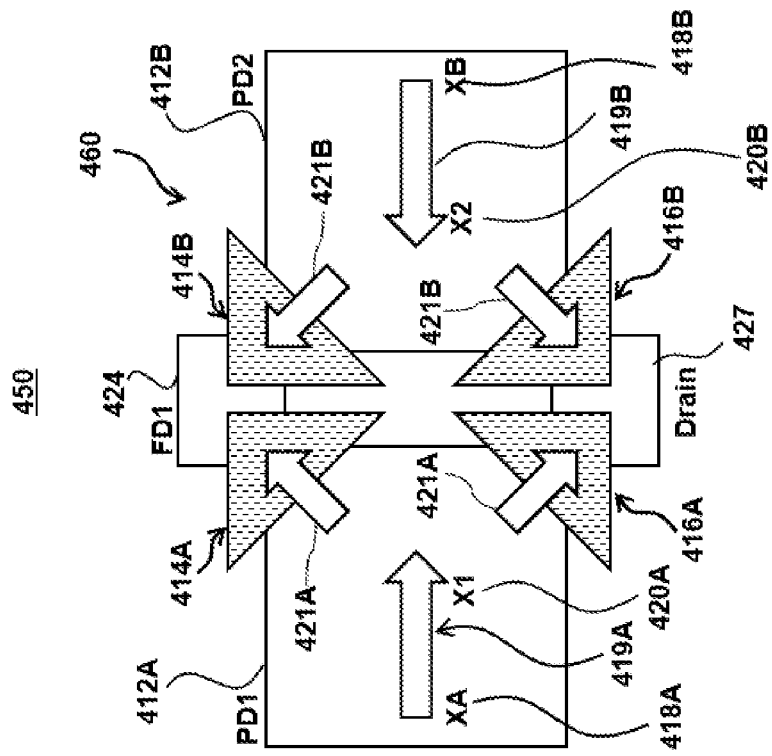
FIGS. 4A-4B are schematic representation of example active pixels, in accordance with one or more embodiments.
Figure 4A:
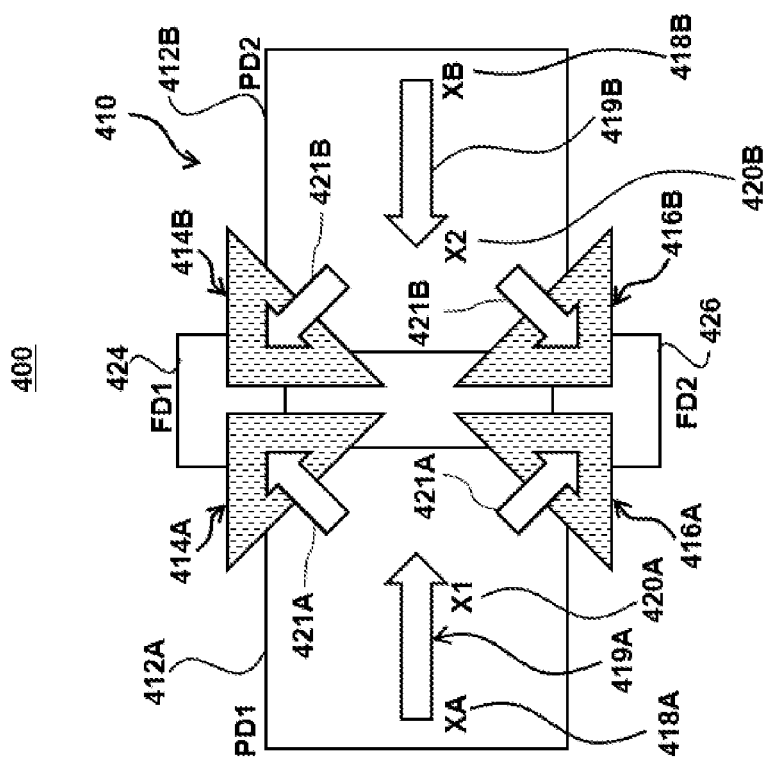

FIGS. 4A-4B are schematic representation of example active pixels 410 and 460, respectively, in accordance with one or more embodiments. FIGS. 5A-5B are exemplary circuit diagrams of active pixels 410 and 460 of FIGS. 4A-4B, respectively. In particular, FIG. 4A is a top view 400 of an example of active pixel 410. In some embodiments, active pixel 410 may be included within DPS image sensing system 100A of FIG. 1A (e.g., replacing or being used in addition to active pixel 110). Alternatively, with appropriate modifications, such as including a single transfer gate as opposed to two transfer gates, active pixel 410 may be the same or similar to active pixel 110 of FIG. 1B. FIG. 4B includes a top view 450 of an example of active pixel 460, which may alternatively or additionally be utilized as an active pixel (e.g., active pixel 110) in DPS image sensing system 100A or 100B of FIG. 1A or 1B, respectively.

In some embodiments, active pixel 410 may include two (2) photodiodes (PD) 412A and 412B. PD 412A may be operatively coupled to transfer gates 414A and 416A, and PD 412B may be operatively coupled to transfer gates 414B and 416B. Transfer gates 414A and 416A may reside on asymmetrically opposite sides of PD 412A, and transfer gates 414B and 416B may reside on asymmetrically opposite sides of PD 412B. In some embodiments, transfer gates 414A, 414B, 416A, and 416B include an active layer intersecting a poly layer and a charge well layer configured as a floating diffusion layer. Transfer gates 414A and 416A may include floating diffusion nodes 424 and 426, respectively. Transfer gates 414B and 416B also include floating diffusion nodes 424 and 426, respectively. Therefore, floating diffusion node 424 may be "shared" by transfer gates 414A and 414B, and floating diffusion node 426 may be "shared by transfer gates 416A and 416B. Transfer gates 414A, 414B, 416A, and 416B may provide charge transfer to floating diffusion nodes 424 and 426. FIG. 4B is an illustrative diagram of an active pixel 460, which is similar to active pixel 410 of FIG. 4A, with the exception that transfer gates 416A and 416B output charge to a drain 427 instead of to floating diffusion node (e.g., floating diffusion node 426).

In some embodiments, active pixels 410 and 460 may implement two-way charge transfer and complete intra-pixel charge transfer within PD 412A and PD 412B by having an electric field generated by, or otherwise applied to, PD 412A and 412B. Application of the electric field may cause electron drift currents to be generated within PD 412A and PD 412B, respectively. In FIGS. 4A and 4B, electron flow 419A corresponding to the electron drift current generated within PD 412A and electron flow 419B corresponding to the electron drift current generated within PD 412B are depicted. For instance, electron flow 419A may be generated in PD 412A responsive to application of an electric field to PD 412A. Electron flow 419A may be directed from a first side 418A of PD 412A to a second side 420A of PD 412A (e.g., from point XA to point X1). Similarly, electron flow 419B may be generated in PD 412B responsive to application of an electric field to PD 412B. Electron flow 419B may be directed from a first side 418B of PD 412B to a second side 420B of PD 412B (e.g., from point XB to point X2). In some embodiments, the same electric field may be applied to both PD 412A and 412B, however in other embodiments, different electric fields may be applied to PD 412A and 412B. The applied electric fields may generate electron flow 419A and 419B, which differ in directionality. For example, electron drift currents corresponding to electron flow 419A and 419B may have equal magnitude but opposite direction. Electron flow 419A and 419B may be caused by an electric field applied to active pixel 410 (or active pixel 460), which causes electrons in PD 412A and PD 412B to move in a particular direction based on the applied electric field. In some embodiments, electric fields are generated by an impurity concentration gradient of PD 412A and PD 412B, which is discussed in further detail below. Also, forming electric fields in PD 412A and PD 412B (e.g., via implementation of an impurity concentration gradient of PD 212), and by an operation of two (2) transfer gates (e.g., transfer gates 414A and 416A, and transfer gates 414B and 416B), a two-way charge transfer of electrons for each of PD 412A and 412B may be achieved. Two-way charge transfer functionality, along with the complete intra-pixel charge transfer functionality of active pixels 410 and 460, may be used for a variety of applications. Some examples of applications that may implement two-way charge transfer functionality and complete intra-pixel charge transfer functionality include, but are not limited to, (which is not to suggest that other lists are limiting), high dynamic range readouts and time-of-flight (ToF) readouts, which are described in further detail below.

In some embodiments, electron flow 419A and electron flow 419B may produce a two-way charge transfer 421A and 421B, respectively. In some embodiments, an electron flow, such as electron flows 419A and 419B, formed by an electric field being applied to active pixel 410 or active pixel 460, can increase a conductivity in a region encompassing first side 418A of PD 412A and a region encompassing second side 420A of PD 412A, as well as increase a conductivity in a region encompassing first side 418B of PD 412B and a region encompassing second side 420B of PD 412B. For example, the increased conductivity may induce charge transfer of a charged particle (e.g., an electron) from point XA of first side 418A of PD 412A to point X1 of second side 420A of PD 412A (and similarly for PD 412B). The electric field causing generation of electron flows 419A and 419B may attract electrons from second side 420A of PD 412A and second side 420B of PD 412B, respectively. When operation of transfer gates 414A, 414B, 416A, and 416B modulates the electric field near transfer gates 414A, 414B, 416A, and 416B, electrons may transfer from transfer gates 414A and 414B to floating diffusion node 424, and electrons may transfer from transfer gates 416A and 416B to floating diffusion node 426. In active pixel 460, however, electrons may transfer from transfer gates 414A and 414B to floating diffusion node 424, and from transfer gates 416A and 416B to drain 427.

FIGS. 5A-5B are circuit diagrams of active pixels 410 and 460 of FIGS. 4A-4B, in accordance with one or more embodiments. FIG. 5A includes active pixel 510, which may be the same or similar to active pixel 410 of FIG. 4A. FIG. 5B includes active pixel 560, which may be the same or similar to active pixel 460 of FIG. 4B. Active pixel 510 may include PD 412A and 412B operatively coupled with floating diffusion nodes 424 and 426. FIG. 5B differs from FIG. 5A in that transfer gates 416A and 416B are operatively coupled to drain 427. In some embodiments, PD 412A and PD 412B utilize backside illumination (BSI) pinned photodiode or front illumination (FSI) pinned photodiode.

In some embodiments, charge collected by PD 412A and/or 412B is transferred to floating diffusion nodes 424 and 426. A voltage potential of floating diffusion nodes 424 and 426 may be monitored by source follower (SF) 425 of active pixel 510. Floating diffusion nodes 424 and 426 may be reset or binned by a transistor reset signal (RST) or a bin transistor (BIN) prior to charge transfer (e.g., charge transferred from regions of PD 412A or PD 412B to transfer gates 414A, 414B, 416A, and 416B, and then to floating diffusion nodes 424 and 426, respectively. Alternatively, as illustrated in FIG. 5B, charge may be transferred from regions of PD 412A or 412B to transfer gates 414A and 414B, and then to floating diffusion node 424, and from transfer gates 416A and 416B to drain 427. In some embodiments, pixel binning of active pixel 510 or 560 may be implement by BIN as part of a clocking scheme used to combine the charge collected by several adjacent pixels. This may have a technical effect of reducing noise and improve the signal-to-noise ratio and frame rate of DPS image sensing system 100A or 100B (e.g., when active pixel 510 or 560 is used within DPS image sensing system 100A or 100B).

In some embodiments, a row select transistor (SEL) 429 may be included in active pixel 510 and 560. Row select transistor 429 may be operatively coupled to source follower 425 with a read/write data bus line via Vsig.

Figure 6A:
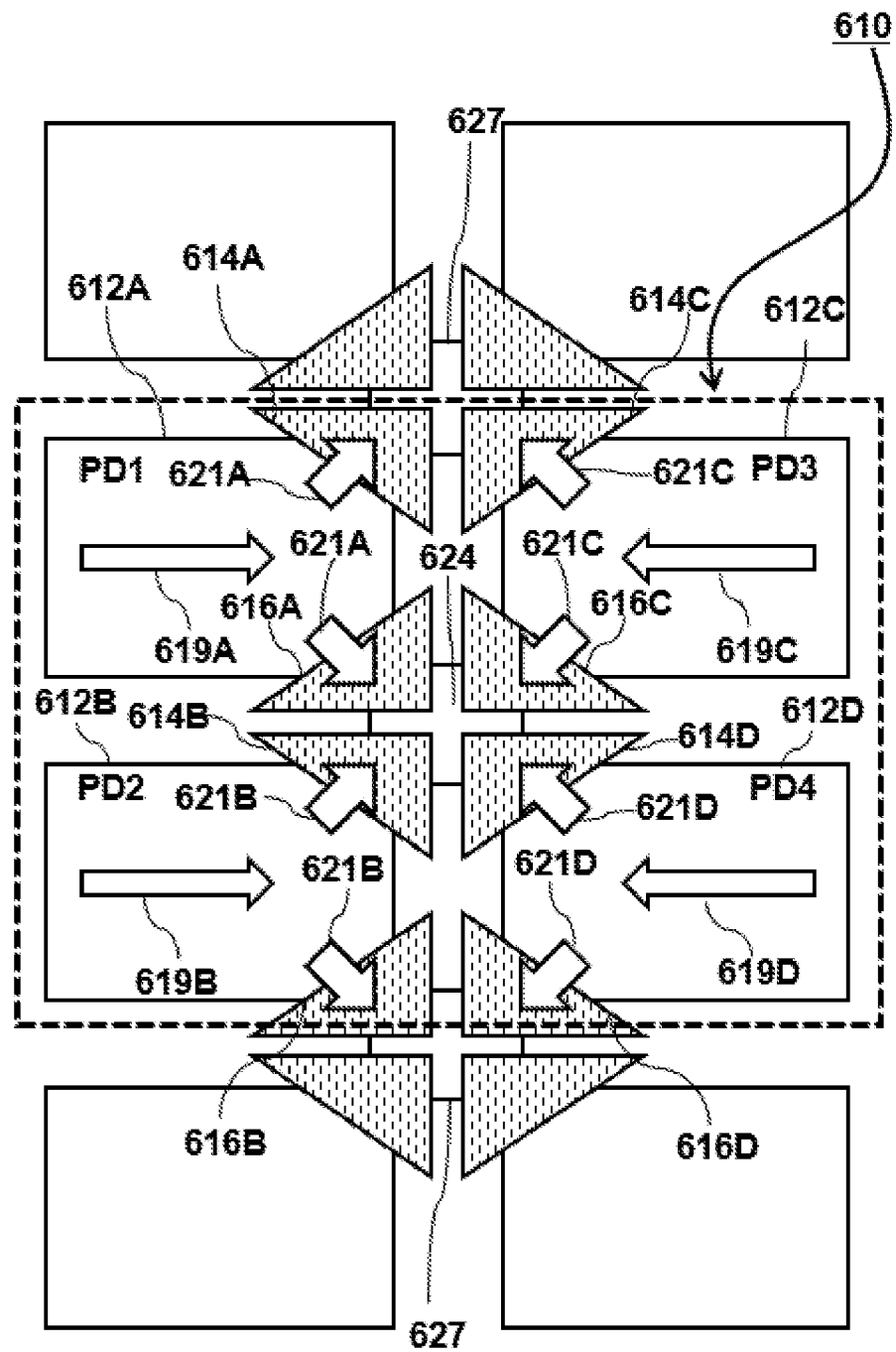
FIGS. 6A-6B are schematic representation of example active pixels, in accordance with one or more embodiments.
Figure 6B:
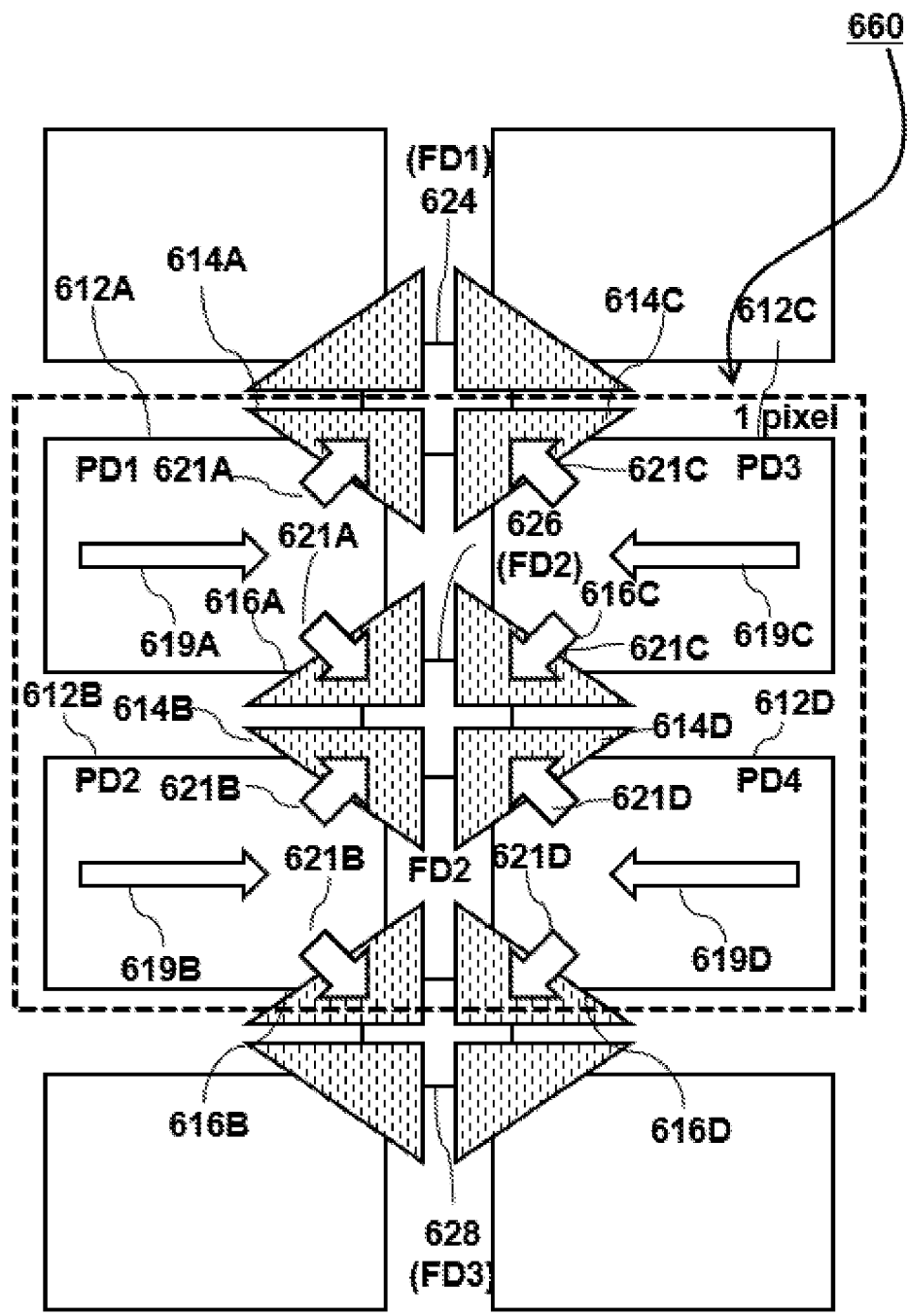
Figure 7A:
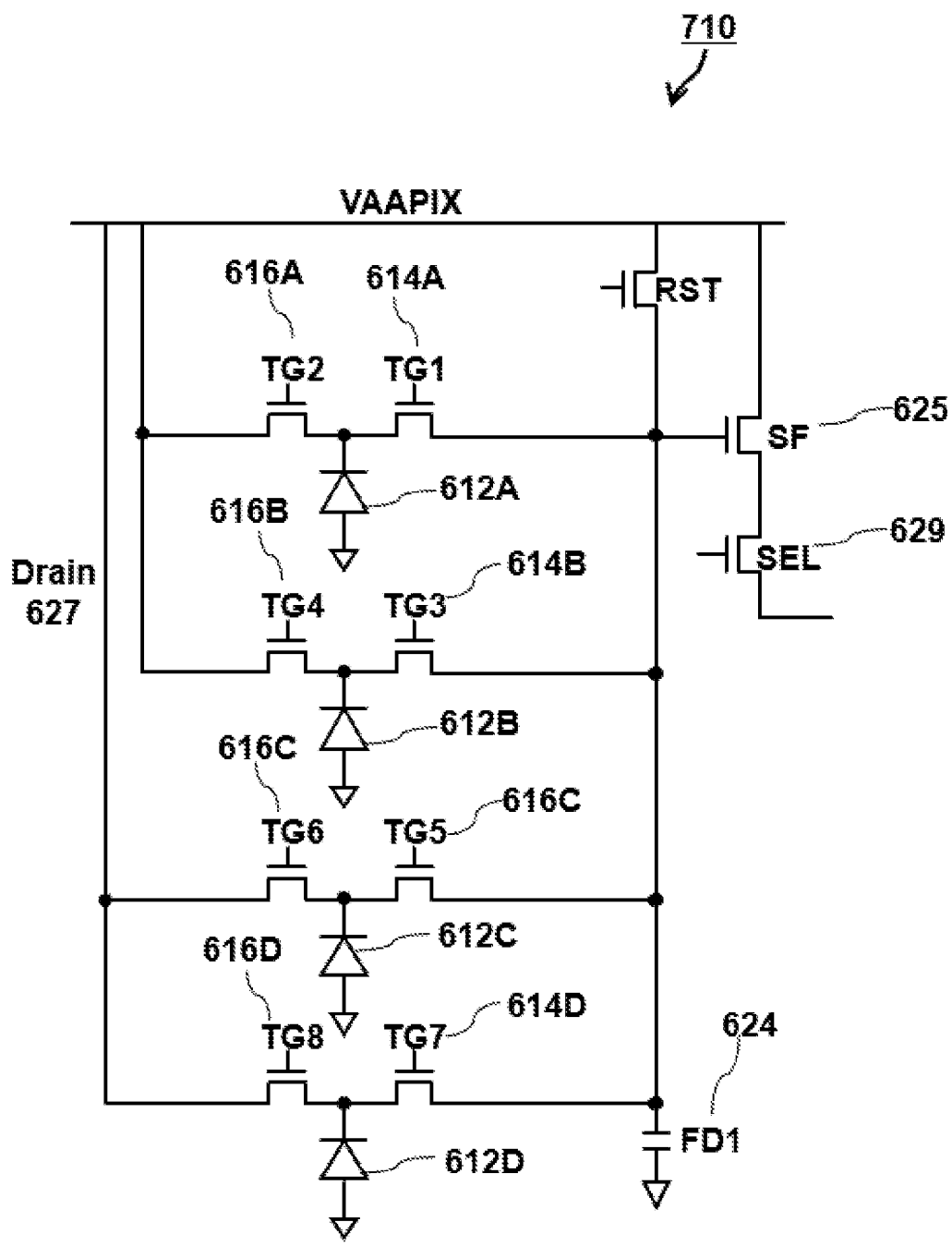
FIGS. 7A-7B are circuit diagrams of the example active pixels of FIGS. 6A-6B, in accordance with one or more embodiments.
Figure 7B:
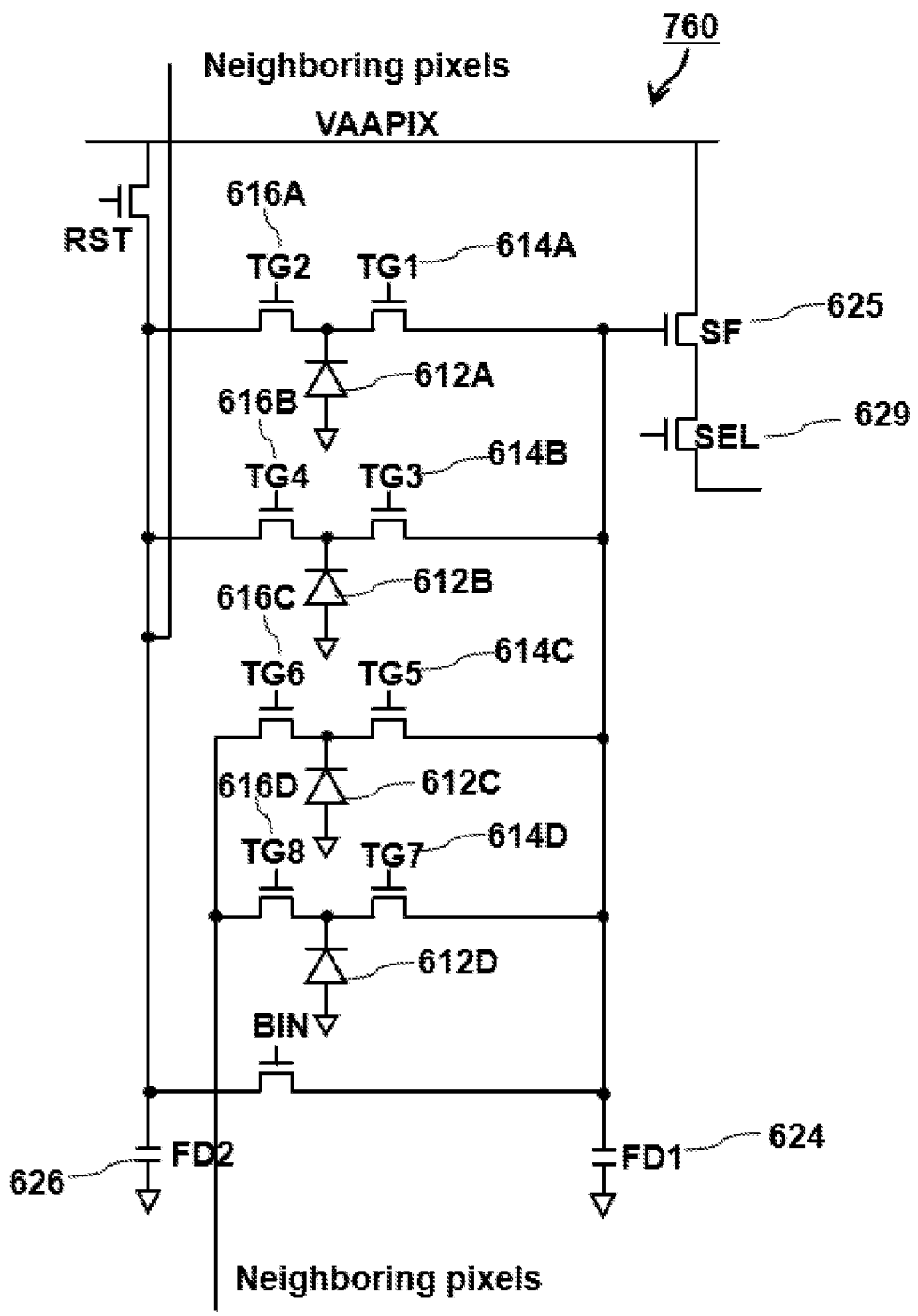

FIGS. 6A-6B are schematic representation of example active pixels 610 and 660, in accordance with one or more embodiments. FIGS. 7A-7B are circuit diagrams of the example active pixels of FIGS. 6A-6B, in accordance with one or more embodiments. As illustrated in FIGS. 6A-6B, active pixels 610 and 660 include a four (4) PD/FD shared structure implementing two-way and complete charge transfer of a photodiode, which is similar to or the same as the two-way charge transfer and drift current generation of active pixels 210, 260, 410, and 460 as discussed above. In some embodiments, active pixel 610 of FIG. 6A may be included within DPS image sensing system 100A of FIG. 1A (e.g., replacing or being used in addition to active pixel 110). Alternatively, with appropriate modifications, such as including a single transfer gate as opposed to two transfer gates, active pixel 610 may be the same or similar to active pixel 110 of FIG. 1B. Active pixel 660 of FIG. 6B may alternatively or additionally be utilized as an active pixel (e.g., active pixel 110) in DPS image sensing system 100B of FIG. 1B.

In some embodiments, active pixel 610 may include 4 (2) photodiodes (PD) 612A-612D. For simplicity, only a single instance of active pixel 610 is included within FIG. 6A, however additional instances of active pixel 610 may be operatively coupled together. In some embodiments, PD 612A may be operatively coupled to transfer gates 614A and 616A, PD 612B may be operatively coupled to transfer gates 614B and 616B, PD 612C may be operatively coupled to transfer gates 614C and 616C, and PD 612D may be operatively coupled to transfer gates 614D and 616D. Transfer gates 614A and 616A may reside on asymmetrically opposite sides of PD 612A, transfer gates 614B and 616B may reside on asymmetrically opposite sides of PD 612B, transfer gates 614C and 616C may reside on asymmetrically opposite sides of PD 612C, and transfer gates 614D and 616D may reside on asymmetrically opposite sides of PD 612D. In some embodiments, transfer gates 614A-D and transfer gates 616A-D each may include an active layer intersecting a poly layer and a charge well layer configured as a floating diffusion layer.

In some embodiments, as illustrated in FIG. 6B, transfer gates 614A and 616A of PD 612A and transfer gates 614C and 616C of PD 612C may include floating diffusion nodes 624 and 626, respectively, and transfer gates 614B and 616B of PD 612B and transfer gates 614D and 616D of FIG. 612D may include floating diffusion nodes 626 and 628, respectively. Therefore, floating diffusion node 624 may be "shared" by transfer gates 614A and 614C; floating diffusion node 626 may be "shared" by transfer gates 616A and 616C as well as transfer gates 614B and 614D; and floating diffusion node 628 may be shared by transfer gates 616B and 616D. Transfer gates 614A-614D and 616A-616D may provide charge transfer to floating diffusion nodes 624, 626, and 628. FIG. 6A is an illustrative diagram of an active pixel 610, which is similar to active pixel 660 of FIG. 6B, with the exception that transfer gates 614A-614D output charge to a drain 627 instead of to floating diffusion node (e.g., floating diffusion node 624).

In some embodiments, active pixels 610 and 660 may implement two-way charge transfer and complete intra-pixel charge transfer within PD 612A-612D by having an electric field generated by, or otherwise applied to, PD 612A-612D. Application of the electric field may cause electron drift currents to be generated within PD 612A-612D, respectively. In FIGS. 6A and 6B, electron flows 619A, 619B, 619C and 619D corresponding to the electron drift currents generated within PD 612A, PD 612B, PD 612C and PD 612D are depicted. For instance, electron flow 619A may be generated in PD 612A responsive to application of an electric field to PD 612A. Electron flow 619A may be directed from a first side PD 612A to a second side of PD 612A, and a similar effect may occur for each of PD 612B-612D. In some embodiments, the same electric field may be applied to each of PD 612A-612D, however in other embodiments, different electric fields may be applied to PD 612A-612D. For example, the electric field applied to PD 612A may differ from the electric field applied to PD 612C. The applied electric fields may generate electron flows 619A and 619B, which differ in directionality from electron flows 619C and 619D. For example, electron flows 619A and 619C may have equal magnitude but opposite direction. Electron flows 619A-619D may be caused by an electric field applied to active pixel 610 (or active pixel 660), which causes electrons in PD 612A-612D to move in a particular direction based on the applied electric field. In some embodiments, electric fields are generated by an impurity concentration gradient of PD 612A-612D, which is discussed in further detail below. Also, forming electric fields in PD 612A-612D (e.g., via implementation of an impurity concentration gradient of PD 612A-612D), and by an operation of two (2) transfer gates (e.g., transfer gates 614A, 616A; transfer gates 614B, 616B; transfer gates 614C, 616C; and transfer gates 614D, 616D), a two-way charge transfer of electrons for each of PD 612A-612D may be achieved. Two-way charge transfer functionality, along with the complete intra-pixel charge transfer functionality of active pixels 610 and 660, may be used for a variety of applications. Some examples of applications that may implement two-way charge transfer functionality and complete intra-pixel charge transfer functionality include, but are not limited to, (which is not to suggest that other lists are limiting), high dynamic range readouts and time-of-flight (ToF) readouts, which are described in further detail below.

In some embodiments, electron flows 619A-619D may produce a two-way charge transfer 621A-621D, respectively. In some embodiments, an electron drift current, such as electron flows 619A-619D, formed by an electric field being applied to active pixel 610 or active pixel 660, can increase a conductivity in a region encompassing a first side of each of PD 612A-612D and a region encompassing a second side of each of PD 612A-612D, as well as increase a conductivity in a region encompassing the first side of each of PD 612A-612D and a region encompassing the second side of each of PD 612A-612D. For example, the increased conductivity may induce charge transfer of a charged particle (e.g., an electron) from one side of PD 612A to another side of PD 612A. The electric field causing generation of electron flows 619A-619D may attract electrons from the second side of each of PD 612A-612D. When operation of transfer gates 614A-614D and 616A-616D modulates the electric field near transfer gates 614A-614D and 616A-616D, electrons may transfer from transfer gates 614A and 614C to floating diffusion node 624, electrons may transfer from transfer gates 616A, 616C, 614B, and 614D to floating diffusion node 626, and electrons may transfer from transfer gates 616B and 616D to floating diffusion node 628. In active pixel 610, however, electrons may transfer from transfer gates 614A, 614C, 616A, 616C, 614B, and 614D to drain 627.

In some embodiments, PD 612A-612D correspond to a single active pixel (e.g., active pixel 610). As shown in FIGS. 6A-6B, each PD 610A-D transfers charge to at least one shared floating diffusion node (e.g., FD 624). In some embodiments, active pixel 610 and/or active pixel 660 may be operatively coupled to a plurality of neighboring active pixel, which may be the same or similar to active pixels 610 and/or 660, to form a pixel array.

FIGS. 7A-7B are circuit diagrams of active pixels 610 and 660 of FIGS. 6A-6B, in accordance with one or more embodiments. FIG. 7A includes active pixel 710, which may be the same or similar to active pixel 610 of FIG. 6A. FIG. 7B includes active pixel 760, which may be the same or similar to active pixel 660 of FIG. 6B. Active pixel 760 may include PD 612A-612D operatively coupled with floating diffusion nodes 624 and 626. FIG. 7A differs from FIG. 7B in that transfer gates 616A-616D are operatively coupled to drain 627. In some embodiments, PD 612A-612D utilize backside illumination (BSI) pinned photodiode or front illumination (FSI) pinned photodiode.

In some embodiments, charge collected by PD 612A-612D is transferred to floating diffusion nodes 624 and 626. A voltage potential of floating diffusion nodes 624 and 626 may be monitored by source follower (SF) 625 of active pixel 710 and active pixel 760. Floating diffusion nodes 624 and 626 may be reset or binned by a transistor reset signal (RST) or a bin transistor (BIN) prior to charge transfer (e.g., charge transferred from regions of PD 612A to transfer gates 614A and 616A, and then to floating diffusion nodes 624 and 626, respectively. Alternatively, as illustrated in FIG. 7A, charge may be transferred from regions of PD 612A-612D to transfer gates 616A-616D to drain 627. In some embodiments, pixel binning of active pixel 710 or 760 may be implement by BIN as part of a clocking scheme used to combine the charge collected by several adjacent pixels. This may have a technical effect of reducing noise and improve the signal-to-noise ratio and frame rate of DPS image sensing system 100A or DPS image sensing system 100B (e.g., when active pixel 710 or 760 is used within DPS image sensing system 100A or DPS image sensing system 100B).

In some embodiments, a row select transistor (SEL) 629 may be included in active pixel 710 and 760. Row select transistor 629 may be operatively coupled to source follower 625 with a read/write data bus line via Vsig.

FIGS. 8A-8B are schematic representation of a top view 800 and a side view 850 of an example active pixel 810, in accordance with one or more embodiments. In particular, side view 850 of FIG. 8B includes a semiconductor substrate 813 of active pixel 810. In some embodiments, active pixel 810 may be the same or similar to active pixel 210 or 260 of FIGS. 2A and 2B. In some embodiments, semiconductor substrate 813 may include a varied gradient of impurity concentration.

Active pixel 810 may include semiconductor substrate 813. Semiconductor substrate 813 may utilize a staggered implant concentration for each iteration of an n-layer implant region of a photodiode (PD) 812. In this manner, aiding complete intra-pixel charge transfer to transfer gates 814 and 816, as well as to floating diffusion nodes or drains, may be achieved. In some embodiments, the implant concentration for the individual n-layers of semiconductor substrate 813 may be increased compared to a previous layer, as shown in FIG. 8B. This may increase the conductivity of each additional layer of the n-layers of semiconductor substrate 813, which may have a technical effect of providing complete intra-pixel charge transfer from PD 812 by operation of transfer gates 814 and 816.

In some embodiments, semiconductor substrate 813 includes a substrate base 811, N1 layer 818, and N1+N2 layer 820. Layers 818 and 820 may include photovoltaic material configured to convert incident light into electric charge as is known in the art. For example, N1 layer 818 and N1+N2 layer 820 may include materials such as, silicon, gallium, arsenide, or other materials. PD 812 includes a first electron transfer region having N1 implant concentration (e.g., N1 layer 818) and a second charge transfer region having N1+N2 implant concentration (e.g., N1+N2 layer 820). As describe herein, implant concentration refers to an amount and type of dopant utilized in a substrate.

In some embodiments, implant concentration gradient may refer to varying dopant materials and varying doping concentrations. For example, N1 layer 818 may include N-type dopants such as P, As and/or Sb due to their low ionization energies at an appropriate concentration. In some embodiments N2 may include a higher concentration of the same dopant used for N1. In some embodiments, N2 may be the same concentration of a different dopant. For example, N1 may be doped with a first doping agent of a first concentration, while N2 may include a second doping agent having the same concentration as the first concentration. In some embodiment, N1 may correspond to a concentration of approximately $1 \times 10^{16 \sim 17}$ [per cm$^3$] As for Si, and N2 may correspond to a concentration of approximately $1 \times 10^{16 \sim 17}$ [per cm$^3$] As for Si. Approximately means the difference is negligible. In some embodiments, N1 may be a concentration of between $2.5$-$3.5 \times 10^{17}$ [per cm$^3$] As for Si, and N2 may correspond to a concentration of approximately $0.5$-$1.5 \times 10^{17}$ [per cm$^3$] As for Si.

In some embodiments, active pixel 810 may use a front-end-of-line (FEOL) processing for the formation of transistors directly on semiconductor substrate 813. Semiconductor substrate 813 may include a wafer that has been fabricated by the growth of a pure silicon layer for example, utilizing an epitaxy process. In some embodiments, the Silicon variant may be deposited in one or more layers of active pixel 810 (e.g., N1 layer 818, N1+N2 layer 820). In some embodiments, prior to epitaxy, further processing may be implemented for increasing the performance of the transistors to be utilized on semiconductor substrate 813.

In some embodiments, FEOL processing may include a straining step whereby a Silicon variant is deposited in semiconductor substrate 813 in order to improve electronic mobility of substrate base 811. In some embodiments, impurity concentration and/or material may be modified for further improved electron mobility. In some embodiments, FEOL processing may include growth of the gate dielectric (e.g., transfer gates 214 and 216 of FIGS. 2A and 2B). For example, this may include patterning of the gate, patterning of the source and drain regions, and subsequent implementation or diffusion of dopants to obtain the desired complementary electrical properties. For example, in some embodiments, N-type dopants such as P, As and/or Sb are utilized due to their low ionization energies (20-300 keV), low diffusivities, and suitable solid solubilities in Si.

Figure 9B:
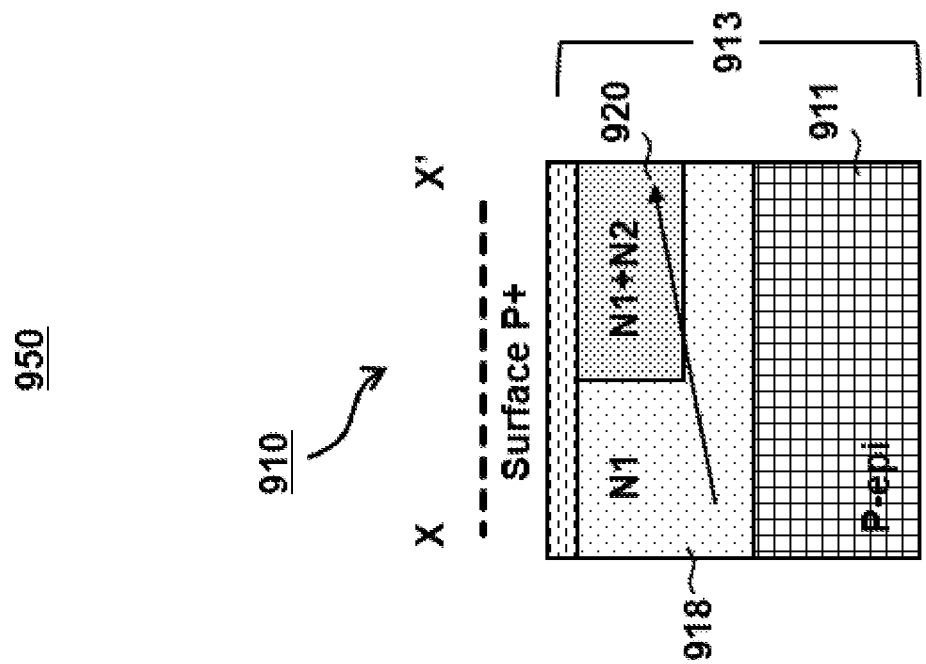
FIGS. 9A-9B are schematic representation of a top view and a side view of an example active pixel, in accordance with one or more embodiments.
Figure 9A:
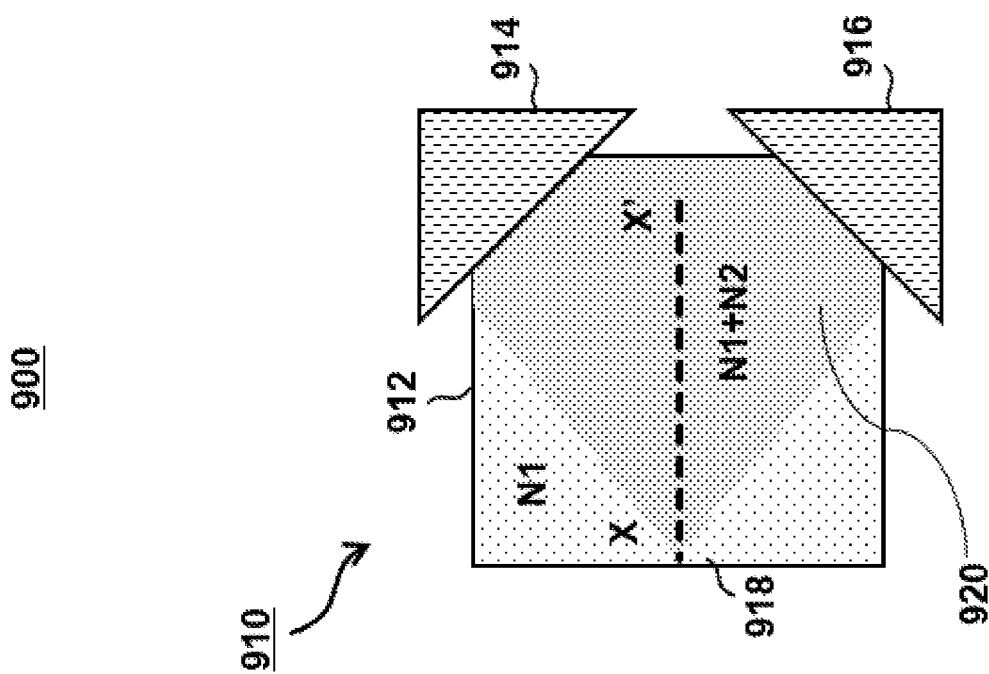

FIGS. 9A-9B are schematic representation of a top view 900 and a side view 950 of an example active pixel 910, in accordance with one or more embodiments. In some embodiments, active pixel 910 may be configured for use in DPS image sensing system 100A or, with appropriate modifications, for use in DPS image sensing system 100B. In some embodiments, active pixel 910 is an exemplary embodiment of active pixel 210 of FIGS. 2A and 2B. As described in further detail below, active pixel 910 may be formed utilizing a method of fabrication implementing a concentration gradient and iterative n-implant layer methodology for producing varied impurity concentration gradient effects in the various layers of a photodiode (PD) 912 of active pixel 910.

In some embodiments, the varied impurity concentration gradient effect functionality of active pixel 910 provides increased charge conductivity in PD 912. An operation of transfer gates 914 and 916 may generate an electric field that induces an electron drift current from a first side of PD 912 to a second side of PD 912. For example, the electron drift current may be directed from a point X to a point X'. The inclusion of two (2) transfer gates 914 and 916 provides electric fields that causes complete intra-pixel charge transfer of electrons from an N1 layer 918 to an N1+N2 layer 920, and into a floating diffusion node or drain.

Active pixel 910 may include a semiconductor substrate 913. Semiconductor substrate 913 may utilize a staggered implant concentration for each iteration of an n-layer implant region of 912. In this manner, aiding complete intra-pixel charge transfer to transfer gates 914 and 916, as well as to floating diffusion nodes or drains, may be achieved. In some embodiments, the implant concentration for the individual n-layers of semiconductor substrate 913 may be increased compared to a previous layer, as shown in FIG. 9B. This may increase the conductivity of each additional layer of the n-layers of semiconductor substrate 913, which may have a technical effect of providing complete intra-pixel charge transfer from PD 912 by operation of transfer gates 914 and 916.

In some embodiments, semiconductor substrate 913 includes a substrate base 911, N1 layer 918, and N1+N2 layer 920. Layers 918 and 920 may include photovoltaic material configured to convert incident light into electric charge as is known in the art. For example, N1 layer 918 and N1+N2 layer 920 may include materials such as, silicon, gallium, arsenide, or other materials. PD 912 includes a first electron transfer region having N1 implant concentration (e.g., N1 layer 918) and a second charge transfer region having N1+N2 implant concentration (e.g., N1+N2 layer 920). As describe herein, implant concentration refers to an amount and type of dopant utilized in a substrate.

PD 912 of FIGS. 9A and 9B may differ from PD 812 of FIGS. 8A and 8B in that a pattern used to differentiate between N1 layer 918 and N1+N2 layer 920 differs as compared to N1 layer 818 and N1+N2 layer 820. For example, while N1 layer 818 and N1+N2 layer 820 may encompass a rectangular shape when viewed from top view 800, N1 layer 918 may increase in size, approximately linearly, across an axis from point X to point X'. Similarly, N1+N2 layer 920 decreases, approximately linearly, when viewed from top view 900, across the axis from point X' to point X. In some embodiments, N1+N2 layer 920 may reside on a portion of N1 layer 918, which may extend across a surface of substrate base 911 of semiconductor substrate 913.

In some embodiments, a material composition and configuration of PD 912 of FIGS. 9A and 9B may be the same or similar to that of PD 812 of FIGS. 8A and 8B. For example, N1 layer 918 may also include an ArGe doped with Aluminum, and N2 may include a higher concentration of the same dopant used for N1. As another example, N2 may be the same concentration of a different dopant.

In some embodiments, active pixel 910 may use a front-end-of-line (FEOL) processing for the formation of transistors directly on semiconductor substrate 913. Semiconductor substrate 913 may include a wafer that has been fabricated by the growth of a pure silicon layer for example, utilizing an epitaxy process. In some embodiments, the Silicon variant may be deposited in one or more layers of active pixel 910 (e.g., N1 layer 918, N1+N2 layer 920). In some embodiments, prior to epitaxy, further processing may be implemented for increasing the performance of the transistors to be utilized on semiconductor substrate 913. Additionally, similarly to active pixel 810, FEOL processing may include a straining step whereby a is deposited in semiconductor substrate 913 in order to improve electronic mobility of substrate base 911. In some embodiments, impurity concentration and/or material may be modified for further improved electron mobility. In some embodiments, FEOL processing may include growth of the gate dielectric (e.g., transfer gates 214 and 216 of FIGS. 2A and 2B). For example, this may include patterning of the gate, patterning of the source and drain regions, and subsequent implementation or diffusion of dopants to obtain the desired complementary electrical properties. For example, in some embodiments, N-type dopants such as P, As and/or Sb are utilized due to their low ionization energies (20-300 keV), low diffusivities, and suitable solid solubilities in Si.

Figure 10A:
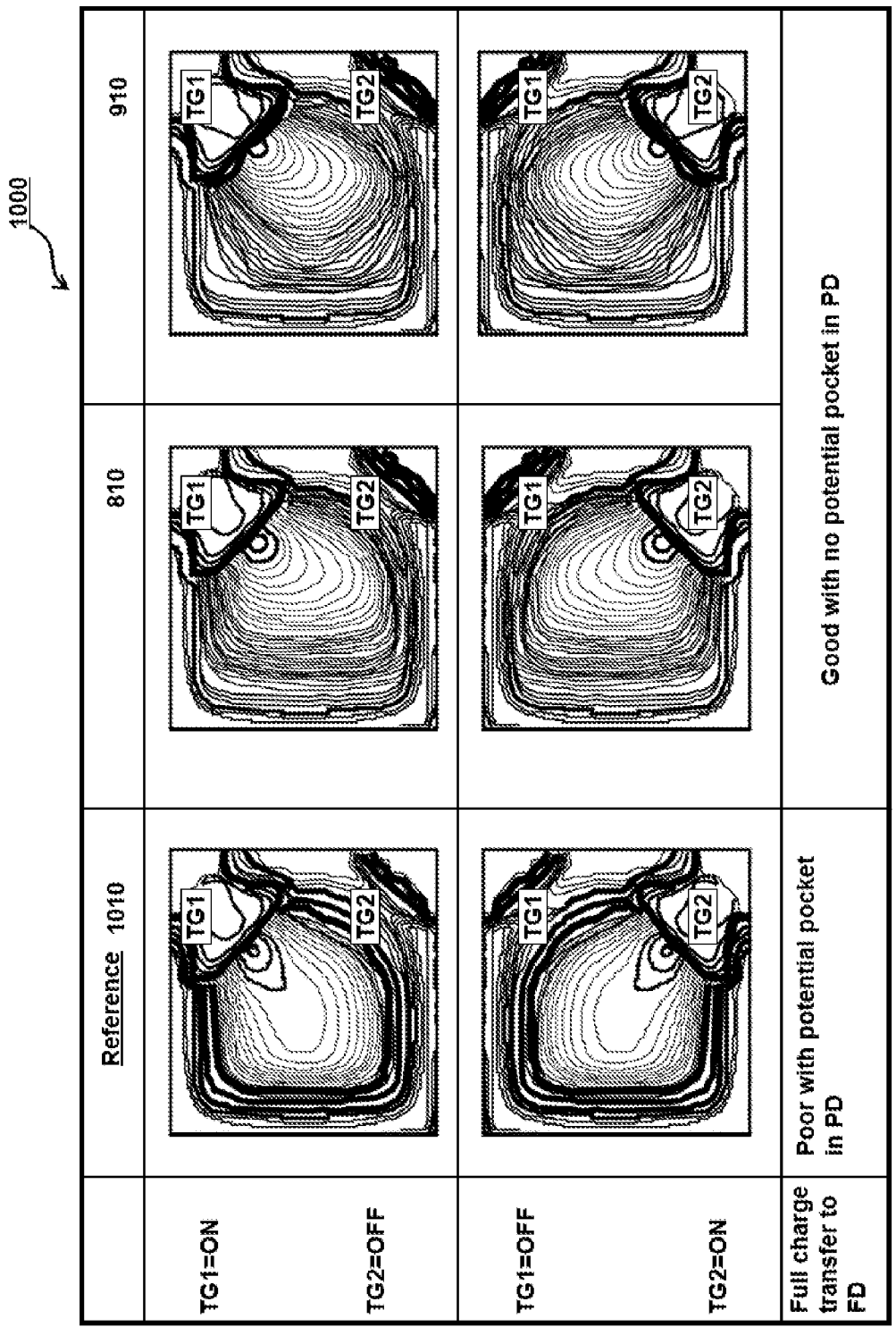
FIGS. 10A-10B are charge potential diagrams depicting simulation results of example active pixels, in accordance with one or more embodiments.
Figure 10B:
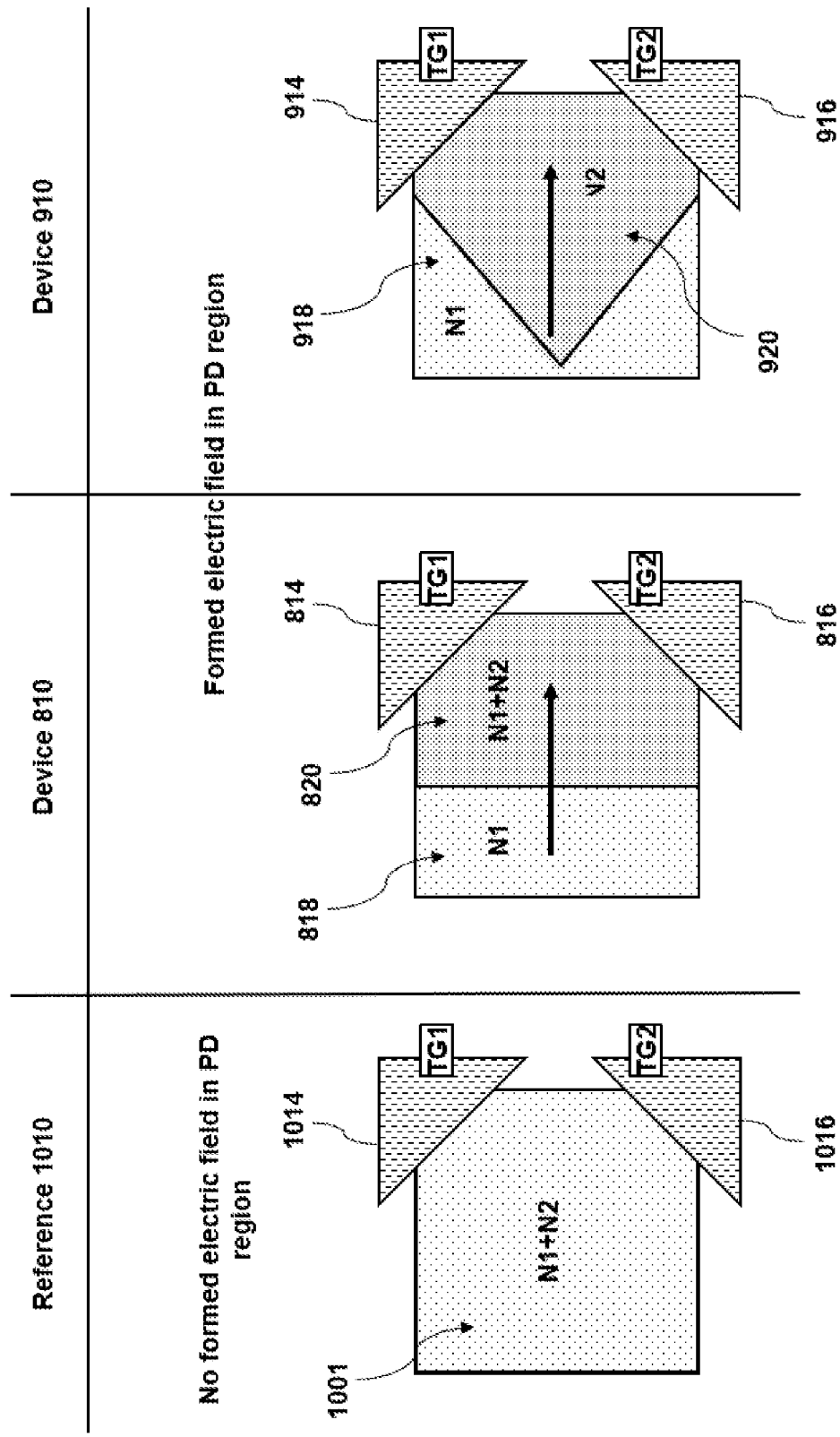

FIGS. 10A-10B are charge potential diagrams depicting simulation results of example active pixels, in accordance with one or more embodiments. In particular, FIGS. 10A-10B illustrate charge potential diagrams of active pixels, such as active pixel 810 of FIGS. 8A-8B and active pixel 910 of FIGS. 9A-9B, capable of achieving full intra-pixel charge transfer to floating diffusion nodes confirmed via simulation. FIG. 10A includes a table 1000 depicting simulation results of an operation of active pixel 810 of FIGS. 8A-8B and active pixel 910 of FIGS. 9A-9B, compared to a reference active pixel 1010, as shown in FIG. 10B. Reference active pixel 1010 includes a homogeneous photodiode region 1001 having a uniform implant composition. In contrast, active pixel 810 includes two n-layer implant regions, N1 layer 818 and N1+N2 layer 820, and active pixel 910 includes two p-layer implant regions, N1 layer 918 and N1+N2 layer 920, where N2 of active pixel 910 is configured for narrowing channel effects utilizing tapered n-layer implants, as shown in FIG. 10B.

In a first operation, a first transfer gate TG1 of each of active pixels 810, 910, and 1010 is turned ON and a second transfer gate TG2 of each of active pixels 810, 910, and 1010 is turned OFF. In FIGS. 10A-10B, first transfer gate TG1 refers to transfer gate 814 of active pixel 810, transfer gate 914 of active pixel 910, and transfer gate 1014 of reference active pixel 1010, and second transfer gate TG2 refers to transfer gate 816 of active pixel 810, transfer gate 916 of active pixel 910, and transfer gate 1016 of reference active pixel 1010. In a second operation, first transfer gate TG1 is turned OFF while second transfer gate TG2 is turned ON. As shown in FIG. 10A, for both the first and second operations, there remains a strong potential pocket in a photodiode region of reference active pixel 1010. The potential pocket in reference active pixel 1010 is evidenced by the (three) heavy lines near transfer gate TG2 or TG1, depending on whether transfer gate TG1 or transfer gate TG2 is turned ON, representing charge accumulation in the photodiode region of reference active pixel 1010.

As discussed above, active pixels 810 and 910 utilize varied implant materials and doping concentrations, which facilitates full intra-pixel charge transfer to floating diffusion nodes of those active pixels. Having full charge transfer imparts a technical effect of reducing image lag when processing images, thereby improving processing times for imaging systems. Using two transfer gates TG1, TG2 located on the same side of the active pixel, full intra-pixel charge transfer is achieved by way of a strong electric field being applied to a photodiode region of the active pixel.

As shown in Table 1000, under both operation conditions of the transfer gates TG1 and TG2, active pixel 810 achieves significantly more charge transfer from the photodiode region when compared to reference active pixel 1010. Additionally, active pixel 910, which implements varied implant materials (e.g., varying impurity concentration gradient) for achieving the electron drift currents, as discussed above, shows even more complete charge transfer of the photodiode regions when compared to the reference active pixel 1010 and active pixel 810. This is shown by a single heavy line near the active transfer gate. In this manner, active pixels 810 and 910 achieve full charge transfer to the floating diffusion nodes with no potential pocket in the photodiode region of the active pixels.

Figure 11A:
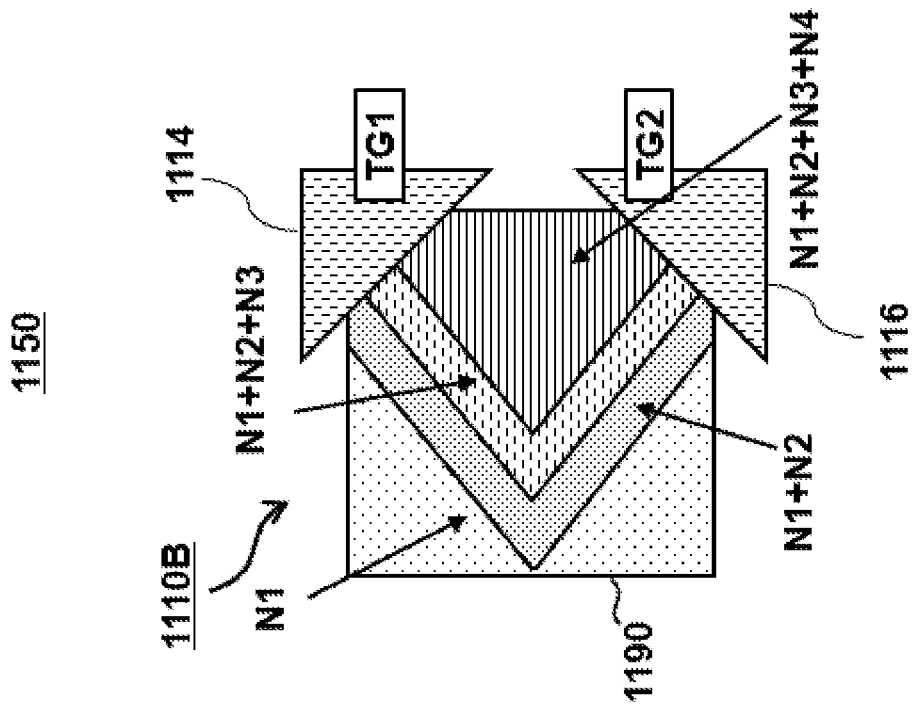
FIGS. 11A-11C are schematic representation of top views and a side view of an example active pixel, in accordance with one or more embodiments.
Figure 11B:
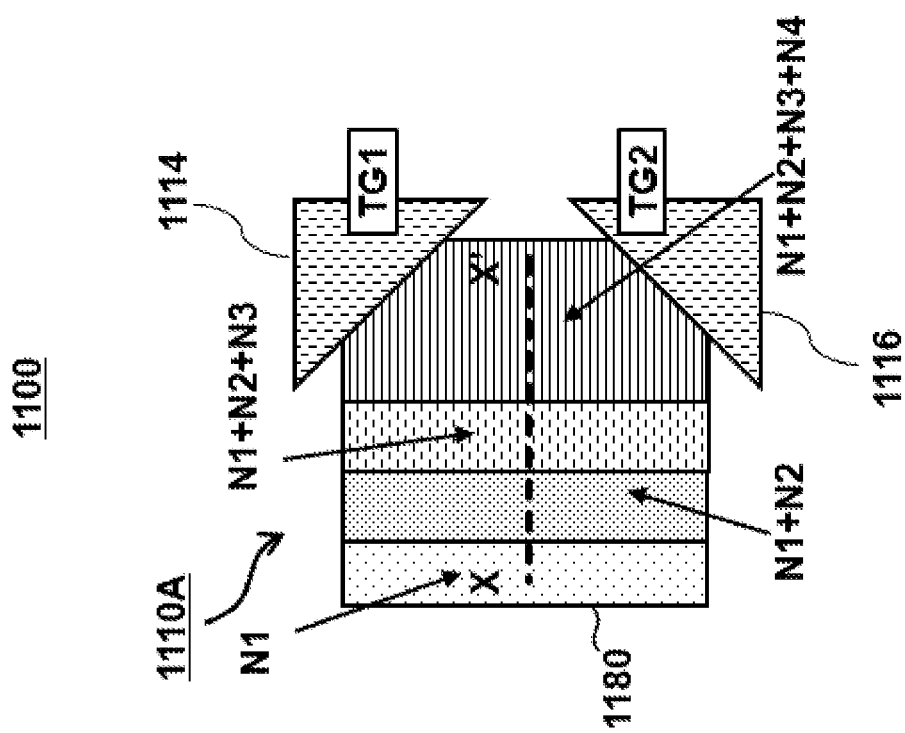
Figure 11C:
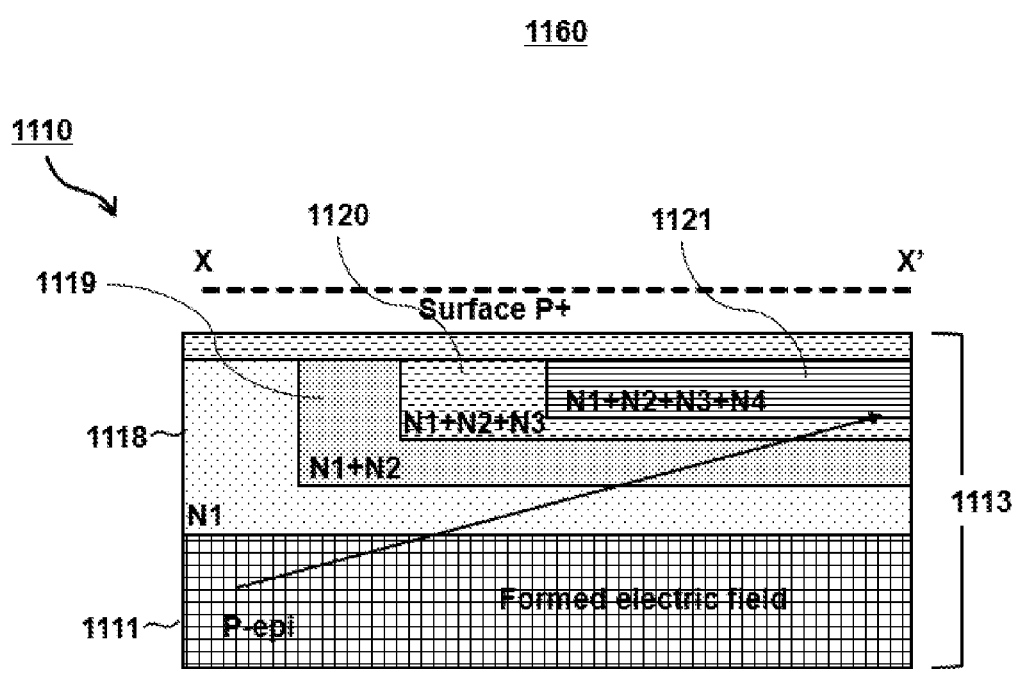

FIGS. 11A-11C are schematic representation of top views 1100, 1150 and a side view 1160 of an example active pixel, in accordance with one or more embodiments. As shown in FIGS. 11A and 11B, in some embodiments, additional N-layer implants may be used for active pixels to achieve strong electric fields. For example, active pixel 1110A may include four (4) N-layer regions, as shown in FIG. 11A. As another example, active pixel 1110B may also use 4 N-layer regions, which are implemented as a varied impurity concentration gradient effect via the 4 N-layers. As compared to active pixel 810 of FIGS. 8A-8B and active pixel 910 of FIGS. 9A-9B, use of active pixels 1110A and 1110B within DPS image sensing system 100A or DPS image sensing system 100B may cause even stronger electric fields to be formed due to the use of additional N-layer implant regions within active pixels 1110A and 1110B.

Active pixel 1110B of FIG. 11B includes a photodiode (PD) 1190, which may incorporate a varied impurity concentration gradient effect structure including four N-layer regions. For example, N1 layer 1118 corresponds to a first varied impurity concentration gradient region including an implant profile N1; N1+N2 layer 1119 corresponds to a second varied impurity concentration gradient region including an implant profile N1+N2; N1+N2+N3 layer 1120 corresponds to a third varied impurity concentration gradient region including an implant profile N1+N2+N3; and N1+N2+N3+N4 layer 1121 corresponds to a fourth varied impurity concentration gradient region including an implant profile N1+N2+N3+N4.

In some embodiments, PD 1180 of active pixel 1110A and PD 1190 of active pixel 1110B may include additional N-layer regions, for example, five (5) N-layer regions, six (6) N-layer regions, seven (7) N-layer regions, or more. In some embodiments, each successive N-layer may have the same width, or may have widths of varying degree. Varying the shape of the each region may help reduce cost of manufacturing because the number of photo masks may be reduced when not only using rectangle shape masks. In some embodiments the incident angle formed by each N-layer in the narrow filed effect methodology may differ from one successive letter to the next. For example, as seen from top view 1100 of FIG. 11A, PD 1180 of active pixel 1110A has four N-layers increasing in impurity concentration from least concentrated at point X to most concentrated at point X'. Furthermore, the four N-layers of PD 1180 of active pixel 1110A are distributed in approximately vertical blocks along the X-X' axis. As another example, as seen from top view 1150 of FIG. 11B, PD 1190 of active pixel 1110B also includes four N-layers of increasing impurity concentration, however the layers extend along an approximate 45-degree angle from the X-X' axis towards the edges of PD 1190 of active pixel 1110B.

In some embodiments, active pixels 1110A and 1110B include transfer gates 1114 and 1116, which may be located on asymmetrically opposite sides of PD 1180 and 1190, respectively. An operation of transfer gates 1114 and 1116 of active pixel 1110A may generate an electric field that induces an electron drift current from a first side of PD 1180 to a second side of PD 1180. An operation of transfer gates 1114 and 1116 of active pixel 1110B may generate an electric field that induces an electron drift current from a first side of PD 1190 to a second side of PD 1190. For example, the electron drift current may be directed from a point X to a point X'. The inclusion of two (2) transfer gates 1114 and 1116 provides electric fields that causes complete intra-pixel charge transfer of electrons from N1 layer 1118 to N1+N2 layer 1119, to N1+N2+N3 layer 1120, to N1+N2+N3+N4 layer 1121 (and so on), and into a floating diffusion node or drain.

As seen from FIG. 11C, side view 1160 depicts active pixel 1110, which may be the same or similar to active pixel 1110A or 1110B of FIGS. 11A and 11B, respectively. Active pixel 1110 may include a semiconductor substrate 1113. Semiconductor substrate 1113 may utilize a staggered implant concentration for each iteration of an n-layer implant region. In this manner, aiding complete intra-pixel charge transfer to transfer gates 1114 and 1116, as well as to floating diffusion nodes or drains, may be achieved. In some embodiments, the implant concentration for the individual n-layers of semiconductor substrate 1113 may be increased compared to a previous layer. This may increase the conductivity of each additional layer of the n-layers of semiconductor substrate 1113, which may have a technical effect of providing complete intra-pixel charge transfer by operation of transfer gates 1114 and 1116.

In some embodiments, semiconductor substrate 1113 includes a substrate base 1111, N1 layer 1118, N1+N2 layer 1119, N1+N2+N3 layer 1120, and N1+N2+N3+N4 layer 1121. Each of layers 1118-1121 may include photovoltaic material configured to convert incident light into electric charge as is known in the art. For example, the layers of active pixel 1110 may include materials such as, silicon, gallium, arsenide, or other materials. Active pixel 1110 may include a first electron transfer region having N1 implant concentration (e.g., N1 layer 1118), a second charge transfer region having N1+N2 implant concentration (e.g., N1+N2 layer 1119), a third charge transfer region having N1+N2+N3 implant concentration (e.g., N1+N2+N3 layer 1120), and a fourth charge transfer region having N1+N2+N3+N4 implant concentration (e.g., N1+N2+N3+N4 layer 1121). As describe herein, implant concentration refers to an amount and type of dopant utilized in a substrate.

In some embodiments, a material composition and configuration of PD 1180 of active pixel 1110A and PD 1190 of active pixel 1110B of active pixel 1110B may be the same or similar to that of PD 912 of active pixel 910 and PD 812 of active pixel 810. For example, N1 layer 1118 may also include an N-type dopants such as P, As and/or Sb at a first concentration, N1+N2 layer 1119 may include a higher concentration of the same dopant used for N1 layer 1118, N1+N2+N3 layer 1120 may include yet a higher concentration of the same dopant used for N1 layer 1118 and N1+N2 layer 1119, and N1+N2+N3+N4 layer 1121 may include still yet a higher concentration of the same dopant used for N1 layer 1118, N1+N2 layer 1119, and N1+N2+N3 layer 1120. As another example, N1+N2 layer 1119, N1+N2+N3 layer 1120, and/or N1+N2+N3+N4 layer 1121 may be the same concentration of a different dopant then that of N1 layer 1118.

In some embodiments, active pixel 1110 may use a front-end-of-line (FEOL) processing for the formation of transistors directly on semiconductor substrate 1113. Semiconductor substrate 1113 may include a wafer that has been fabricated by the growth of a pure silicon layer for example, utilizing an epitaxy process. In some embodiments, the Silicon variant may be deposited in one or more layers of active pixel 1110 (e.g., N1 layer 1118, N1+N2 layer 1119, N1+N2+N3 layer 1120, N1+N2+N3+N4 layer 1121). In some embodiments, prior to epitaxy, further processing may be implemented for increasing the performance of the transistors to be utilized on semiconductor substrate 1113. Additionally, similarly to active pixel 810 and 910, FEOL processing may include a straining step whereby a Silicon variant is deposited in semiconductor substrate 1113 in order to improve electronic mobility of substrate base 1111. In some embodiments, impurity concentration and/or material may be modified for further improved electron mobility. In some embodiments, FEOL processing may include growth of the gate dielectric (e.g., transfer gates 214 and 216 of FIGS. 2A and 2B). For example, this may include patterning of the gate, patterning of the source and drain regions, and subsequent implementation or diffusion of dopants to obtain the desired complementary electrical properties. For example, in some embodiments, N-type dopants such as P, As and/or Sb are utilized due to their low ionization energies (e.g., between 20-300 keV), low diffusivities, and suitable solid solubilities in Si.

Figures 12A, 12B:
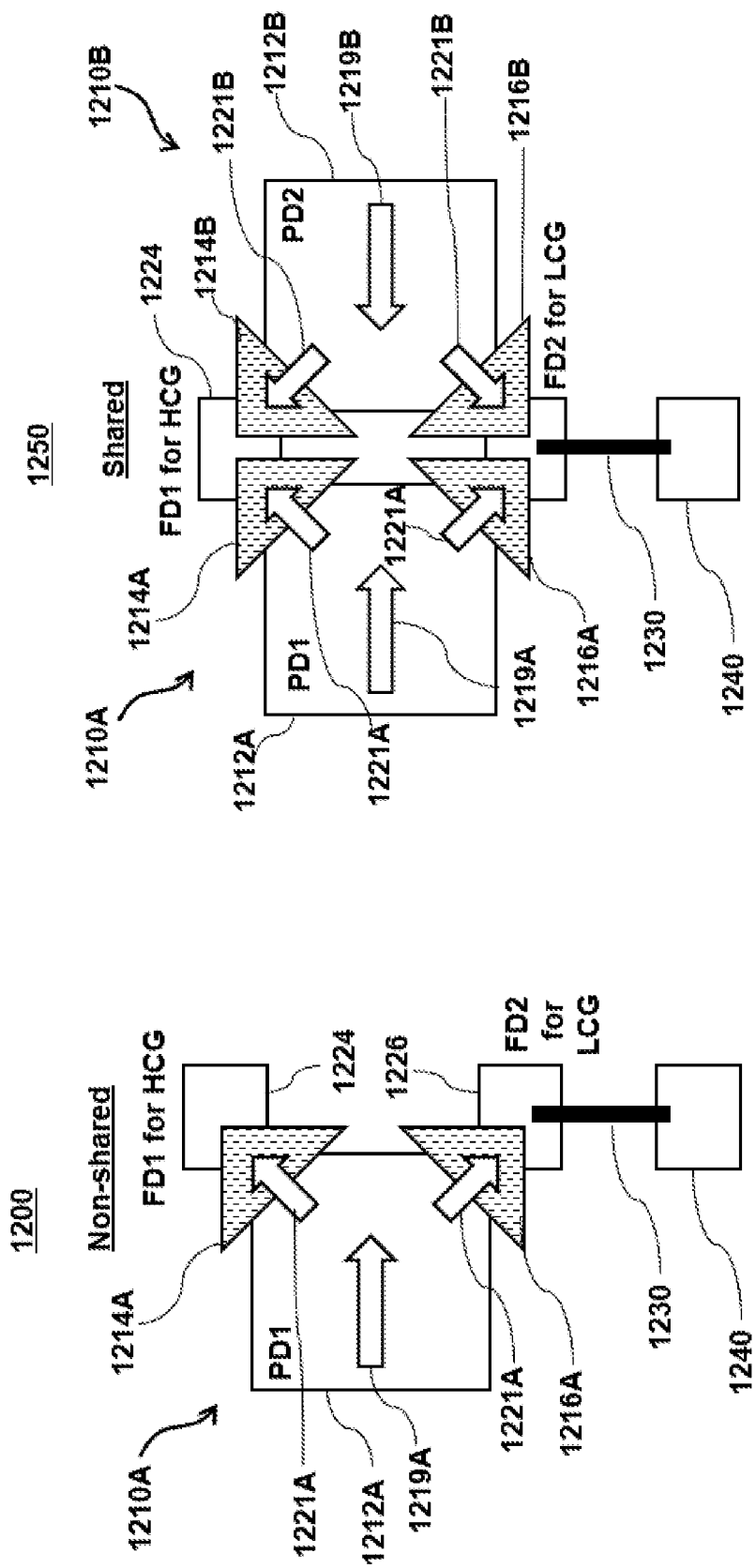
FIGS. 12A-12B are schematic representations of an example non-shared active pixel system and an example shared active pixel system, in accordance with one or more embodiments.

FIGS. 12A-12B are a schematic representation of an example non-shared active pixel system 1200 and an example shared active pixel system 1250, in accordance with one or more embodiments. FIGS. 12A and 12B depict exemplary implementations for providing high dynamic range readout. High dynamic range readout may be implemented by either non-shared active pixel system 1200 including a first active pixel 1210A, or shared active pixel system 1250 including first active pixel 1210A and a second active pixel 1210B. In some embodiments, non-shared active pixel system 1200 including first active pixel 1210A may be used instead of, or in addition to, active pixel 210 of FIGS. 2A and 2B. Shared active pixel system 1250 including first active pixel 1210A and second active pixel 1210B may be used instead of, or in addition to, active pixel 410 of FIGS. 4A and 4B.

In some embodiments, non-shared active pixel system 1200 includes first active pixel 1210A, as illustrated by FIG. 12A. First active pixel 1210A may include, and be operatively coupled to, a first transfer gate 1214A and a second transfer gate 1216A. Transfer gates 1214A and 1216A may be operatively coupled to floating diffusion nodes 1224 and 1226, respectively. In some embodiments, application of an electric field to first active pixel 1210A may cause an electron drift current to be generated within PD 1212A. In FIGS. 12A and 12B, electron flow 1219A corresponding to the electron drift current generated within PD 1212A and electron flow 1219B corresponding to the electron drift current generated within PD 1212B are depicted. In some embodiments, transfer gates 1214A and 1216A may be configured to cause electron flow 1219A to be generated in a direction from a first side of PD 1212A to a second side of PD 1212A. Electron flow 1219A may therefore produce a two-way charge transfer 1221A. In some embodiments, an electron drift current, such as electron flow 1219A, formed by an electric field being applied to active pixel 1210A, can increase a conductivity in PD 212. For example, the increased conductivity may induce charge transfer of a charge particle (e.g., an electron) from one side of PD 1212A to the other side of PD 1212A. When operation of transfer gates 1214A and 1216A modulates the electric field near transfer gates 1214A and 1216A, electrons may transfer from transfer gates 1214A and 1216A to floating diffusion node 1224 or floating diffusion node 1226, respectively. In some embodiments, electrons may alternatively transfer from transfer gate 1214A and/or 1216A to a drain.

In some embodiments, shared active pixel system 1250 includes first active pixel 1210A and second active pixel 1210B, as illustrated by FIG. 12B. First active pixel 1210A may include, and be operatively coupled to, first transfer gate 1214A and second transfer gate 1216A. Second active pixel 1210B may include, and be operatively coupled to, first transfer gate 1214B and second transfer gate 1216B. Transfer gates 1214A and 1214B may be operatively coupled to floating diffusion node 1224, and transfer gates 1216A and 1216B may be operatively coupled to floating diffusion node 1226. In some embodiments, application of an electric field to first active pixel 1210A and second active pixel 1210B may cause electron flow 1219A to be generated within PD 1212A and an electron flow 1219B to be generated within PD 1212B. In some embodiments, transfer gates 1214A, 1214B, 1216A, and 1216B may be configured to cause electron flow 1219A and 1219B to be generated in a direction from a first side of PD 1212A to a second side of PD 1212A, and from a first side of PD 1212B to a second side of PD 1212B. In some embodiments, electron flow 1219A and electron flow 1219B may be equal in magnitude but opposite in direction. In some embodiments, a same electric field may be applied to both PD 1212A and 1212B to cause electron flows 1219A and 1219B to each be generated therein. In some embodiments, different electric fields may be applied to each of PD 1212A and PD 1212B. Electron flow 1219A may therefore produce two-way charge transfer 1221A and electron flow 1219B may produce two-way charge transfer 1221B. In some embodiments, an electron drift current, such as electron flow 1219A and/or electron flow 1219B, formed by an electric field being applied to active pixel 1210A and 1210B, can increase a conductivity in PD 1212A and 1212B. For example, the increased conductivity may induce charge transfer of a charge particle (e.g., an electron) from one side of PD 1212A to the other side of PD 1212A, and from one side of PD 1212B to the other side of PD 1212B. When operation of transfer gates 1214A and 1216A modulates the electric field near transfer gates 1214A and 1216A, electrons may transfer from transfer gates 1214A and 1216A to floating diffusion node 1224 or floating diffusion node 1226, respectively.

Similarly, when operation of transfer gates 1214B and 1216B modulates the electric field near transfer gates 1214B and 1216B, electrons may transfer from transfer gates 1214B and 1216B to floating diffusion node 1224 or floating diffusion node 1226, respectively. In some embodiments, electrons may alternatively transfer from transfer gate 1214A, 1214B, 1216A, and/or 1216B to a drain.

Active pixel 1210A of non-shared active pixel system 1200 may include first transfer gate 1214A and floating diffusion node 1224 for a high conversion gain (HCG) signal and second transfer gate 1216A and floating diffusion node 1226 for a low conversion gain (LSG) signal. High dynamic range readouts may function by utilizing a first transfer to floating diffusion node 1224 and a second transfer to floating diffusion node 1226. Shared active pixel system 1250 may include active pixel 1210A, including first transfer gate 1214A and floating diffusion node 1224, and active pixel 1210B, including first transfer gate 1214B and floating diffusion node 1224 (shared by transfer gates 1214A and 1214B), for high conversion gain (HCG) signals; and active pixel 1210A, including second transfer gate 1216A and floating diffusion node 1226, and active pixel 1210B including second transfer gate 1216B and floating diffusion node 1226 (shared by transfer gates 1216A and 1216B), for low conversion gain (LSG) signals. High dynamic range readouts may function by utilizing a first transfer to floating diffusion node 1224 and a second transfer to floating diffusion node 1226.

In some embodiments, at a low luminance level of incident light, there are some charges in floating diffusion node 1224, and no charges, or less than a threshold amount of charge, in floating diffusion node 1226. In some embodiments, a single floating diffusion node is utilized for high gain readout, however alternatively two floating diffusion nodes may be utilized for high gain readouts. At a high luminance level of incident light, there are some charges in both floating diffusion node 1224 and floating diffusion node 1226. In some embodiments, to use both floating diffusion nodes 1224 and 1226 for low gain readout, charge addition processing techniques for floating diffusion nodes 1224 and 1226 are needed. As described herein, charge addition refers to a digital binning operation that combines floating diffusion nodes 1224 and 1226 in the digital domain. In this manner, a single exposure high dynamic range signal is achieved. For example, floating diffusion node 1226 may be coupled to a capacitor 1240 via a connection wire 1230. Capacitor 1240 may include a metal oxide semiconductor (MOS) capacitor, a metal-insulator-metal (MIM) capacitor, a metal-oxide-metal (MOM) capacitor, or other types of capacitors, or other sensors.

Figure 13:
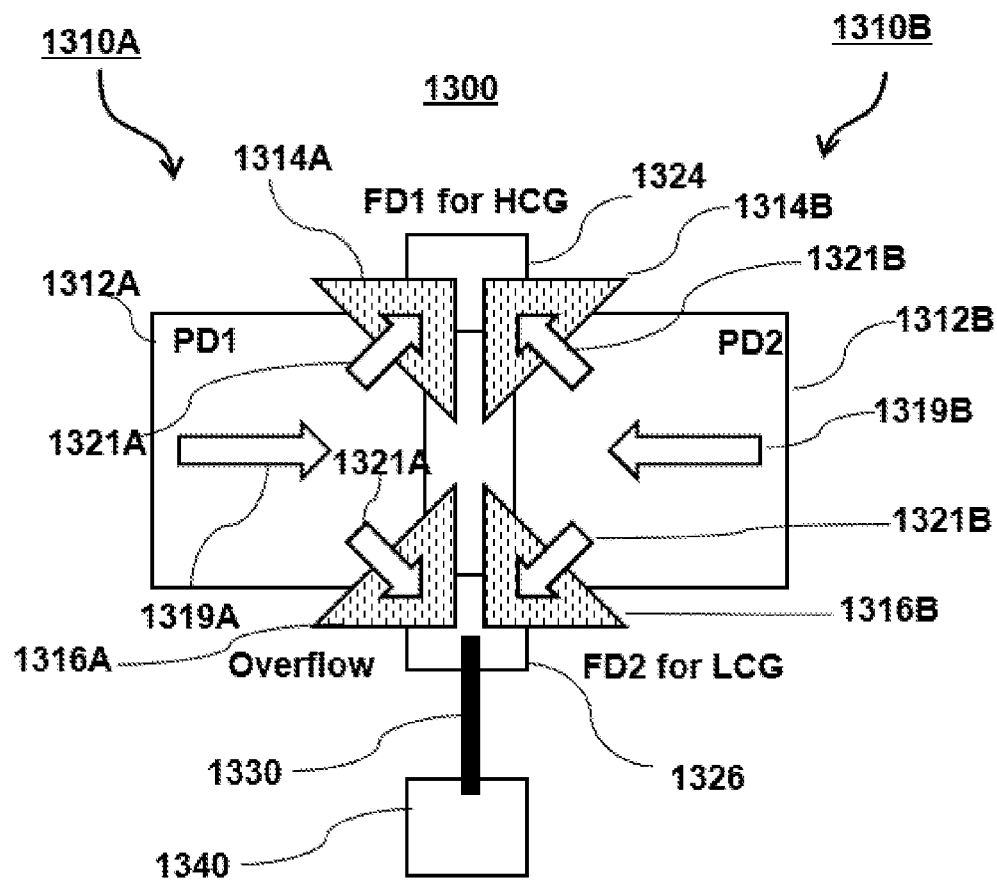
FIG. 13 is a schematic representation of an example shared active pixel system, in accordance with one or more embodiments.

FIG. 13 is a schematic representation of an example shared active pixel system 1300, in accordance with one or more embodiments. Shared active pixel system 1300 may be used for implementing high dynamic range readout for high gain/high resolution readout and for high full well capacity (FWC) and low resolution readout. As utilized herein, "high dynamic range readout" may include high gain for high-resolution readout, and high FWC for low resolution readout. In some embodiments, shared active pixel system 1300 may include a first active pixel 1310A and a second active pixel 1310B. Active pixels 1310A and 1310B may be substantially similar to active pixel 410 of FIGS. 4A and 4B, and the previous description may apply.

In some embodiments, shared active pixel system 1300 is configured for high gain/high resolution and high FWC/low resolution readouts by use of an overflow path during an overflow operation, discussed in further detail below. First active pixel 1310A may include a photodiode (PD) 1312A, and second active pixel 1310B may include a photodiode (PD) 1312B. PD 1312A and PD 1312B may share both floating diffusion node 1324, which is configured to receive transfer electrons from transfer gates 1314A and 1314B, respectively, for a high conversion gain (HCG) signal. PD 1312A and PD 1312B may share floating diffusion node 1326, which may be configured to receive transfer electrons from transfer gates 1316A and 1316B, respectively, for a low conversion (LCG) signal. Application of the electric field may cause electron drift currents to be generated within PD 1312A and PD 1312B, respectively. In FIG. 13, electron flow 1319A corresponding to the electron drift current generated within PD 1312A and electron flow 1319B corresponding to the electron drift current generated within PD 1312B are depicted. Electron flow 1319A may produce a two-way charge transfer 1321A, and electron flow current 1319B may produce a two-way charge transfer 1321B. In some embodiments, an electron drift current, such as electron flows 1319A and 1319B, formed by an electric field being applied to active pixels 1310A and 1310B, can increase a conductivity in active pixels 1310A and 1310B. In some embodiments, active pixels 1310A and 1310B may be coupled to a capacitor 1340 via a connection wire 1330 for charge addition processing. Capacitor 1340 may be the same or similar to capacitor 1240 of FIG. 12B, and the previous description may apply.

In some embodiments, high gain/high-resolution operation may include a first transfer of charge from PD 1312A of active pixel 1310A and PD 1312B of active pixel 1310B to floating diffusion node 1324. During operation in low luminance environments, there may be some charges in floating diffusion node 1324 and no charges, or less than a threshold amount of charge, in floating diffusion node 1326. During operation in high luminance environments, there may be some charge in floating diffusion node 1324 and some charge in floating diffusion node 1326 due to an overflow operation. During the overflow operation, floating diffusion node 1324 may generate excess electrons from high luminance conditions. An overflow path may be created beneath the transfer gate (e.g., transfer gate 1316A and/or transfer gate 1316B), and the excess charge may transfer into floating diffusion node 1326, thereby providing the overflow operation. In some embodiments, both floating diffusion nodes 1324 and 1326 may be utilized for high full well capacity (FWC)/low resolution readout. Charge addition processing of floating diffusion nodes 1324 and 1326 may be needed for achieving high FWC and low resolution readout.

Figure 14:
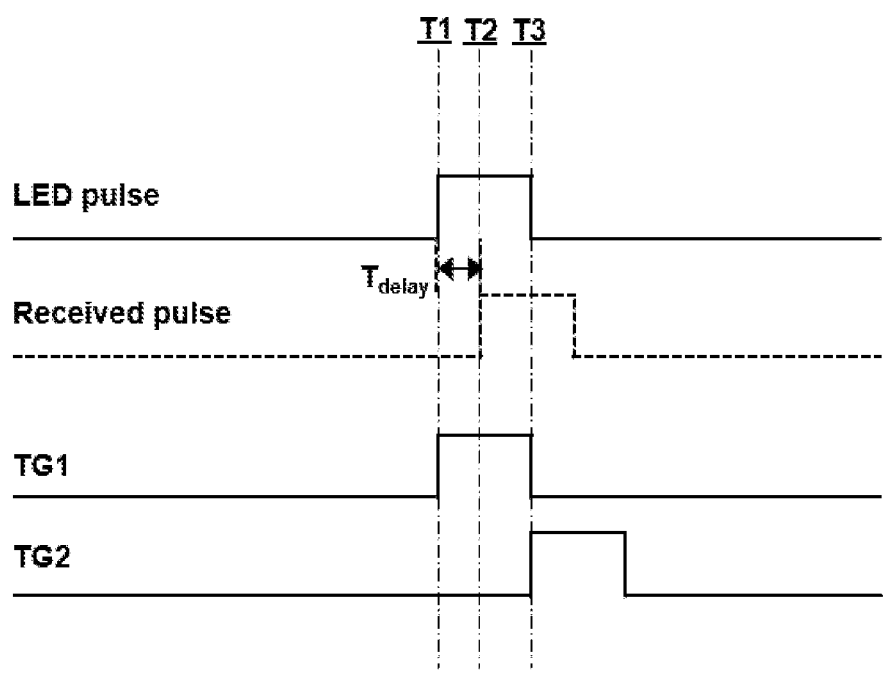
FIG. 14 is an example timing diagram corresponding to the active pixel systems of FIGS. 12A-12B and 13, in accordance with one or more embodiments.

FIG. 14 is an example timing diagram 1400 corresponding to the active pixel systems of FIGS. 12A-12B and 13, in accordance with one or more embodiments. In some embodiments, non-shared active pixel system 1200 and shared active pixel system 1250 of FIGS. 12A and 12B, respectively, or shared active pixel system 1300 of FIG. 13, may be applied for time-of-flight (ToF) readouts utilizing an indirect time-of-flight methodology. Indirect ToF operations may be implemented, in some embodiments, utilizing active pixel 1210A of non-shared active pixel system 1200. In some embodiments, ToF operations may be implemented utilizing active pixels 1210A and 1210B of shared active pixel system 1250 and/or active pixels 1310A and 1310B of shared active pixel system 1300.

Timing diagram 1400 may describe an operation of active pixel 1210A of non-shared active pixel system 1200, active pixels 1210A and 1210B of shared active pixel system 1250, and/or active pixels 1310A and 1310B of shared active pixel system 1300, for achieving indirect time-of-flight measurements. The time-of-flight methodology, in accordance with one or more embodiments described herein, initiates a first transfer of electron charge from one or more photodiodes to a floating diffusion node (e.g., PD 1212A to floating diffusion node 1224, PD 1212A and PD 1212B to floating diffusion node 1224, PD 1312A and PD 1312B to floating diffusion node 1324), and a second transfer of electron charge may occur from one or more photodiodes to another floating diffusion node (e.g., PD 1212A to floating diffusion node 1226, PD 1212A and PD 1212B to floating diffusion node 1226, PD 1312A and PD 1312B to floating diffusion node 1326). For example, at time T1, charge may be detected as transferring from a photodiode to a first transfer gate, whereas at a time T3, charge may be detected as transferring from the photodiode to the second transfer gate. Some charges (e.g., electrons) may transfer to one floating diffusion node (e.g., floating diffusion node 1224, floating diffusion node 1324), while other charges may transfer to another floating diffusion node (e.g., floating diffusion node 1226, floating diffusion node 1326). The amount of charges transferred to the floating diffusion nodes corresponds to a reflection time. The reflection time can be utilized to determine a distance from the LED plus sensor to the objects. For example, a temporal difference, $T_{Delay}$, as illustrated in timing diagram 1400, may indicate an amount of time between when a signal is emitted from a source (e.g., time T1), such as an LED pulse, and when the signal is received (e.g., detected) by an active pixel (e.g., time T2). Time of flight systems have many practical applications, including particle physics measurement systems, signal processing, image processing, and others.

Any one or more of the active pixels described by the embodiments from FIGS. 2A-14 may be implemented as an active pixel 110 of FIG. 1A or of active pixel 110 of FIG. 1B so long as appropriate modifications to the circuitry of DPS image sensing system 100A or 100B, respectively, are made as understood by those of ordinary skill in the art.

Figure 15:
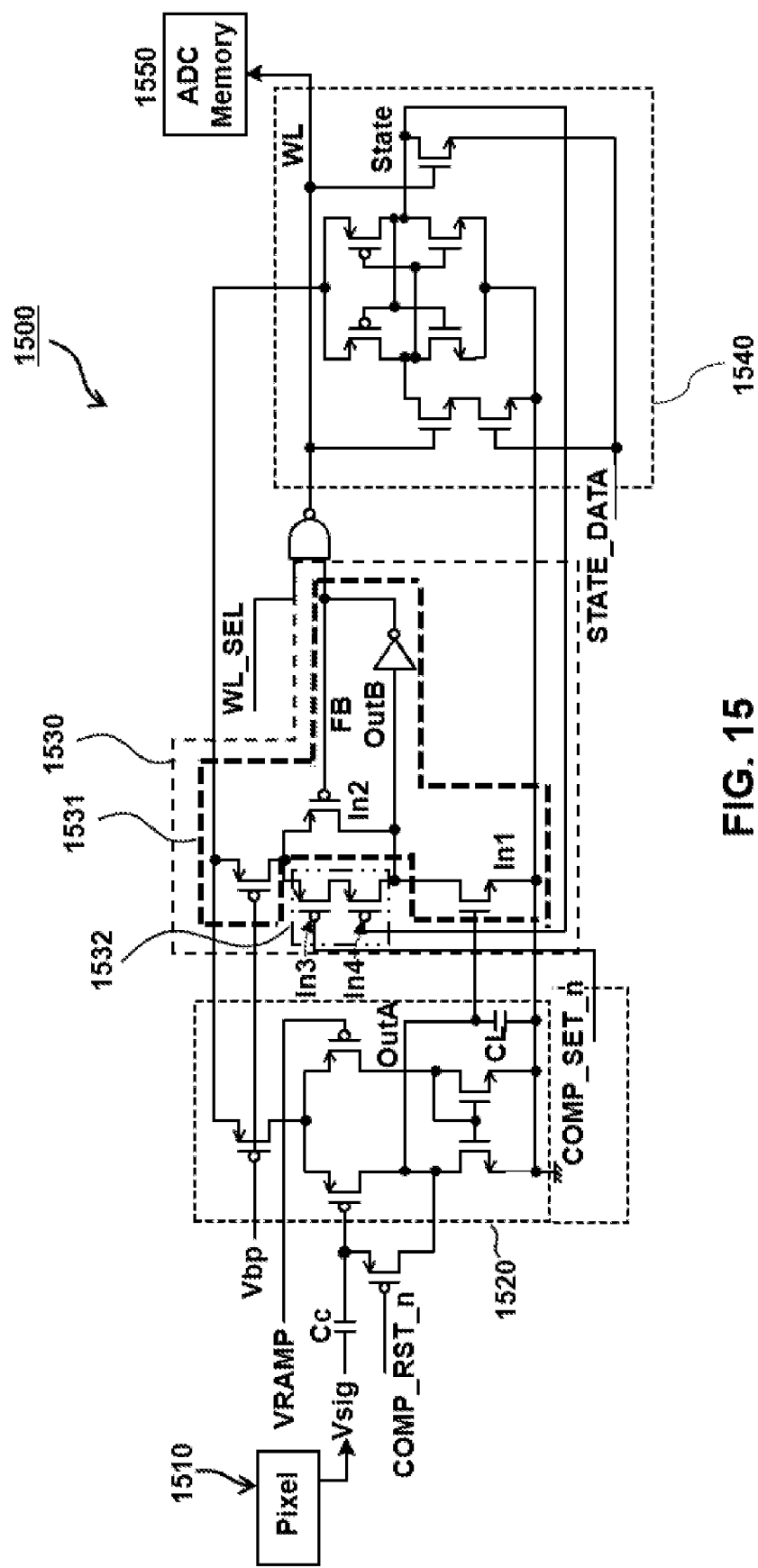
FIG. 15 is a schematic representation of an example Back-end ADC and memory circuit, in accordance with one or more embodiments.

FIG. 15 is a schematic representation of an example back-end ADC and memory circuit 1500, in accordance with one or more embodiments. Back-end ADC and memory circuit 1500 may represent a transistor level circuit diagram of back-end ADC and memory circuit 115 of FIG. 1. Multiple ADC schemes are effective for a wide dynamic range of operations. In some embodiments, back-end ADC and memory circuit 1500 provides a write control scheme and circuit on multiple ADC operations in DPS devices with small area. Additionally, back-end ADC and memory circuit 1500 can utilize memory efficiently.

For each pixel in a digital processing system (e.g., DPS image sensing system 100A of FIG. 1A or DPS image sensing system 100B of FIG. 1B), a back-end ADC and memory circuit and a digital memory are required. In some embodiments, back-end ADC and memory circuit 1500 may be operatively coupled to an active pixel 1510. Back-end ADC and memory circuit 1500 may include a comparator 1520, and a write control circuit 1530. In some embodiments, active pixel 1510, comparator 1520, and write control circuit 1530 are substantially similar to active pixel 110, comparator 120, and write control circuit 130 of FIG. 1A, and the previous descriptions may apply. In some embodiments, back-end ADC and memory circuit 1500 may also include a state latch 1540. State latch 1540 may be effective for multiple ADC operations, which are described in further detail below. State latch 1540 may be the same or similar to state latch 140 of FIG. 1, and the previous description may apply. In some embodiments, back-end ADC and memory circuit 1500 represents an example of back-end ADC and memory circuit 115 of DPS image sensing system 100A or similar components of DPS image sensing system 100B. Write control circuit 1530 may include a positive feedback circuit 1531 at the output stage of write control circuit 1530, as well as initializing circuit 1532. In some embodiments, positive feedback circuit 1531 and initializing circuit 1532 may be the same or similar to positive feedback circuit 131 and initializing circuit 132, respectively, of FIG. 1, and the previous descriptions may apply.

In response to an output (e.g., "OutA") of comparator 1520 flipping from a particular logical value (e.g., logical 0) to the opposite logical value (e.g., logical 1), a positive feedback output FB of positive feedback circuit 1531 becomes FB=1. FB=1 may be kept (e.g., positive feedback circuit 1531 may be "locked") regardless of the output (e.g., "OutA") of comparator 1520 until an initializing operation is performed using of COMP_SET_n=0. In some embodiments, COMP_SET_n=0 may be used for an initialization operation, which may be required to set OutB=1 and FB=0. In some embodiments, the initialization operation of comparator 1520 is used to start ADC conversion. The initialization operation may be performed using the lowest VRAMP voltage, which leads to OutA becoming OutA=0 and a switch of the output of initializing circuit 1532 for connection to node 'Ink', as seen in more detail with reference to FIG. 1. The initialization operation may also apply COMP_SET_n=0. In a use case where State=0, the output of positive feedback circuit 1531 in write control circuit 1530 is FB=0 and OutB=1. It should be noted that, differing from FIG. 1, COMP_SET_n and State may be used by positive feedback circuit 1531 and initializing circuit 1532 instead of COMP_SET and State_n, which are used in FIG. 1. COMP_SET_n may be obtained by inverting COMP_SET, and State may be obtained by inverting State_n.

Next, with those states (i.e., COMP_SET_n=0 and State=0), comparator 1520 and positive feedback circuit 1531 may be initialized. Once comparator 1520 and positive feedback circuit 1531 are initialized, an ADC operation can start with COMP_SET_n=1, enabling write operations to be performed to ADC memory 1550. In a use case where State=1, FB=1 (OutB=0) is kept even if OutA=0 using the lowest VRAMP voltage and even at COMP_SET_n=0. After flipping COMP_SET_n=1, memory is not written because of WL=0. In this manner, state latch 1540 may output 'State' to control an activation of back-end ADC and memory circuit 1500. In some embodiments, data may be written to memory (e.g., ADC memory 1550) using comparator 1520 when State=0.

In some embodiments, comparator 1520 may be configured to facilitate the following operation:
1) Perform an auto-zero operation by setting COMP_RST_n=0 with VRAMP being equal to a reset level.
2) Initialize comparator 1520 by turning positive feedback circuit 1531 to an unlocked state (e.g., FB=0) from a locked state (e.g., FB=1) using COMP_SET_n=0. Positive feedback circuit 1531 becomes unlocked (e.g., FB=0) in the case of State=0, however positive feedback circuit 1531 remains locked (e.g., FB=1) in case of State=1. In the latter scenario, data is not written to memory (e.g., ADC memory 1550) because of WL=0.
3) Perform a ramp-up operation using VRAMP signal. ADC data may be stored at comparator 1520, flipping only when FB=1. In some embodiments, 'WL_SEL=0' is used for read operations of ADC memory 1550.

WL_SEL=0 may also be utilized for initializing State=0 before a first ADC operation in a multiple ADC operation scenario.

As shown in FIG. 15, write control circuit 1530, which may include positive feedback circuit 1531 and initializing circuit 1532 combined with a constant current inverter of comparator $2^{nd}$ stage. In some embodiments, COMP_SET_n and State have an opposite polarity of COMP_SET and State_n in FIG. 1, respectively, for a pMOS gate. In FIG. 1, OutA of comparator 120 is OutA=0 for COMP_SET switch in FIG. 1, but may be removed in some embodiments. In some embodiments, OutA=0 may be set to ground (GND) for comparator 1520 performing an initialization operation using a suitable VRAMP voltage after an auto-zero operation without the switch.

In some embodiments, STATE_DATA is connected to state latch 1540 circuit through an nMOS transistor pair. When comparator 1520 causes word line selection to switch from WL=1 to WL=0, state latch 1540 may be fixed as State=STATE_DATA at flipping time. ADC memory 1550 may store bit line data at the same time. STATE_DATA=1 may intentionally be given for any suitable ADC range for each operation of back-end ADC and memory circuit 1500.

Any one or more of the active pixels described by the embodiments from FIGS. 2A-14 may be implemented as an active pixel 1510 of FIG. 15 so long as appropriate modifications to the circuitry of back-end ADC and memory circuit 1500 are made as understood by those of ordinary skill in the art.

Figure 16:
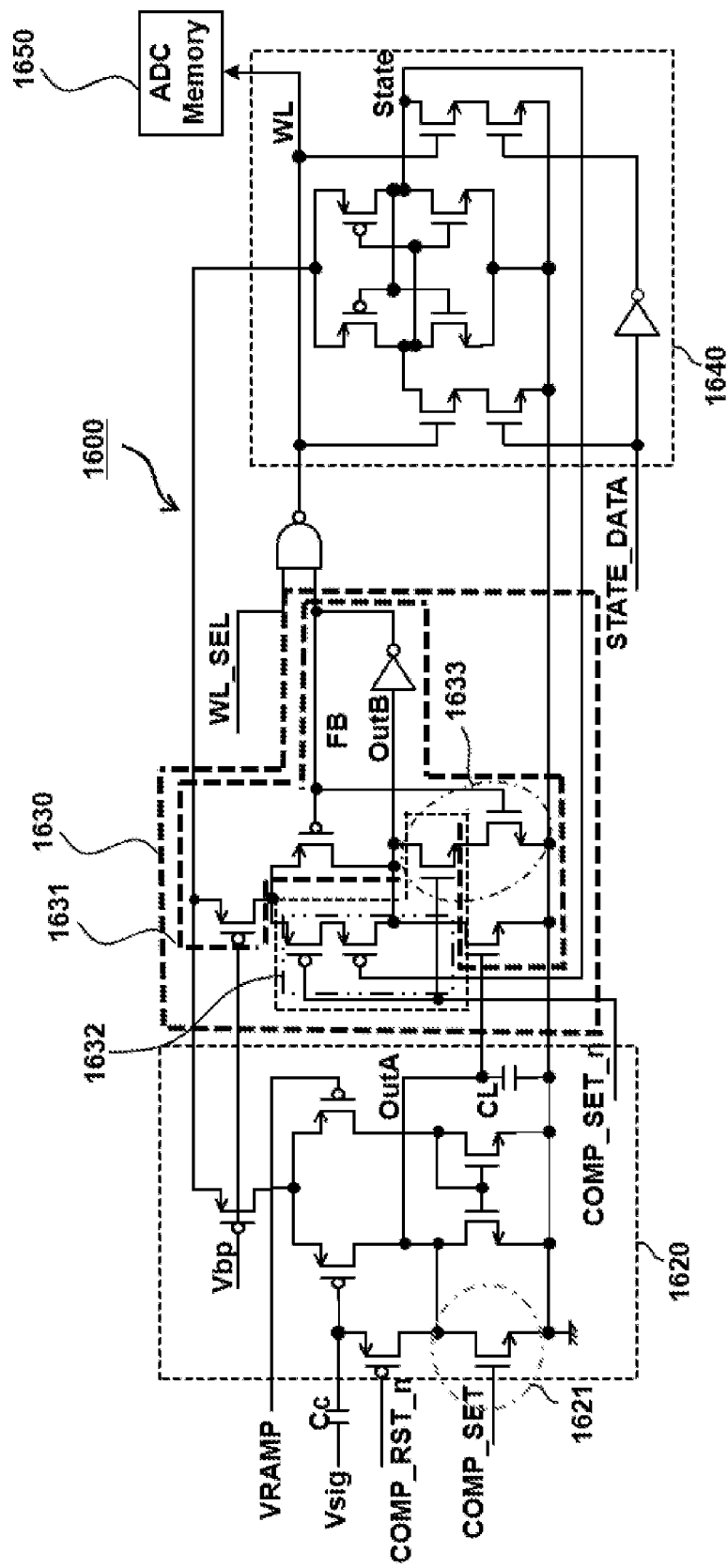
FIG. 16 is a schematic representation of an example Back-end ADC and memory circuit, in accordance with one or more embodiments.

FIG. 16 is a schematic representation of an example back-end ADC and memory circuit 1600, in accordance with one or more embodiments. Back-end ADC and memory circuit 1600 may be the same or similar to back-end ADC and memory circuit 1500 of FIG. 15, and the previous description may apply. For example, back-end ADC and memory circuit 1600 may include a comparator 1620 and a write control circuit 1630, which may be the same or similar to comparator 1520 and write control circuit 1530 of FIG. 15. Write control circuit 1630 may include a positive feedback circuit 1631 and an initializing circuit 1632. Back-end ADC and memory circuit 1600 may differ from back-end ADC and memory circuit 1500 in that nMOS transistor pair 1633 may be added to positive feedback circuit 1631 for realizing a CMOS structure of both COMP_SET_n and an output signal of positive feedback circuit 1631, respectively. In this manner, a flipping speed of positive feedback circuit 1631 can be accelerated using nMOS transistor pair 1633. Additionally advantageous, write control circuit 1630 may reduce through current during flipping. Also, comparator 1620 of back-end ADC and memory circuit 1600 may include nMOS switch 1621 of COMP_SET for realizing additional device performance, such as, for example, preventing large delays of initialization in cases where capacitor CL is large. In some embodiments, nMOS switch 1621 may be realized as a pair of transistors (e.g., nMOS transistors). In this manner, nMOS switch 1621 may be effective for faster initializing operation of ADC operations.

Any one or more of the active pixels described by the embodiments from FIGS. 2A-14 may be implemented as an active pixel for back-end ADC and memory circuit 1600 are made as understood by those of ordinary skill in the art.

Figure 17:
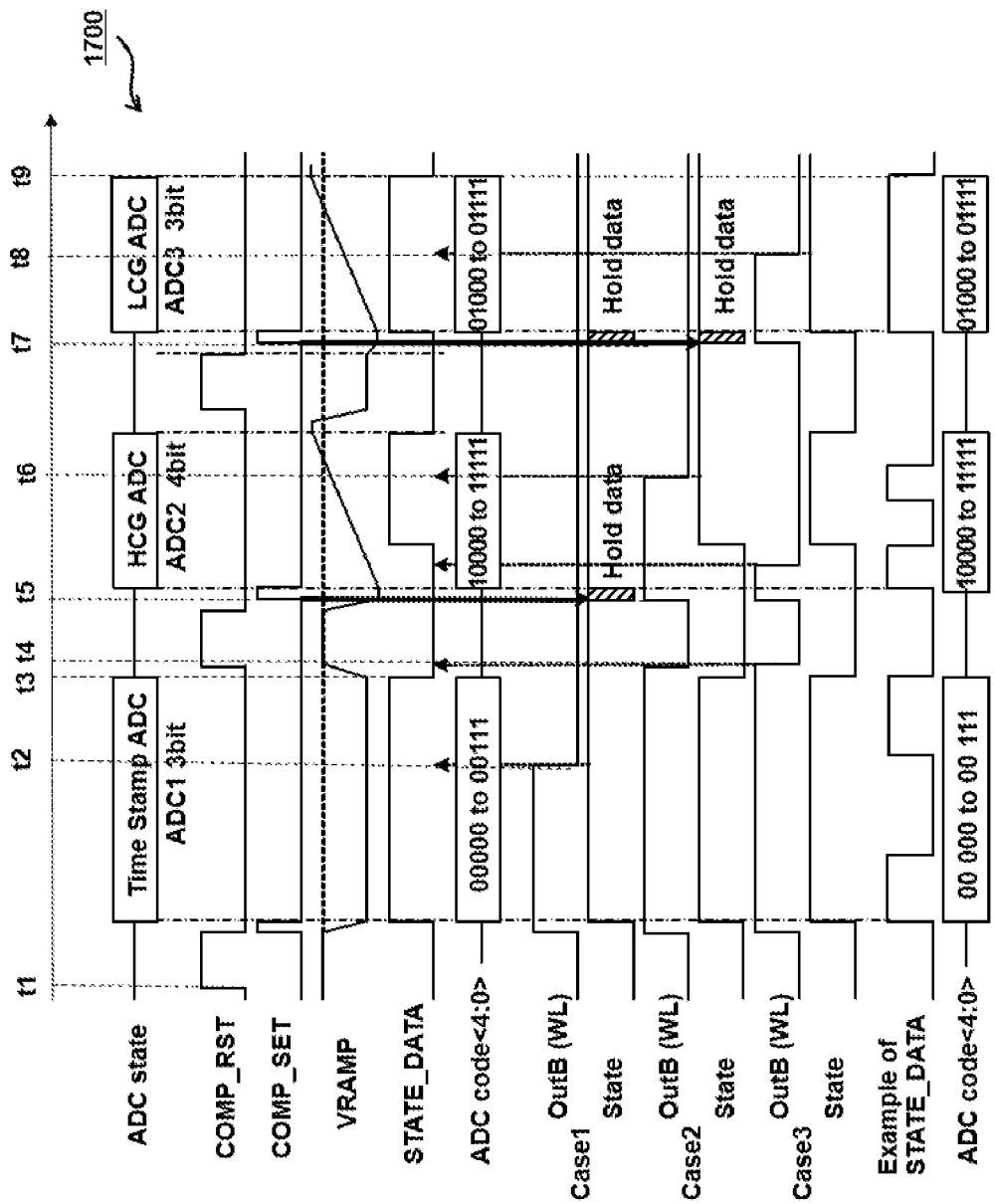
FIG. 17 is a timing diagram of an exemplary operation of an Back-end ADC and memory circuit, in accordance with one or more embodiments.

FIG. 17 is a timing diagram 1700 of an exemplary operation of an Back-end ADC and memory circuit, in accordance with one or more embodiments. Timing diagram 1700 may be applied to each one of the circuits shown in FIG. 1, 15 or 16 with a caveat that, for the circuits as shown in FIGS. 15 and 16, COMP_SET_n is substituted for COMP_SET and State is substituted for State_n. COMP_SET_n may be obtained by inverting COMP_SET, and State may be obtained by inverting State_n.

Timing diagram 1700 may depict an example of an overlapped 3Q operation. In some embodiments, WL_SEL may be set to 1 (WL_SEL=1) such that WL may have the same value as OutB throughout ADC operations. In some embodiments, when WL is inverted from logical 1 to logical 0, a time code (i.e., ADC-code) is written to memory (e.g., ADC memory 150, 1550, 1650). In some embodiments, the time code written to and stored in memory indicates the time at which WL is inverted (i.e., the time when the comparator, such as comparator 120, 1520, 1620, is flipped). That is, the time code stored in memory may be a digitized light intensity value. When WL is inverted from logical 1 to logical 0, in addition to writing the time code to the memory, STATE_DATA may be written to state latch (e.g., state latch 140, 1540, 1640).

In some embodiments, an auto-zero operation may be performed before every ADC operation. To perform the auto-zero operation, COMP_RST may be set to 1, (e.g., COMP_RST=1). In some embodiments, comparator (e.g., comparator 120) may perform an initializing operation of setting COMP_SET to 1 (e.g., COMP_SET=1), which may release the positive feedback circuit (e.g., positive feedback circuit 131, 1531, 1631) from locked status, after each auto-zero operation. In some embodiments, the comparator (e.g., comparator 120, 1520, 1620) may perform an initialization operation setting COMP_SET_n to 0 (e.g., COMP_SET_n=0). During the time period when STATE_DATA is set to logical 1, a time code (i.e., ADC code) written to memory when the comparator is flipped may be retained for the remaining time during one ADC cycle. The waveform of STATE_DATA may be designed depending on time range during which a time code written to memory is desired to be retained for the remaining time of one ADC operation cycle. A time period during which STATE_DATA is set to logical 0 is not limited to a particular period of time in a cycle of a given ADC operation.

Timing diagram 1700 illustrates 3 cases:
Case 1—Output OutB flips one time;
Case 2—Output OutB flips two times; and
Case 3—Output OutB flips three times.

As seen in timing diagram 1700, when output OutB (WL) is inverted from logical 1 to logical 0, State is kept at the same value as STATE DATA (i.e., State=STATE_DATA). In the current ADC operation cycle starting at time t1 as shown in FIG. 17, if OutB(WL) is inverted from logical 1 to logical 0 during Time Stamp ADC, for example at time t2, when STATE DATA=1 as shown by Case 1, a time code (i.e., ADC code) at time t2 is written to memory (e.g., ADC memory 150, 1550, 1650) and State is set to logical 1 (i.e., State=1). In some cases, setting State to logical 1 causes the comparator (e.g., comparator 120, 1520, 1620) and the positive feedback circuit (e.g., positive feedback circuit 131, 1531, 1631) to be turn to a locked state. Since State is kept at logical 1 (i.e., State=1) for the remaining time of the current cycle of the ADC operation, the ADC code stored in the memory is kept until the current cycle of the ADC operation has ended at time t9 even when COMP_SET turns to logical 1 before entering into HCG ADC or LCG ADC.

If OutB (WL) is inverted from logical 1 to logical 0 while STATE DATA=0 during Time Stamp ADC, for example at time t4 as shown by Case 2 and Case 3, then a time code (i.e., ADC code) at time t4 is written to memory (e.g., ADC memory 150, 1550, 1650) and State is set to logical 0 (i.e., State=0) because of STATE DATA=0. Thus, in Case 2 or Case 3, when COMP_SET is set to logical 1 (or COMP_SET_n is set to logical 0) at time t5 just before HCG ADC has commenced, the initializing circuit (e.g., initializing circuit 132, 1532, 1632) turns the comparator (e.g., comparator 120, 1520, 1620) and the positive feedback circuit (e.g., positive feedback circuit 131, 1531, 1631) to an unlocked state and HCG ADC has commenced.

In Case 2, OutB(WL) is inverted from logical 1 to logical 0 during HCG ADC. For example, at time t6, when STATE DATA=1, a time code (i.e., ADC code) at time t6 may be written to the memory (e.g., ADC memory 150, 1550, 1650) and State is set to logical 1 (i.e., State=1), which causes the comparator (e.g., comparator 120, 1520, 1620) and the positive feedback circuit (e.g., positive feedback circuit 131, 1531, 1631) to be turn to a locked state again. In Case 2, since State is kept to logical 1 (i.e., State=1) for the remaining time of the current cycle of the ADC operation, the ADC code stored in the memory during HCG ADC is kept until the current cycle of the ADC operation has ended at time t9 even when COMP_SET turns to logical 1 before entering into LCG ADC.

In Case 3, OutB(WL) is inverted from logical 1 to logical 0 during LCG ADC, for example at time t8, when STATE DATA=1, a time code (i.e., ADC code) at time t8 is written to the memory (e.g., ADC memory 150, 1550, 1650) and State is set to logical 1 (i.e., State=1), which causes the comparator and the positive feedback circuit to be turn to a locked state further again. In Case 3, since State is kept to logical 1 (i.e., State=1) for the remaining time of the current cycle of the ADC operation, the ADC code stored in the memory during LCG ADC is kept until the current cycle of the ADC operation has ended at time t9. Thus, OutB (WL) is inverted from logical 1 to logical 0 during STATE DATE=1, a time code (i.e., ADC code) at the time when OutB (WL) was inverted is written to the memory (e.g., ADC memory 150, 1550, 1650) and the state latch (e.g., state latch 140, 1540, 1640) retains State=1. This may keep the comparator (e.g., comparator 120, 1520, 1620) and positive feedback circuit (e.g., positive feedback circuit 131, 1531, 1631) locked for the remaining time of the current ADC operation cycle. In some embodiments, STATE_DATA may be set to logical 1 only one time in each of Time Stamp ADC, HCG ADC, and LCG ADC, as shown in FIG. 17. In some embodiments, STATE_DATA may alternate between logical 1 and logical 0 to implement a complex ADC operation.

Figures 18A, 18B:
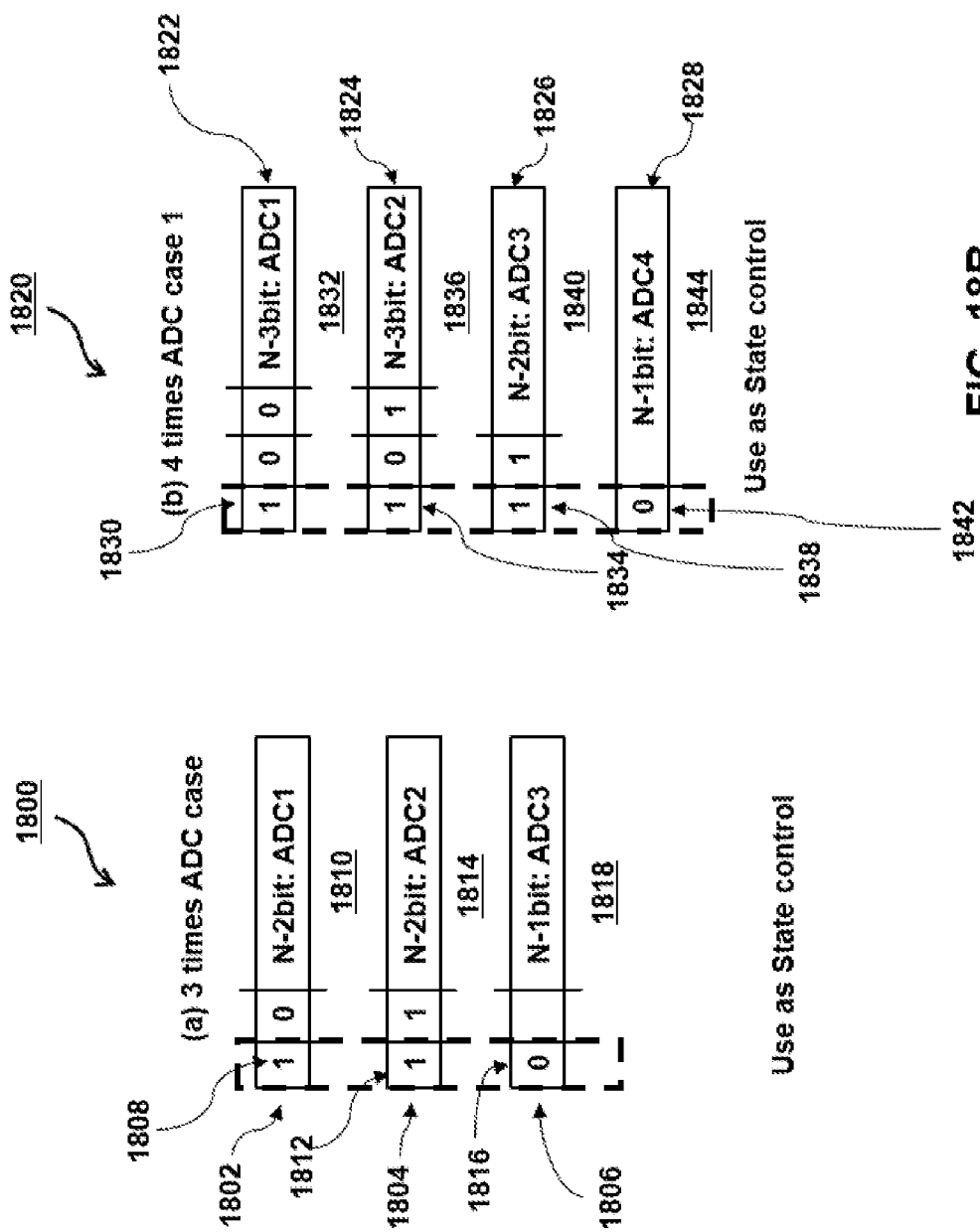
FIGS. 18A-18B are schematic representations of example data structures, in accordance with one or more embodiments.

FIGS. 18A-18B are schematic representations of example data structures 1800 and 1820, in accordance with one or more embodiments. In some embodiment, data for ADC memory 150 may be used instead of a state latch (e.g., state latch 140, 1540, 1640). In some embodiments where ADC memory 150 is used instead of a state latch State (or State_n) may be stored in ADC memory 150, as described below. The data for ADC memory 150 may be configured with a flag bit and a data bit, as illustrated in FIG. 1. The flag bit arrangement described herein may be well-suited for implementing the above described embodiments, however those of ordinary skill in the art will recognize that other flag bit arrangements may be used additionally or alternatively.

Figure 19:
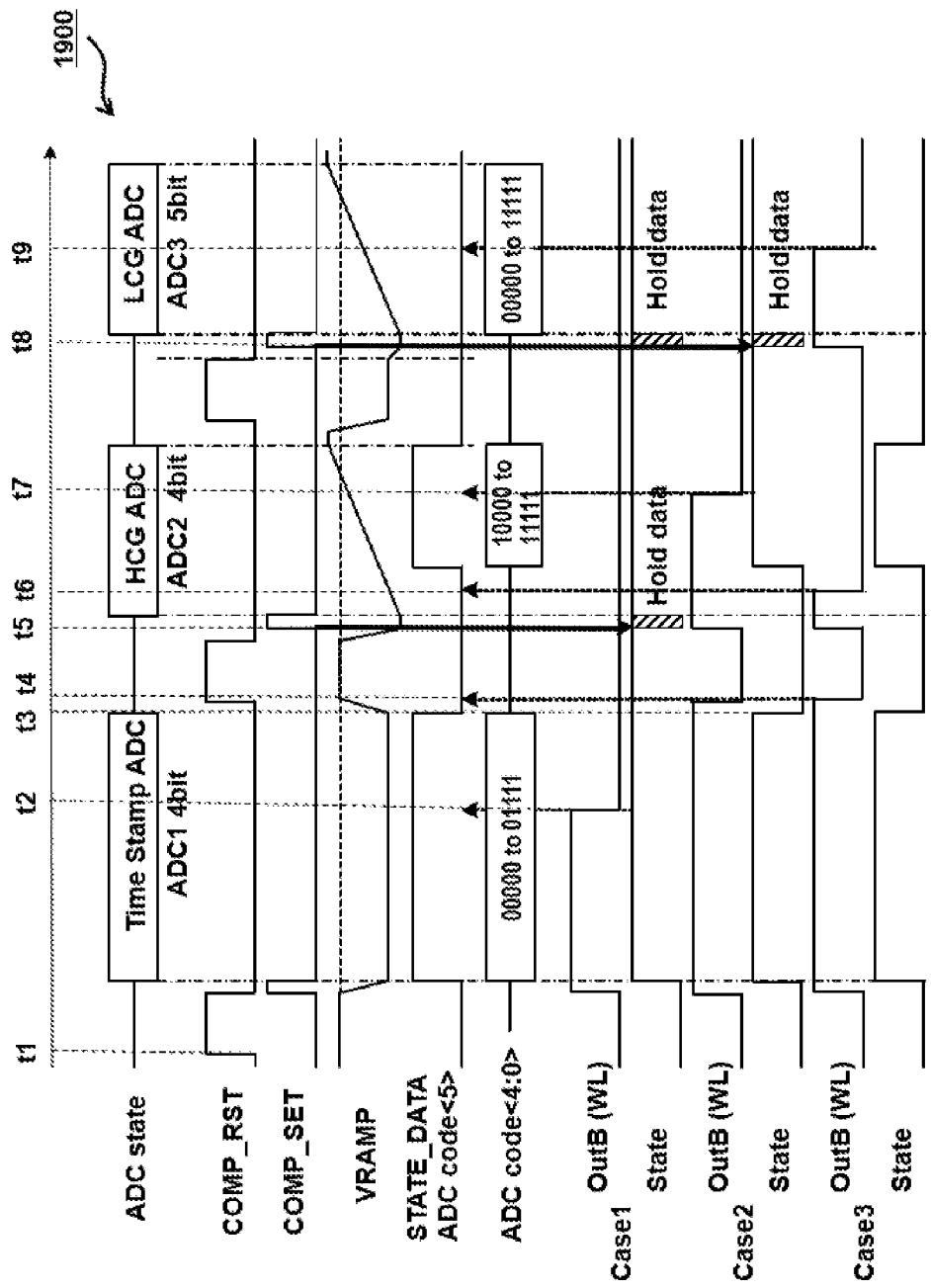
FIG. 19 is a timing diagram of an exemplary operation of an Back-end ADC and memory circuit, in accordance with one or more embodiments.

As shown in FIG. 18A, data structure 1800 may be applicable to an ADC operation such as a three-stage ADC operation including Time Stamp ADC operation (ADC1), HCG ADC operation (ADC2), and LCG ADC (ADC3) operation. In some embodiments, data structure 1800 may include data strings 1802-1806, each of which may include a flag bit and an ADC bit. For example, first data string 1802 is a 6-bit string including a flag bit 1808 and data bit (ADC bit) 1810. First data string 1802 may correspond to a time code written to memory (e.g., ADC memory 150, 1550, 1650) at a given time during the first ADC operation (e.g., Time Stamp ADC in FIG. 19). As described above, a time code may be supplied to read/write data bus line 160 from a time code generator (not shown), and may be written to memory (e.g., ADC memory 150, 1550, 1650) The flag bit 1808 of first data string 1802 may include the most significant bit (MSB) of a time code (or ADC code) that may be written to memory (e.g., ADC memory 150, 1550, 1650) at a time during Time Stamp ADC. The MSB of the first data string 1802 may be assigned to be a logical 1 so that the memory may hold an ADC code in response to an output of a comparator (e.g., comparator 120, 1520, 1620) flipping from a particular logical value (e.g., logical 0) to the opposite logical value (e.g., logical 1). As shown in FIG. 19, the first data string 1802 starts at "100000" and increments up to "101111" during Time Stamp ADC. In FIG. 19, the low 5 bits of first data string 1802 is referred to as ADC code<4:0>.

Second data string 1804 is also a 6-bit data string including a flag bit 1812 and data bit (ADC bit) 1814. Second data string 1804 may correspond to a time code written to memory (e.g., ADC memory 150, 1550, 1650) at a given time during the second ADC operation (e.g., HCG ADC in FIG. 19). Flag bit 1812 of second data string 1804 may include the most significant bit (MSB) of a time code (or ADC code) that may be written to memory (e.g., ADC memory 150, 1550, 1650) at a time during HCG ADC. The MSB of second data string 1804 may be assigned to be a logical 1 so that the memory may hold a ADC code in response to an output of a comparator (e.g., comparator 120, 1520, 1620) flipping from a particular logical value (e.g., logical 0) to the opposite logical value (e.g., logical 1). As shown in FIG. 19, second data string 1804 starts at "110000" and increments up to "111111" during HCG ADC.

Third data string 1806 is also a 6-bit data string including a flag bit 1816 and data bit (ADC bit) 1818. Third data string 1806 may correspond to a time code written to memory (e.g., ADC memory 150, 1550, 1650) at a given time during the third ADC operation (e.g., LCG ADC in FIG. 19). Flag bit 1816 of third data string 1806 may include the most significant bit (MSB) of a time code (or ADC code) that may be written to memory (e.g., ADC memory 150, 1550, 1650) at a time during LCG ADC. The MSB of third data string 1806 may be assigned to be a logical 0. Accordingly, the MSB of third data string 1806 may not hold an ADC code by keeping positive feedback circuit (e.g., positive feedback circuit 131, 1531, 1631) at a locked state. In some embodiments, LCG ADC is the final ADC operation in one ADC cycle as shown in FIG. 19, and an ADC code once written to memory (e.g., ADC memory 150, 1550, 1650) is not overwritten in response to an output of a comparator (e.g., comparator 120, 1520, 1620) flipping from a particular logical value (e.g., logical 0) to the opposite logical value (e.g., logical 1) at a later ADC operation in the cycle. Third data string 1806 starts at "000000" and increments up to "011111" during LCG ADC.

In some embodiments where one cycle of an ADC operation includes four stages as shown in FIG. 18B, data structure 1820 may include data strings 1822-1828, each of which may include a flag bit and an ADC bit. The most significant bit (MSB) of the last ADC (ADC4), data string 1828, may be assigned to be a logical 0. The most significant bit (MSB) of each of earlier ADCs (e.g., ADC1, ADC2, ADC3), corresponding to data strings 1822-1826, may be assigned to be a logical 1. For example, first data string 1822 may include a flag bit 1830 and a data bit (ADC bit) 1832. Second data string 1824 may include a flag bit 1834 and a data bit (ADC bit) 1836. Third data string 1826 may include a flag bit 1838 and a data bit (ADC bit) 1840. Fourth data string 1828 may include a flag bit 1842 and a data bit (ADC bit) 1844.

Figure 18C:
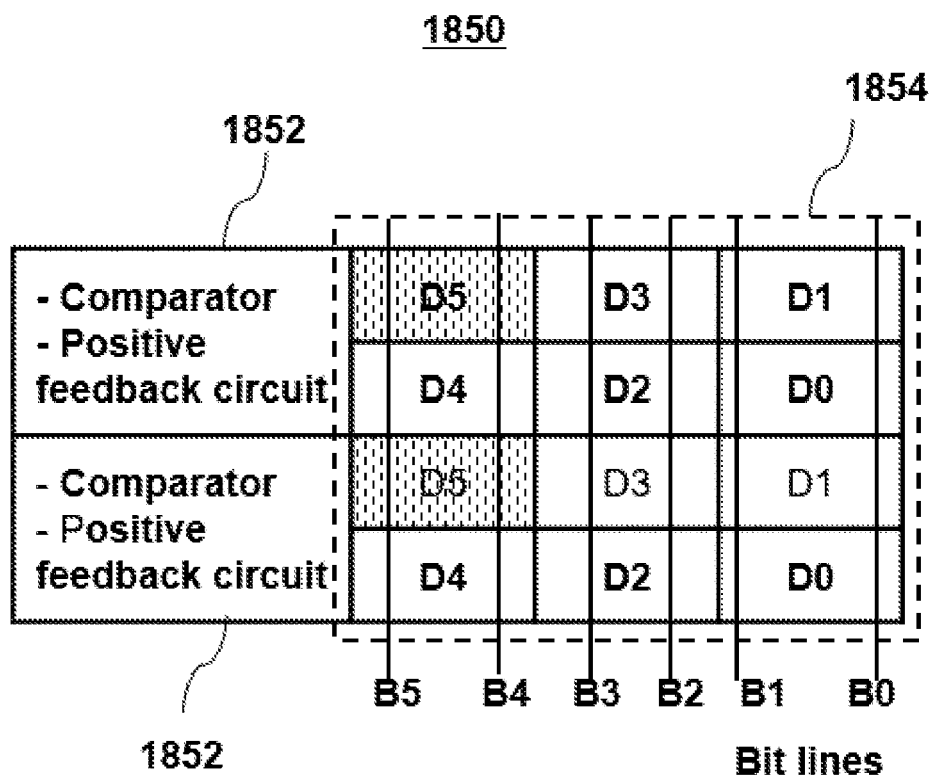
FIG. 18C is a schematic representation of an example memory array, in accordance with one or more embodiments.

FIG. 18C is a schematic representation of an example memory array 1850, in accordance with one or more embodiments. As shown in FIG. 18C, memory array 1850 may use the MSB of memory from the data structure to achieve an advantage outside the scope of known memory layout arrangements, which is discussed in further detail below.

Memory array 1850 depicts two instances of a memory arrangement 1854 and the remaining elements of back-end ADC and memory circuit (e.g., back-end ADC and memory circuit 115) in a 2 pixel configuration. In some embodiments, memory array 1850 may include, for example, two instances of a comparator and write control circuit 1852 (e.g., comparator 120 and write control circuit 130 including positive feedback circuit 131), as shown in FIG. 18C. In some embodiments, each pixel has an instance of comparator and write control circuit 1852 as well as 6-bit memory arrangement 1854 having D0-D5 in communication with bit lines B0-B5. In some embodiments, the MSB, D5, may be arranged such that it is directly coupled or indirectly coupled to a corresponding instance of write control circuit. In this manner, communication and wiring of State is relatively efficient to draw from memory array 1850 without modification of an alignment to memory arrangement 1854 in case of a memory with CMOS level output. This can achieve the technical effect of having a DPS imaging system that has lower power consumption, fast operation, and also allows for small pixel size in some types of memory devices.

FIG. 19 is a timing diagram 1900 of an exemplary operation of an Back-end ADC and memory circuit, in accordance with one or more embodiments. Timing diagram may be applied to each one of the circuits similar to those shown in FIG. 1, 15, or 16. In some embodiments, a circuit to which the timing diagram is applied may be the same as either one of the circuits as shown in FIG. 1, 15 or 16, except for such a circuit does not need to have state latch (e.g., state latch 140, 1540, 1640) and instead uses the most significant bit (MSB) of a ADC code as State (or State_n). Additionally, timing diagram 1900 may be applicable to data structures 1800 and 1820 of FIG. 18A, as well as memory array 1850 of FIG. 18C.

Timing diagram 1900 illustrates an example of an overlapped 3Q operation applying state control to a data structure of memory array 1850. For example, the MSB of a time code (e.g., the MSB of flag bit 1808, 1812, 1816) may be used as State to control initialization operation. Another flag bit may not be necessary for state control, but may be used to distinguish ADC1, ADC2, and ADC3 from each other. Operation and timing shown in timing diagram 1900 of FIG. 19 differs from timing diagram 1700 of FIG. 17 in that STATE_DATA (or ADC code <5>) in FIG. 19 is set to logical 0 throughout LCG ADC As shown in timing diagram 1900 of FIG. 19, MSB of a time code (or ADC code<5>) is used as STATE_DATA. STATE_DATA=0 may be kept in the last ADC operation (i.e., LCG ADC). In FIG. 19, STATE DATA in LCG ADC is set to logical 0.

In some embodiments, an auto-zero operation may be performed before every ADC operation. To perform the auto-zero operation, COMP_RST may be set to 1, (e.g., COMP_RST=1). In some embodiments, a comparator (e.g., comparator 120, 1520, 1620) may perform an initialization operation of setting COMP_SET to 1 (e.g., COMP_SET=1), which may release the positive feedback circuit (e.g., positive feedback circuit 131, 1531, 1631) from locked status, after each auto-zero operation. In some embodiments, the comparator (e.g., comparator 120, 1520, 1620) may perform an initialization operation setting COMP_SET_n to 0 (e.g., COMP_SET_n=0). During the time period when STATE_DATA is set to logical 1, a time code (i.e., ADC code) written to memory when the comparator is flipped may be retained for the remaining time during one ADC cycle. STATE_DATA (ADC code<5>) may be set to logical 1 while ADC code <4:0> increments from "100000" up to "101111." The comparator initializing operation, which is released from lock state and the ADC operation may be executed similar to that which is described above with respect to timing diagram 1700 of FIG. 17.

Timing diagram 1900 illustrates 3 cases:
Case 1—Output OutB flips one time;
Case 2—Output OutB flips two times; and
Case 3—Output OutB flips three times.

As seen in timing diagram 1900, for Case 1, at time t2, when output OutB (WL) is inverted from logical 1 to logical 0, State is kept at the same value as (ADC code<5> (i.e., the MSB of a time code when OutB is inverted). In the current ADC operation cycle starting at time t1 as shown in FIG. 19, if OutB(WL) is inverted from logical 1 to logical 0 during Time Stamp ADC, for example at time t2, when ADC code<5>=1 (i.e., the MSB=1) as shown by Case 1, a time code (i.e., ADC code) at time t2 is written to memory (e.g., ADC memory 150, 1550, 1650) and the MSB of the time code written to memory at time t2 is output from the memory as State, which is set to logical 1 (i.e., State=1). In some cases, setting State to logical 1 causes the comparator (e.g., comparator 120, 1520, 1620) and the positive feedback circuit (e.g., positive feedback circuit 131, 1531, 1631) to be turn to a locked state. Since State is kept at logical 1 (i.e., State=1) for the remaining time of the current cycle of the ADC operation, the ADC code stored in the memory is kept until the current cycle of the ADC operation has ended at time t9 even when COMP_SET turns to logical 1 before entering into HCG ADC or LCG ADC.

For cases 2 and 3, if OutB (WL) is inverted from logical 1 to logical 0 while ADC code<5>=0 during Time Stamp ADC, for example at time t3 as shown by Case 2 or at time t4 as shown by Case 3, then a time code (i.e., ADC code) at time t3 or at time t4 is written to memory (e.g., ADC memory 150, 1550, 1650) and State is set to logical 0 (i.e., State=0) because of ADC code<5>=0. Thus, in Case 2 or Case 3, when COMP_SET is set to logical 1 (or COMP_SET_n is set to logical 0) at time t5 just before HCG ADC has commenced, the initializing circuit (e.g., initializing circuit 132, 1532, 1632) turns the comparator (e.g., comparator 120, 1520, 1620) and the positive feedback circuit (e.g., positive feedback circuit 131, 1531, 1631) to an unlocked state and HCG ADC has commenced.

In Case 2, OutB(WL) is inverted from logical 1 to logical 0 during HCG ADC. For example, at time t7, when ADC code<5>=1, a time code (i.e., ADC code) at time t7 may be written to the memory (e.g., ADC memory 150, 1550, 1650) and State is set to logical 1 (i.e., State=1), which causes the comparator (e.g., comparator 120, 1520, 1620) and the positive feedback circuit (e.g., positive feedback circuit 131, 1531, 1631) to be turn to a locked state again. In Case 2, since State is kept to logical 1 (i.e., State=1) for the remaining time of the current cycle of the ADC operation, the ADC code stored in the memory during HCG ADC is kept until the current cycle of the ADC operation has ended at time t9 even when COMP_SET turns to logical 1 before entering into LCG ADC.

In Case 3, OutB(WL) is inverted from logical 1 to logical 0 during LCG ADC, for example at time t9. At time t9, STATE DATA=0, so data is —written to the memory (e.g., ADC memory 150, 1550, 1650) and State is set to logical 0 (i.e., State=0).

Figure 20:
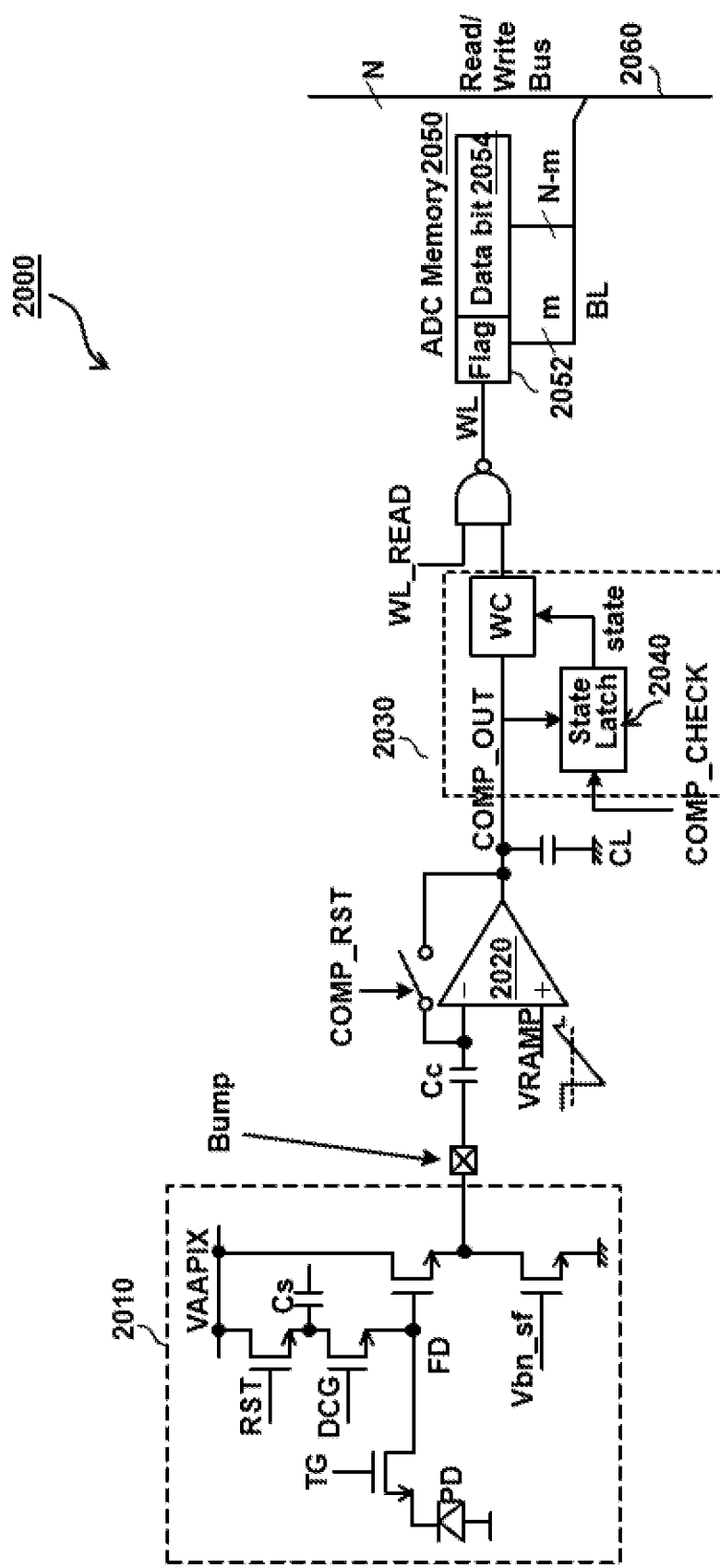
FIG. 20 is a schematic representation of an exemplary DPS image sensing system, in accordance with one or more embodiments.

FIG. 20 is a schematic representation of an exemplary DPS image sensing system 2000, in accordance with one or more embodiments. Any of the active pixels and their components, as described above, may be incorporated into DPS image sensing system 2000. In some embodiments, DPS image sensing system 2000 includes some similar features and components as that of DPS image sensing system 100A of FIG. 1A, and the previous descriptions may apply. In some embodiments, DPS image sensing system 2000 may be modified so as to include similar features and components as DPS image sensing system 100B of FIG. 1B, and the previous description may also apply. DPS image sensing system 2000 may encompass a small area while having a high density memory, which can improve efficiency and can be arranged easily. In some embodiments, write control may be performed with one latch circuit, even when many iterations of ADC are applied. In this manner, DPS image sensing system 2000 can provide a simple yet robust arrangement with an independently arranged comparator and memory area, providing an efficient usage of memory using a small footprint. Additionally, flexible combinations of a flag bit and ADC data can assign memory efficiently, as discussed in further detail below.

In some embodiments, DPS image sensing system 2000 includes an active pixel 2010, a comparator 2020, a write control circuit 2030 including a state latch 2040, and an ADC memory 2050 operatively coupled to a read/write data bus 2060. In some embodiments, active pixel 2010 includes an in-pixel lateral overflow integration capacitor (LOFIC). In some embodiments, active pixel 2010 may function similar to active pixel 210 of FIGS. 2A and 2B, and the previous description may apply. Active pixel 2010 may be configured for two-way charge transfer and complete charge transfer by way of an induced electron drift current, as discussed above. In some embodiments, active pixel 2010 includes a photodiode (PD), a transfer gate (TG), a floating diffusion node (FD), and one or more control transistors (e.g., RST, DCG, Vbn_sf). Active pixel 2010 may be referred herein interchangeably as a first layer sensor-on-chip (SOC) pixel, a first layer SOC active pixel, and/or an SOC active pixel.

In some embodiments, comparator 2020, write control circuit 2030, state latch 2040, and ADC memory 2050 may form a second layer application specific integrated circuit (ASIC) active pixel. The second layer ASIC active pixel may be referred to herein interchangeably as a second layer active pixel and/or a second layer ASIC pixel.

In some embodiments, write control circuit 2030 and/or state latch 2040 may facilitate state control for ADC memory 2050. As discussed in further detail below, DPS image sensing system 2000 may implement a novel write control scheme implemented on write control circuit 2030 for multiple ADC operations in DPS with small pixel area with efficient memory usage. For example, in some embodiments, state latch 2040 works independently from n-bit ADC memory 2050 and control comparator 2020 operation. Flag bit 2052 may be implemented as ADC ID. In some embodiments, flag big 2052 may be written in as a part of n-bit ADC memory 2050 combined with ADC data bit 2054.

In some embodiments, write control, implemented via write control circuit 2030, for multiple ADC operations may be applied in accordance with the following methodology:
(1) In a first case, where state=0 is output from state latch 2040, a write operation to write to memory (e.g., ADC memory 2050) may be activated, and data may be written via comparator 2020 flipping.
(2) In a second case, where state=1 is output from state latch 2040, a write operation may be disabled.

In some embodiments, state latch 2040 may operate in accordance with the following writing scheme:
(1) Initialize state to be state=0;
(2) Provide control signal COMP_CHECK as works window term for each ADC operation;
(3) Determine whether state=0 or state=1 based on comparator (e.g., comparator 2020) output during the window term;
(4) Once state turns to state=1, memory (e.g., ADC memory 2050) cannot be written and memory keeps the last ADC data; and
(5) Flag bit for ADC ID is combined with ADC data for each ADC operation.

As described herein, only 1 latch circuit (e.g., state latch 2040) is used to control multiple iterations of ADC operations and the latch circuit is effective in use for more iterations of the ADC operations. In some embodiments, flag bit 2052 may be flexibly combined with ADC data bit 2054 in ADC memory 2050 to obtain the most efficient memory usage. Furthermore, control signal COMP_CHECK may also be referred to herein interchangeably as "COMP_CHECK" and/or a comparator check signal.

ADC memory 2050 may include a word line (WL) and N bit-lines (BL) (e.g., bit line m thru bit line N-m), and the N-th bit line may operate as read/write data bus 2060. The structure of the word lines and the bit lines can depend on the type of memory implemented by DPS image sensing system 2000. For example, ADC memory 2050 may implement an SRAM memory structure such that the bit lines are differential pair of wires. In some embodiments, ADC memory 2050 may utilize a FLASH memory structure, a DRAM memory structure, a non-volatile memory device, a volatile memory, other types of solid state memory devices, and/or disk drive memory devices.

In some embodiments, an ADC operation may be executed as a write operation on ADC memory 2050. Write control circuit 2030 may control the word line WL based on an output of comparator 2020 (e.g., output COMP_OUT). Read/write data bus 2060 may provide counter data synchronized with a ramp waveform VRAMP. Counter data at the flipping of output COMP_OUT may be stored in ADC memory 2050. Written memory data can be read out and controlled by signal WL_READ.

In some embodiments, digital pixel sensors require efficient usage of physical area (e.g., on-chip space) for small pixel sizes. Multiple ADC operations with different sensitivities for an active pixel can be effective for high dynamic range. To save memory area, ADC data may be stored in memory (e.g., ADC memory 2050) with flag bit 2052 used as an identifier to distinguish each ADC operation. In some embodiments, a one bit state latch (e.g., state latch 2040) may be applied for efficient memory usage. State latch 2040 may be independently arranged in DPS image sensing system 2000 as a part of write control circuit 2030. Doing so can provide a robust architecture and improves over known memory writing schemes where flag bit memory is separated from data bit memory, and also can be used as part of write control circuit 2030.

Any one or more of the active pixels described by the embodiments from FIGS. 2A-14 may be implemented as an active pixel 2010 of FIG. 20 so long as appropriate modifications to the circuitry of DPS image sensing system 2000 are made as understood by those of ordinary skill in the art.

Figure 21:
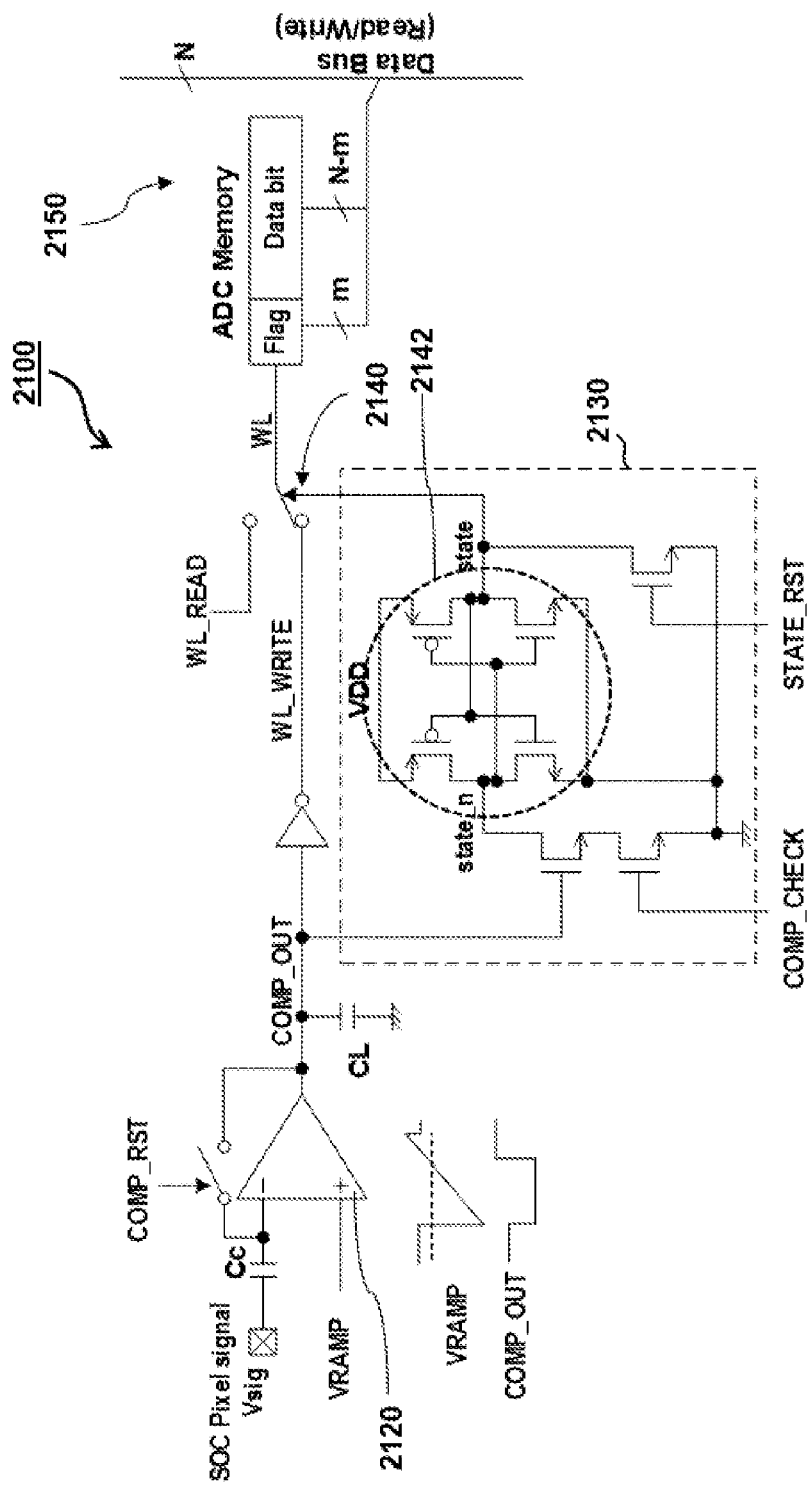
FIG. 21 is a schematic representation of an example system including a read/write control circuit and data memory, in accordance with one or more embodiments.

FIG. 21 is a schematic representation of an example DPS image sensing system 2100 including a write control circuit 2130 and data memory, in accordance with one or more embodiments. DPS image sensing system 2100 is an exemplary embodiment of DPS image sensing system 2000 of FIG. 20, and the previous description may apply. In some embodiments, write control circuit 2130 may include a state latch 2140 and one or more write control transistors 2142. Write control circuit 2130 may be initialized with a state of zero (e.g., state=0) by setting STATE_RST=1, and by having word line (WL) connected to WL_WRITE, a signal from COMP_OUT. In some embodiments, COMP_CHECK may be set to 1 (e.g., COMP_CHECK=1) and applied to determine whether COMP_OUT has flipped (e.g., COMP_OUT=1) or not (e.g., COMP_OUT=0) at the appropriate time during each ADC operation, which is discussed in further detail below.

Any one or more of the active pixels described by the embodiments from FIGS. 2A-14 may be implemented as an active pixel for DPS image sensing system 2100 of FIG. 21 so long as appropriate modifications to the circuitry of DPS image sensing system 2100 are made as understood by those of ordinary skill in the art.

Figure 22:
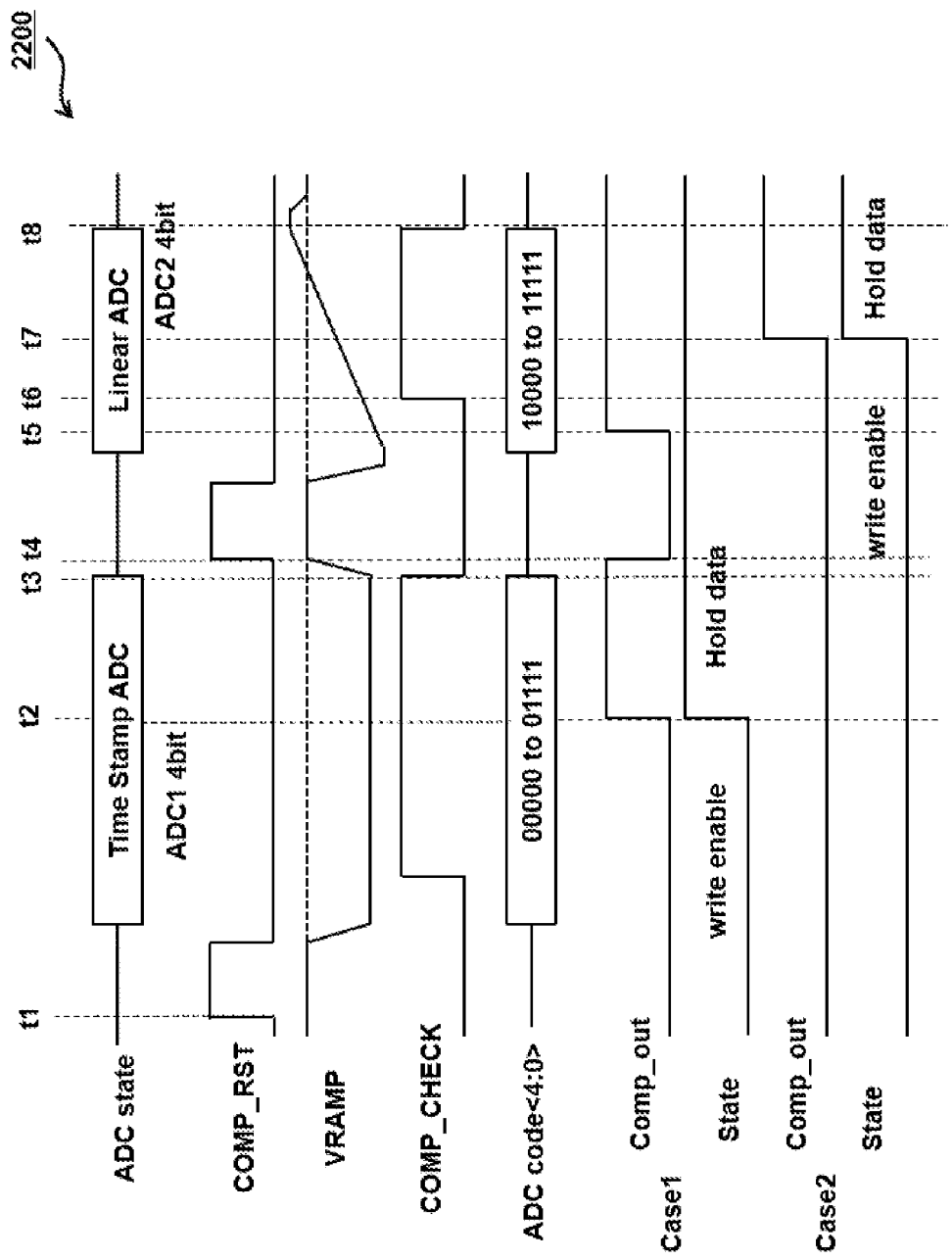
FIG. 22 is a timing diagram of an exemplary operation of an ADC, in accordance with one or more embodiments.

FIG. 22 is a timing diagram 2200 of an exemplary operation of an ADC, in accordance with one or more embodiments. Timing diagram 2200 may describe a 2Q ADC operation. For example, 5 bit memory may be assigned as 1 flag bit and 4 ADC data bits. In some embodiments, 2Q operation may be combined with a time stamp ADC and a linear ADC. This achieves the technical effect of making a readout operation and circuit less complex because state latch data is not necessary to perform the readout. Additionally, one memory bank combined flag bit and ADC data bit is readout. This facilitates an additional technical effect of improving small pixels when pixel size is restricted by wire number. The memory array is usually highly dense, and therefore simplifying the wiring scheme leads to smaller pixel size even if an additional state latch is required.

In timing diagram 2200, for case 1, COMP_CHECK=1 may be applied including timing of end on the time stamp ADC portion of the ADC cycle. When comparator 2120 is flipped during the first ADC of time stamp ADC, at time t2, the output of comparator 2120 becomes COMP_OUT=1 at the end of first ADC and a state value also become state=1. As shown by Case 1, any time may be used for COMP_CHECK up to and including COMP_CHECK=1 at the end of the first ADC, at time t3. The state of state=1 indicates that world line WL is connected to WL_READ. This means memory is not over written after state=1. At time t4, comparator 2120 flips from a logical 1 state to a logical 0 state, however State remains kept at a logical 1 state. Comparator 2120 flips again, at time t5, to a logical 1 state (e.g., COMP_OUT=1) during the linear ADC portion of the ADC operation. However, in case 1, State remains fixed at State=1 through the linear ADC portion till an end of the ADC operation at time t8.

In timing diagram 2200, for case 2, when comparator 2120 is not flipped during the first ADC of time stamp ADC, write control circuit 2130 keeps the state at state=0 and word line WL may be still connected to WL_WRITE. At time t7, during the linear ADC portion, comparator 2120 flips from a logical 0 to a logical 1 (e.g., COMP_OUT=1) and the state also flips to State=1. In some cases, memory can then be written during a next (e.g., subsequent) linear ADC.

Figures 23A, 23B, 23C:
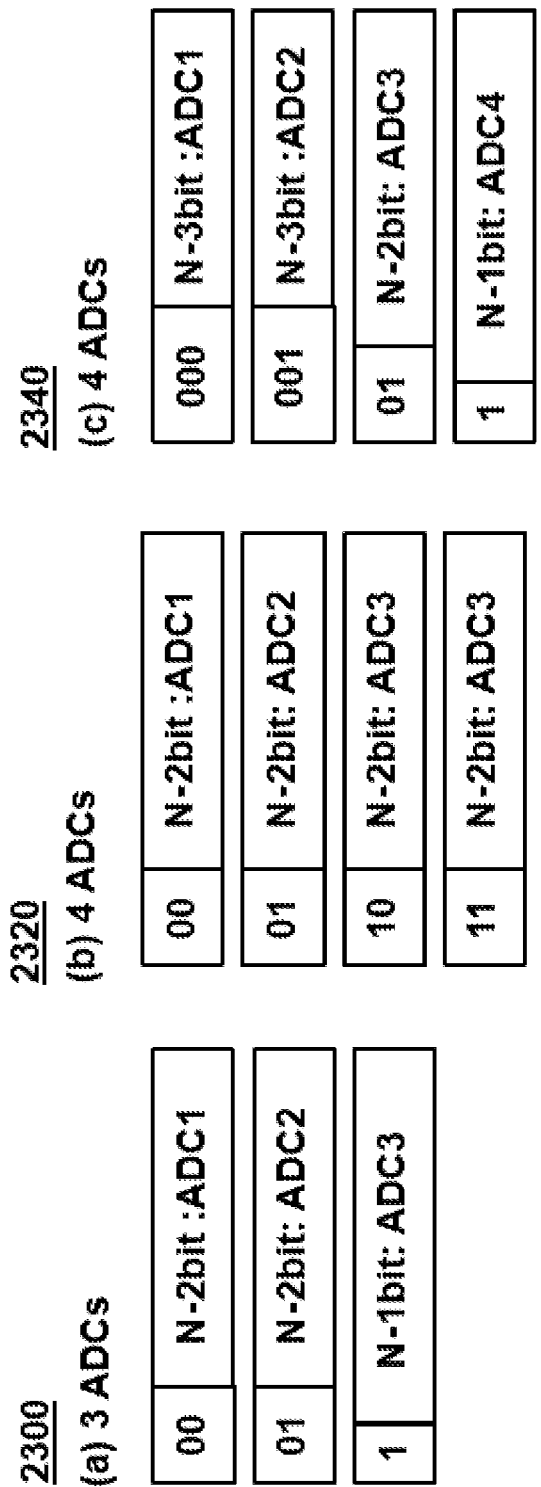
FIGS. 23A-23C are a schematic representations of exemplary data structures, in accordance with one or more embodiments.

FIGS. 23A-23C are a schematic representations of exemplary data structures 2300, 2320, and 2340, in accordance with one or more embodiments. Data structures 2300, 2320, and 2340 may represent an ADC data structure having a combination of flag bits and ADC data bits. Some embodiments include a four ADCs case, as illustrated by data structures 2320 and 2340 of FIGS. 23B and 23C, respectively. In some embodiments, three ADCs has less advantages than four ADC cases.

Data structure 2300 of FIG. 23A corresponds to a three ADCs case. In FIG. 23A, data structure 2300 may include 2 flag bits if the flag bit are independently arranged. The ADC data bit of the ADCs may become an N−2 bit in data structure 2300. In some embodiments, digital pixel sensor systems may enable 1.5 flag bit usage, illustrated by data structure 2300. Each flag bit may be assigned as "0 0" for ADC1, "0 1" for ADC2, and "1" for ADC3. Therefore, an N−1 bit may be assigned for ADC3. Accordingly, higher resolution is available for the same memory bit and one state latch for write control can be efficient given the physical area of the system. Still further, write control with one state latch improves the robustness and simplicity of the pixel structure, which in turn provides a significant technical advantage when increasing the number of ADC operations.

Data structures 2320 and 2340 of FIGS. 23B and 23C, respectively, illustrates examples of a use case including four ADCs. In data structures 2320, two (2) flag bits are equally assigned for each of the four ADC operations, and each resolution is an N−2 bit. In data structure 2340, a different flag bit and resolution scheme may be employed. For example, for higher resolution ADC operations (e.g., ADC4), a N−1 ADC data bit is available with 1 flag bit. As ADC4, in the example of data structure 2340, includes an N−1 ADC data bit and 1 flag bit, lower resolution ADC operations (e.g., ADC1 and ADC2) may be N−3 ADC data bits with 3 flag bits as trade off. This may allow data structure 2340 to still achieve higher resolution even when using one ADC, which may be advantageous for multiple ADC operations of a digital pixel sensor (e.g., sensing front-end circuit 112). The flexible flag bit arrangements of data structures 2320 and 2340 may impart a technical effect of improving memory usage efficiency.

Figure 24:
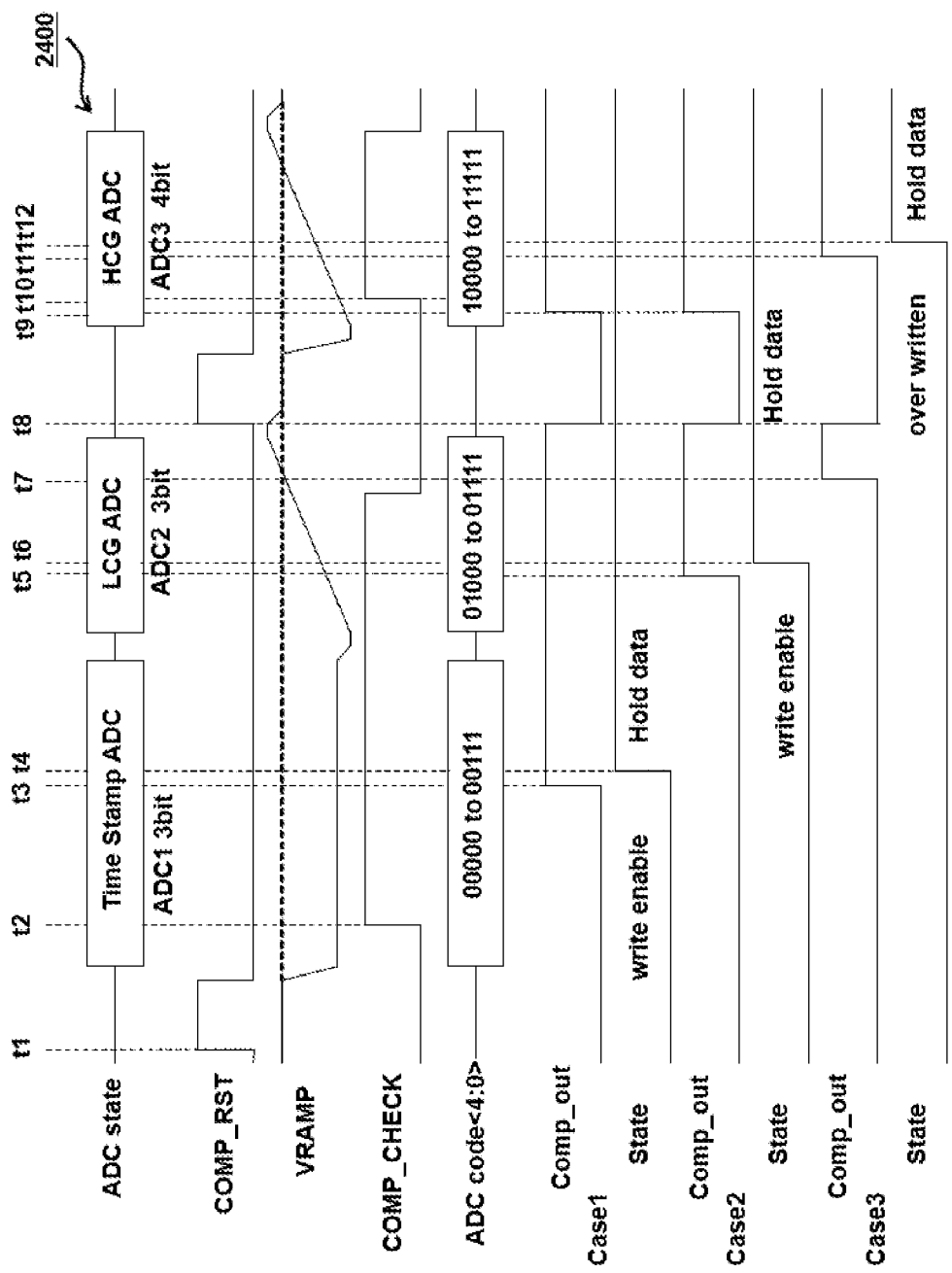
FIG. 24 is a timing diagram of an exemplary operation of an ADC, in accordance with one or more embodiments.

FIG. 24 is a timing diagram 2400 of an exemplary operation of an ADC, in accordance with one or more embodiments. In some embodiments, timing diagram 2400 describes three ADC quantization operations utilizing a write control circuit, such as write control circuit 2130 of FIG. 21. In timing diagram 2400, the ADC state includes a time stamp ADC operation and two linear ADC operations. In some embodiments, one of the two linear ADC operations may be configured for low conversion gain (LCG) and one of the two linear ADC operations may be configured for high conversion gain (HCG). The three ADC operations may be executed during one exposure period (e.g., a period of time with which a pixel of DPS image sensing system 2100 is exposed to incoming light). In some embodiments, as shown by the ADC code in timing diagram 2400, a 5 bit memory case may be implemented with the flag bits.

Timing diagram 2400 includes three use cases illustrating three different behaviors of comparator 2120. In the first case, "Case 1," large signal levels are present. In Case 1, the comparator (e.g., comparator 2120) flips, at time t3, during the first ADC operation (e.g., the Time Stamp ADC operation) from a logical 0 to a logical 1 (e.g., COMP_OUT=1). Subsequently, the state flips from State=0 to State=1. After the state becomes State=1, memory is not written to ADC memory 2150, and the first ADC data bit is kept throughout the duration of the ADC operations.

In the second case, "Case 2," signal levels of medium levels are present. In Case 2, the comparator (e.g., comparator 2120) flips, at time t5, during the second ADC operation (e.g., the LCG ADC operation) from a logical 0 to a logical 1 (e.g., COMP_OUT=1). Subsequently, the state flips from State=0 to State=1. Additionally, during the second ADC operation (e.g., the LCG ADC operation), when COMP_CHECK=1, the second ADC data bit is stored.

In the third case, "Case 3," low signal levels are present. In Case 3, the comparator (e.g., comparator 2120) flips, at time t7, during the second ADC operation from a logical 0 to a logical 1 (e.g., COMP_OUT=1). However, in Case 3, the state may be kept as State=0 because COMP_CHECK=0 when the comparator flips. COMP_CHECK=0 may be assigned for a very small signal term in the LCG ADC operation. Memory (e.g., ADC memory 2150) may be rewritten during the third ADC operation (e.g., the HCG ADC operation).

Figure 25:
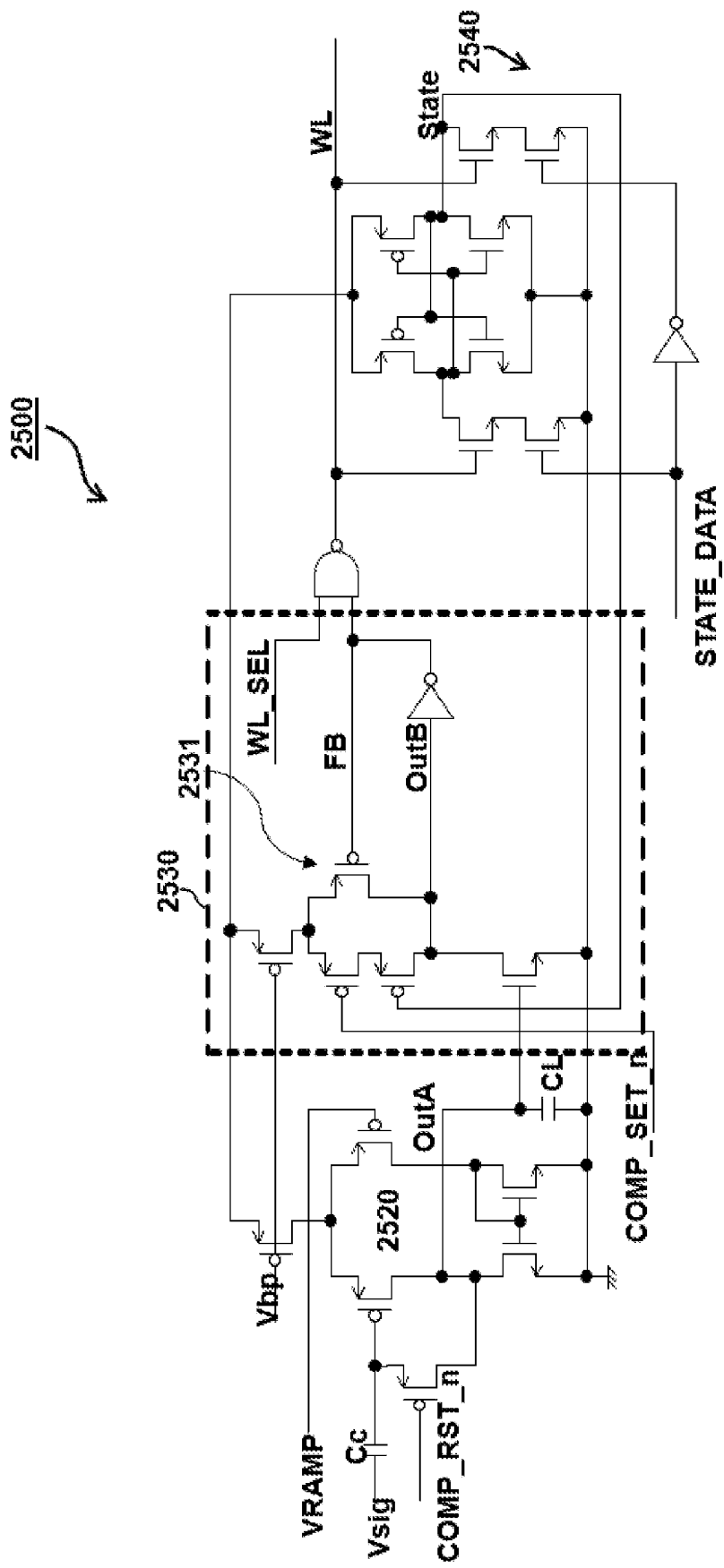
FIG. 25 is a schematic representation of an example system including a read/write control circuit and a state latch, in accordance with one or more embodiments.

FIG. 25 is a schematic representation of an example system 2500 including a comparator 2520, a write control circuit 2530, and a state latch 2540, in accordance with one or more embodiments. In some embodiments, one or more components of system 2500 may be included within DPS image sensing system 2000. Write control circuit 2530 include a positive feedback circuit 2531, outputting feedback signal FB. After positive feedback circuit 2531 flips FB from 0 to 1, FB=1 may be kept regardless of a value of output 'OutA' of comparator 2520. COMP_SET_n may then be set to 1 (e.g., COMP_SET_n=1) for an initialization operation so as to set OutB of write control circuit 2530 to 1 (e.g., OutB=1) and FB to 0 (e.g., FB=0).

In some embodiments, the initialization operation may be begin by setting State=0. When COMP_SET_n is also set to 1 (e.g., COMP_SET_n=0), initialization is completed as OutB become 1 (e.g., OutB=1). State latch 2540 may output 'State' to control the initialization operation, and comparator 2520 only works for State set to 0 (e.g., State=0).

In some embodiments, an operation of comparator 2520 may be:
(1) Perform an auto-zero operation with COMP_RST=1 with VRAMP of reset level;
(2) After COMP_RST becomes COMP_RST=0, the initialization operation is completed with COMP_SET_n=0 and with VRAMP at a start level. Additionally, OutB becomes OutB=1 when State=0 or OutB=0 when State=1;
(3) A ramp-up operation of VRAMP is performed in the former case and ADC data can be written to ADC memory when comparator 2520 flips. Additionally, OutB is kept at OutB=0 and data is not written to memory because word line WL=0.

In some embodiments, the switch controlled by COMP_SET_n between OutA and GND may be removed because OutA=0 (e.g., GND) can be set with a suitable VRAMP voltage after the auto-zero operation. OutB may become OutB=1 for COMP_SET_n=0 and State=0 is added with a suitable VRAMP voltage. In some embodiments, STATE_DATA may be connected to state latch 2540 and may be combined with two inverters through an nMOS transistor pair using a switch, as shown in FIG. 25. In this case, when comparator 2520 causes word line WL to turn from 1 to 0 (e.g., WL=1 to WL=0), the state node is fixed as State=STATE_DATA at the flipping of comparator 2520. ADC memory (e.g., ADC memory 2050) may also stores bit line data at a same time. STATE_DATA is intentionally controlled to be set to a suitable state.

Any one or more of the active pixels described by the embodiments from FIGS. 2A-14 may be implemented as an active pixel for DPS image sensing system 2500 of FIG. 25 so long as appropriate modifications to the circuitry of DPS image sensing system 2500 are made as understood by those of ordinary skill in the art.

Figure 26:
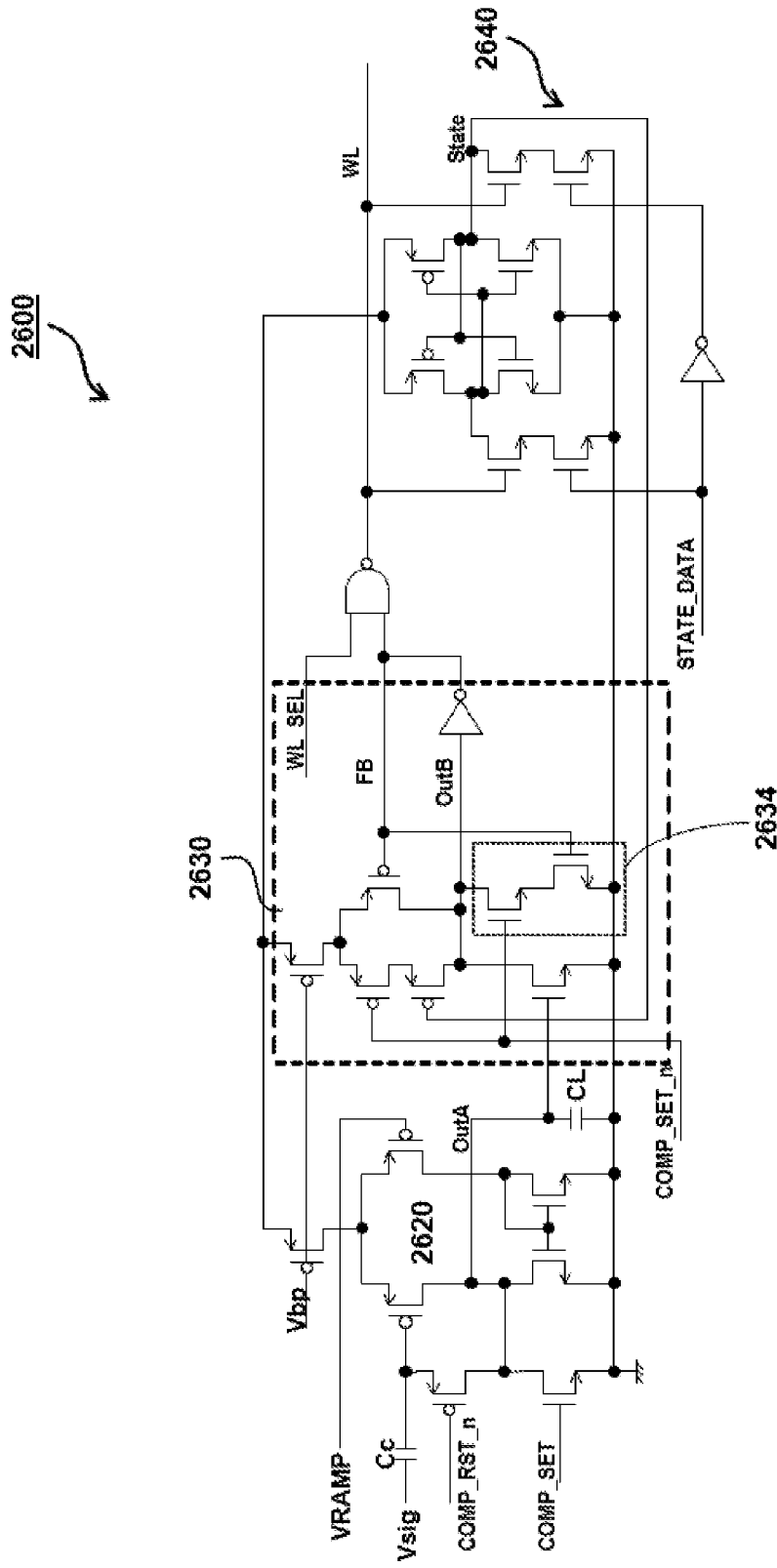
FIG. 26 is a schematic representation of an example system including a read/write control circuit and a state latch, in accordance with one or more embodiments.

FIG. 26 is a schematic representation of an example system 2600 including a comparator 2620, a write control circuit 2630, and a state latch 2640. In some embodiments, nMOS transistors 2634 may be added to write control circuit 2630, as compared to write control circuit 2530 of FIG. 25, as a CMOS structure for both the COMP_SET_n signal and the FB signal. In some embodiments, flipping of a positive feedback circuit of write control circuit 2630 can be accelerated with nMOS transistors 2634. An nMOS switch may also be added to write control circuit 2630 between OutA of comparator 2620 and ground (GND). This may prevent a large delay when performing an initialization of system 2600 for large values of capacitor CL.

Any one or more of the active pixels described by the embodiments from FIGS. 2A-14 may be implemented as an active pixel for system 2600 of FIG. 26 so long as appropriate modifications to the circuitry of DPS image sensing system 2600 are made as understood by those of ordinary skill in the art.

Figure 27:
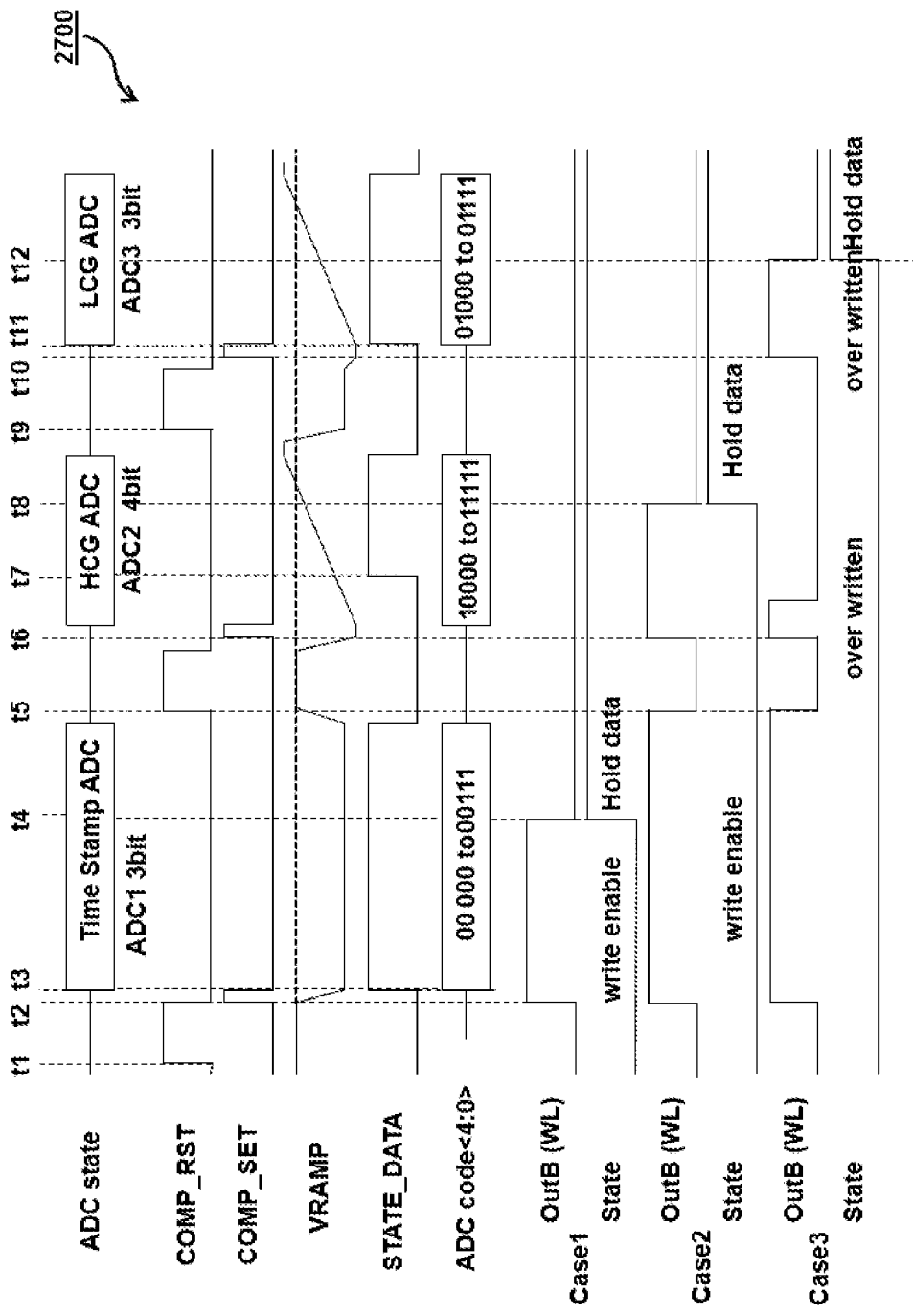
FIG. 27 is a timing diagram of an exemplary operation of an ADC, in accordance with one or more embodiments.

FIG. 27 is a timing diagram 2700 of an exemplary operation of an ADC, in accordance with one or more embodiments. In some embodiments, timing diagram 2700 may describe an overlapping three quantization operation, which may use comparator 2620 of FIG. 26. In some embodiments, the three quantization operation described by timing diagram 2700 is the same or similar to the three quantization operation described in timing diagram 2400 of FIG. 24, however, the order of the HCG ADC operation and the LCG ADC operation is reversed.

As seen in timing diagram 2700, during the HCG ADC operation, a dark signal for flipping for a high VRAMP voltage is desired to be store as HCG ADC data and a bright signal level for flipping for a low VRAMP voltage is desired to be overwritten by LCG ADC data. In timing diagram 2700, three use cases are presented: Case 1, Case 2, and Case 3. In Case 1, output OutB flip from a logical 0 to a logical 1 one time. In Case 2, output OutB flip from a logical 0 to a logical 1 two times. In Case 3, output OutB flips from a logical 0 to a logical 1 three times. The state may turn from 0 to 1 (e.g., state=0 to state=1) if STATE_DATA=1 when OutB flips from 1 to 0 (e.g., OutB=1 to OutB=0).

In some embodiments, the combination of a positive feedback circuit and a state latch structure (e.g., state latch 2640), as shown in FIGS. 25-26, may be versatilely applied. For example, comparator 2120 of FIG. 21 cannot perform the aforementioned operations, as state latch 2140 turns state to 1 (e.g., state=1) in response to detecting OutA=0 when COMP_CHECK=1. Data stored in the HCG ADC operation may be pre-flipped rather than overwriting data using the LCG ADC operation, however the flipping timing is inverted. Thus, DPS image sensing system 2100 employs a control scheme that can be problematic in this particular use case. On the other hand, system 2500 may be better suited for this particular case because the state signal of state latch 2540 is STATE_DATA when comparator 2520 flips, making system 2500 more flexible than DPS image sensing system 2100 for the aforementioned use case.

Figures 28A, 28B, 28C:
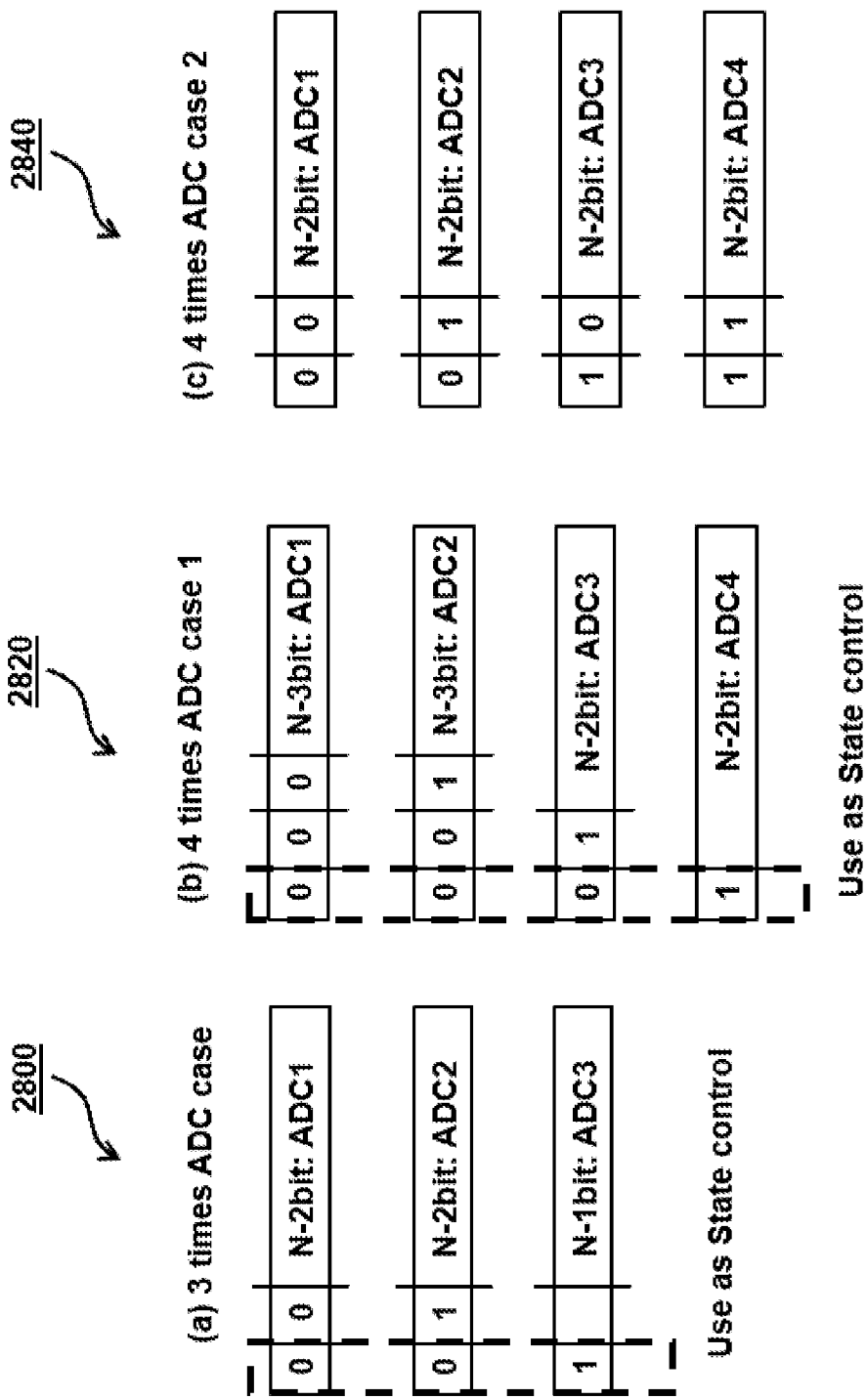
FIG. 28A-28C are schematic representations of exemplary data structures, in accordance with one or more embodiments.

FIG. 28A-28C are schematic representations of exemplary data structures 2800, 2820, and 2840, in accordance with one or more embodiments. Additionally described herein are one or more embodiments relate to a method for using data structures 2800, 2820, and/or 2840 to provide efficient memory usage for multiple ADC operations in a digital pixel sensor system. Data structures 2800, 2820, and 2840 are configured for use in a system having a pixel structure including: an active pixel with a photodiode, a comparator, an n-bit memory, a state latch for state control, or other components. For example, data structures 2800, 2820, and 2840 may be used with a DPS imaging sensing system, such as DPS image sensing system 2000. In some embodiments, data structures 2800, 2820, and 2840 may be configured for use in write control circuitry, such as write control circuit 130 of FIG. 1, write control circuit 2030 of FIG. 20, as well as other write control circuitries described herein. As discussed above, the circuitry of a state latch may work independently from memory and control comparator operations. In some embodiments, a flag bit in memory, which may be used as an ADC identifier, may be written in as a part of n-bit memory and combined with ADC data (e.g., ADC data bits).

Data structure 2800 of FIG. 28A may be configured for use in cases where three times ADC operations are performed. Data structures 2820 and 2840 may each be configured for use in cases where four ADC operations are performed. For many DPS systems, most area is consumed by the memory portion regardless of a type of memory being implemented (e.g., SRAM, DRAM, etc.). This can arise particularly in cases where multiple ADC operations are performed because each ADC operation requires at least an N-th bit of memory.

In some embodiments, write control circuitry (e.g., write control circuit 2030) used for multiple ADC operations may utilize data structure 2800, 2820, and/or 2840. In some embodiments, data structures 2800, 2820, and 2840 may combine flag bit and an ADC data bit. Data structure 2800, 2820, and 2840 provide efficient usage of memory by exhibiting flexibility for various resolution assignment. Using a combination of different length of the flag bit and the ADC data bit, different ADC resolutions can be applied for each ADC operation, imparting a technical effect of providing flexible communications of the flag bit and the ADC data bit, which can be assigned to memory in an efficient manner. Higher resolutions may be assigned to an N–1 ADC data bit regardless of how many ADC operations are performed. Additionally, using the most significant bit (MSB) for state control can save a number of memory bits that are used.

In some embodiments, data structure 2800 may enable a 1.5 flag bit to be used. For data structure 2800, a flag bit associated with a first ADC operation (e.g., ADC1) may be assigned a value "0 0," a flag bit associated with a second ADC operation (e.g., ADC2) may be assigned a value "0 1," and a flag bit associated with a third ADC operation (e.g., ADC3), may be assigned a value "1." Data structure 2800 enables N–1 bits to be assigned for the last ADC operation (e.g., ADC3), allowing higher resolution to be available on same memory bit. In some embodiments, one state latch may be included for write control while also being area efficient. Some embodiments may include two flag bits and a logic circuit for one write control signal. In some embodiments, write control circuitry with one state latch allows for a simplified pixel structure simple having improved efficient for increased amounts of ADC operations.

In some embodiments, data structure 2820 includes four ADC operations. For data structure 2820, a flag bit associated with a first ADC operation (e.g., ADC1) may be assigned a value "0 0 0," a flag bit associated with a second ADC operation (e.g., ADC2) may be assigned a value "0 0 1," a flag bit associated with a third ADC operation (e.g., ADC3) may be assigned a value "0 1," and a flag bit associated with a fourth ADC operation (e.g., ADC4) may be assigned a value "1." Data structure 2820 includes a 3 bit flag bit for the first and second ADC operations, a 2 bit flag bit for the third ADC operation, and a 1 bit flag bit for the fourth ADC operation. Additionally, the ADC data bit may be N–3 bits for the first and second ADC operations, and N–2 bits for the third and fourth ADC operations.

In some embodiments, data structure 2840 includes four ADC operations, and each resolution (e.g., a resolution of each ADC operation), may be N–2 bits. For data structure 2840, a flag bit associated with a first ADC operation (e.g., ADC1) may be assigned a value "0 0," a flag bit associated with a second ADC operation (e.g., ADC2) may be assigned a value "0 1," a flag bit associated with a third ADC operation (e.g., ADC3) may be assigned a value "1 0," and a flag bit associated with a fourth ADC operation (e.g., ADC4) may be assigned a value "1 1."

If flag bit is assigned, as in data structures 2820 and 2840, a most significant bit can be used as a state signal. For example, the most significant bit of the last ADC operation stored by data structure 2820 is "1." The most significant bit of each of the other ADC operations stored by data structure 2820 is "0." Data structures 2820 and 2840 allow for a flexible flag bit arrangement, which imparts a technical effect of improve an efficiency of memory usage by the digital pixel sensing system.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the description provided above provides detail for the purpose of illustration based on what is currently considered to be the most practical and preferred embodiments, it is to be understood that such detail is solely for that purpose and that the disclosure is not limited to the expressly disclosed embodiments, but, on the contrary, is intended to cover modifications and equivalent arrangements that are within the spirit and scope of the appended claims. For example, it is to be understood that the present disclosure contemplates that, to the extent possible, one or more features of any embodiment can be combined with one or more features of any other embodiment.

Additional example embodiments are provided with reference to the following enumerated embodiments:

A1. A back-end analog-to-digital conversion (ADC) and memory circuit, the back-end ADC and memory circuit comprising: a comparator operatively coupled to an active pixel and configured to receive an output of the active pixel; a write control circuit; an ADC memory operatively coupled to the write control circuit; and a state latch operatively coupled to the write control circuit, the state latch being configured to control whether writing to the ADC memory is enabled or disabled.

A2. The back-end ADC and memory circuit of embodiment A1, wherein ADC operations are controlled using the state latch.

A3. The back-end ADC and memory circuit of embodiment A2, wherein the state latch is configured to output a one bit Boolean control signal to control the ADC operations.

A4. The back-end ADC and memory circuit of any one of embodiments A1-A3, wherein the ADC operations comprise at least one of a time stamp ADC operation, a high conversion gain ADC operation, or a low conversion gain ADC operation.

A5. The back-end ADC and memory circuit of any one of embodiments A1-A4, wherein a control signal output from the state latch controls whether the writing to the ADC memory is enabled or disabled by flipping a word line operatively coupled to the ADC memory.

A6. The back-end ADC and memory circuit of any one of embodiments A1-A5, wherein the write control circuit comprises: a positive feedback circuit configured to receive an output from the comparator as a first input and an output of the positive feedback circuit as a second input.

A7. The back-end ADC and memory circuit of embodiment A6, wherein the positive feedback circuit comprises an inverter.

A8. The back-end ADC and memory circuit of any one of embodiments A1-A7, wherein the write control circuit comprises: an initializing circuit comprising a pair of transistors, the pair of transistors being configured to function as a NAND gate.

A9. The back-end ADC and memory circuit of any one of embodiments A7-A8, wherein the positive feedback circuit is in a locked state when the output of the positive feedback circuit is a first value.

A10. The back-end ADC and memory circuit of embodiment A9, wherein the first value comprises a logical 0 or a logical 1.

A11. The back-end ADC and memory circuit of embodiment A8-A10, wherein the initializing circuit is configured to release the locked state of the positive feedback circuit using a control signal output from the state latch.

A12. The back-end ADC and memory circuit of any one of embodiments A1-A10, wherein the write control circuit comprises: a positive feedback circuit comprising a first transistor associated with an output of the comparator and a second transistor associated with an output of the positive feedback circuit; and an initializing circuit comprising a transistor pair formed of a third transistor and a fourth transistor.

A13. The back-end ADC and memory circuit of embodiment A12, wherein: for a logical state of a gate of the first transistor or a logical state of a gate of the second transistor being high, an output of the write control circuit is a first value; and for a logical state of a gate of the third transistor and a logical state of a gate of the fourth transistor being both low, the output of the write control circuit is a second value.

A14. The back-end ADC and memory circuit of any one of embodiments A12-A13, wherein: for a logical state of a gate of the third transistor or a logical state of a gate of the fourth transistor being high, an output of the write control circuit is a first value; or for the logical state of the gate of the third transistor and the logical state of the gate of the fourth transistor being both low, the output of the write control circuit is a second value.

A15. The back-end ADC and memory circuit of any one of embodiments A13-A14, wherein the first value comprises a logical 1 and the second value comprises a logical 0; or the first value comprises a logical 0 and the second value comprises a logical 1.

A16. The back-end ADC and memory circuit of any one of embodiments A1-A15, wherein the write control circuit comprises a read/write control circuit configured to perform read operations.

A17. An imaging system, comprising: the active pixel; and the back-end ADC and memory circuit of any one of embodiments A1-A16.

A18. The imaging system of embodiment A16, wherein the comparator is operatively coupled to the active pixel.

B1. An imaging system, comprising: an active pixel; a comparator operatively coupled to the active pixel and configured to receive an output of the active pixel; and a back-end ADC analog-to-digital conversion (ADC) and memory circuit operatively coupled to the active pixel, the back-end ADC and memory circuit comprising: a read/write control circuit; an ADC memory operatively coupled to a read/write data bus and to the read/write control circuit; and a state latch operatively coupled to the read/write control circuit and the ADC memory.

B2. The imaging system of embodiment B1, wherein the read/write control circuit comprises: a NAND gate operatively coupled to the state latch; a NOR gate operatively coupled to the comparator; and a switch configured to couple the NAND gate and the NOR gate, wherein: the NAND gate takes, as input, a first signal output from the state latch and a second signal for setting the read/write control circuit, and the NOR gate takes, as input, a comparator output signal output from the comparator and a NAND output signal output by the NAND gate.

B3. The imaging system of embodiment B2, further comprising: an inverter device operatively coupled to the NOR gate and the ADC memory such that the inverter device causes a value of an output of the NOR gate to be inverted.

B4. The imaging system of embodiment B3, wherein to begin an analog-to-digital conversion process, the second signal is set to a first value, causing the switch to couple the NAND gate and the NOR gate, and the comparator output signal has an output value.

B5. The imaging system of any one of embodiments B3-B4, wherein: responsive to the first signal being set to a second value: an output of the NAND gate has a value of zero and the output of the NOR gate has a value of one, and the comparator is (i) initialized by a node at an output of the inverter device having a value of zero and (ii) causes the second signal to have a value of zero.

B6. The imaging system of embodiment B4, wherein the first value is a logical 1 or a logical 0, the second value is a logical 0 or a logical 1, respectively, and the output value is zero.

B7. The imaging system of any one of embodiments B3-B6, wherein responsive to the first signal being set to a value of zero, a node at an output of the inverter device is held at a value of one after the second signal is set to have a value of zero.

B8. The imaging system of any one of embodiments B3-B7, wherein data is written to ADC memory by the comparator responsive to the first signal being set to a value of one.

B9. The imaging system of any one of embodiments B3-B8, wherein an auto-zero operation is performed to the comparator by setting a comparator reset signal to have a value of one, wherein the comparator takes, as input, (i) the comparator reset signal or the output of the active pixel, and (ii) a ramping voltage set at a reset level.

B10. The imaging system of embodiment B9, wherein the auto-zero operation is performed prior to each ADC operation by setting the comparator rest signal to have a value of one.

B11. The imaging system of any one of embodiments B9-B10, wherein an initialization operation is performed to the comparator subsequent to the auto-zero operation, wherein the initialization operation comprises a node at an output of the inverter device turning, responsive to the second signal being set to a value of value, from a value of one to a value of zero.

B12. The imaging system of embodiment B11, wherein the node at the output of the inverter has the value of zero for the first signal output from the state latch being set to the value of one, and the node at the output of the inverter being kept at the value of one for the first signal output from the state latch being set to the value of zero.

B13. The imaging system of any one of embodiments B3-B12, further comprising: a pair of nMOS transistor operatively coupled to the state latch.

B14. The imaging system of any one of embodiments B3-B13, wherein the read/write control circuit further comprises nMOS transistors, wherein the nMOS transistors increase a speed with which a value of a node at an output the inverter device switches.

B15. The imaging system of any one of embodiments B1-814, wherein a data structure used to store data in the ADC memory comprises a flag bit configured used for state control of the back-end ADC and memory circuit.

C1. A back-end analog-to digital conversion (ADC) and memory circuit, comprising: a read/write control circuit; an ADC memory operatively coupled to a read/write data bus and to the read/write control circuit; a state latch operatively coupled to the read/write control circuit and the ADC memory, wherein the back-end ADC and memory circuit is operatively coupled to a comparator configured to receive an output of an active pixel, wherein the read/write control circuit comprises: a NAND gate operatively coupled to the state latch, a NOR gate operatively coupled to the comparator, and a switch configured to couple the NAND gate and the NOR gate, wherein: the NAND gate takes, as input, a first signal output from the state latch and a second signal for setting the read/write control circuit, and the NOR gate takes, as input, a comparator output signal output from the comparator and a NAND output signal output by the NAND gate; and an inverter device operatively coupled to the NOR gate and the ADC memory such that the inverter device causes a value of an output of the NOR gate to be inverted.

C2. The back-end ADC and memory circuit of embodiment C1, wherein to begin an analog-to-digital conversion process, the second signal is set to a value of one, causing the switch to couple the NAND gate and the NOR gate, and the comparator output signal output to have a value of zero.

C3. The back-end ADC and memory circuit of any one of embodiments C1-C2, wherein: responsive to the first signal being set to a value of one: an output of the NAND gate has a value of zero and the output of the NOR gate has a value of one, and the comparator is (i) initialized by a node at an output of the inverter device having a value of zero and (ii) causes the second signal to have a value of zero.

C4. The back-end ADC and memory circuit of any one of embodiments C1-C3, wherein responsive to the first signal being set to a value of zero, a node at an output of the inverter device is held at a value of one after the second signal is set to have a value of zero.

C5. The back-end ADC and memory circuit of any one of embodiments C1-C4, wherein: an auto-zero operation is performed to the comparator by setting a comparator reset signal to have a value of one, the comparator takes, as input, (i) the comparator reset signal or the output of the active pixel, and (ii) a ramping voltage set at a reset level; and the auto-zero operation is performed prior to each ADC operation by setting the comparator rest signal to have a value of one.

C6. The back-end ADC and memory circuit of any one of embodiments C1-C5, wherein the node at the output of the inverter has the value of zero for the first signal output from the state latch being set to the value of one, and the node at the output of the inverter being kept at the value of one for the first signal output from the state latch being set to the value of zero.

D1. An active pixel for use in a digital pixel sensor (DPS) imaging system having complete intra-pixel charge transfer functionality, comprising: a first photodiode; a first transfer gate operatively coupled to the first photodiode; and a second transfer gate operatively coupled to the first photodiode, wherein the first transfer gate and the second transfer gate reside at opposite sides of the first photodiode, wherein: an electron drift current within the first photodiode causes two direction charge transfer of charge of the first photodiode to the first transfer gate and the second transfer gate.

D2. The active pixel of embodiment D1, wherein: an electron flow corresponding to the electron drift current is directed from a first side of the first photodiode to a second side of the first photodiode; and the first transfer gate and the second transfer gate are located on the second side of the first photodiode.

D3. The active pixel of any one of embodiments D1-D2, wherein the first transfer gate and the second transfer gate include an active layer intersecting a poly layer and a charge well layer configured as a floating diffusion layer.

D4. The active pixel of any one of embodiments D1-D3, further comprising: a first floating diffusion node operatively coupled to the first transfer gate; and a second floating diffusion node operatively coupled to the second transfer gate.

D5. The active pixel of any one of embodiments D1-D3, further comprising: a floating diffusion node operatively coupled to the first transfer gate; and a drain operatively coupled to the second transfer gate and configured to receive charge output by the second transfer gate.

D6 The active pixel of any one of embodiments D1-D5, wherein the electron drift current is generated in response to an electric field being applied to the active pixel based on an impurity concentration gradient of the first photodiode.

D7. The active pixel of any one of embodiments D1-D3 and D6, further comprising: a second photodiode; a third transfer gate operatively coupled to the second photodiode; and a fourth transfer gate operatively coupled to the second photodiode, wherein the third transfer gate and the fourth transfer gate reside at opposite sides of the second photodiode, wherein: an electron drift current within the second photodiode causes two direction charge transfer of charge of the second photodiode to the third transfer gate and the fourth transfer gate.

D8. The active pixel of embodiment D7, wherein: the electron drift current is directed from a first side of the second photodiode to a second side of the second photodiode; a direction of the electron drift current within the first photodiode is opposite of a direction of the electron drift current within the second photodiode, the third transfer gate and the fourth transfer gate are located on the second side of the second photodiode.

D9. The active pixel of any one of embodiments D7-D8, wherein the third transfer gate and the fourth transfer gate reside at asymmetrically opposite sides of the second photodiode.

D10. The active pixel of embodiment D8-D9, further comprising: a first floating diffusion node operatively coupled to the first transfer gate and the third transfer gate; and a second floating diffusion node operatively coupled to the second transfer gate and the fourth transfer gate.

D11. The active pixel of embodiment D8-D9, further comprising: a first floating diffusion node operatively coupled to the first transfer gate and the third transfer gate; and a drain operatively coupled to the second transfer gate and the fourth transfer gate.

D12. The active pixel of embodiments D7-D8, further comprising: a third photodiode; a fourth photodiode; a fifth transfer gate operatively coupled to the third photodiode; a sixth transfer gate operatively coupled to the third photodiode; a seventh transfer gate operatively coupled to the fourth photodiode; and an eighth transfer gate operatively coupled to the fourth photodiode, wherein the fifth transfer gate and the sixth transfer gate reside at opposite sides of the third photodiode, and the seventh transfer gate and the eighth transfer gate reside at opposite sides of the fourth photodiode.

D13. The active pixel of embodiment D12, wherein the fifth transfer gate and the sixth transfer gate reside at asymmetrically opposite sides of the third photodiode.

D14. The active pixel of any one of embodiments D12-D13, wherein the seventh transfer gate and the eighth transfer gate reside at asymmetrically opposite sides of the fourth photodiode.

D15. The active pixel of any one of embodiments D11-D14, wherein an electron flow corresponding to the electron drift current within the third photodiode causes two direction charge transfer of charge of the third photodiode to the fifth transfer gate and the sixth transfer gate, and an electron drift current within the fourth photodiode causes two direction charge transfer of charge of the fourth photodiode to the seventh transfer gate and the eighth transfer gate.

D16. The active pixel of any one of claims D11-D15, further comprising: a first drain operatively coupled to the first transfer gate of the first photodiode and the third transfer gate of the second photodiode; a second drain operatively coupled to the sixth transfer gate of the third photodiode and the eighth transfer gate of the fourth photodiode; and a floating diffusion node operatively coupled to the second transfer gate of the first photodiode, the fourth transfer gate of the second photodiode, the fifth transfer gate of the third photodiode, and the seventh transfer gate of the fourth photodiode.

D17. The active pixel of any one of claims D11-D15, further comprising: a first floating diffusion node operatively coupled to the first transfer gate of the first photodiode and the third transfer gate of the second photodiode; a second floating diffusion node operatively coupled to the second transfer gate of the first photodiode, the fourth transfer gate of the second photodiode, the fifth transfer gate of the third photodiode, and the seventh transfer gate of the fourth photodiode; and a third floating diffusion node operatively coupled to the sixth transfer gate of the third photodiode and the eighth transfer gate of the fourth photodiode.

D18. The active pixel of any one of embodiments D1-D17, wherein: the electron drift current causes the two direction charge transfer of charge of the first photodiode to the first transfer gate and the second transfer gate; and the electron drift current is formed in response to an electric field being generated within the first photodiode.

D19. The active pixel of embodiment D15, wherein the first photodiode comprises a first layer and a second layer and the electric field is generated within the first photodiode based on the first photodiode having an impurity concentration gradient resulting from the first layer and the second layer each having different impurity concentrations.

D20. The active pixel of embodiment D19, wherein: the first photodiode comprises at least one additional layer having a different impurity concentration than the first layer and the second layer; and a magnitude and a direction of the electric field is adjusted based on a number of layers that the first photodiode includes.

D21. The active pixel of any one of embodiments D1-D20, wherein the first photodiode is a two-way charge transfer photodiode.

D22. The active pixel of any one of embodiments D1-D21, wherein the active pixel implements backside illumination and a pinned-photodiode.

D23. The active pixel of any one of embodiments D1-D20, wherein a time of flight (ToF) measurement is determined using the active pixel.

D24. The active pixel of any one of embodiments D1-D23, wherein the first transfer gate and the second transfer gate reside at asymmetrically opposite sides of the first photodiode.

D25. A digital pixel sensor (DPS) imaging system for complete intra-pixel charge transfer functionality, the DPS imaging system comprising: one or more active pixels, wherein each of the one or more active pixels comprises the active pixel of any one of embodiments D1-D24.

D26. The DPS imaging system of claim D25, further comprising: a capacitor operatively coupled to the second floating diffusion node or the drain.

E1. An application specific integrated circuit (ASIC) active pixel comprising: a comparator configured to receive an output of the photodiode of the SOC active pixel; a read/write control circuit operatively coupled to the comparator and a state latch, the read/write control circuit being configured to: receive an output from the comparator, and determine whether to a read operation or a write operation is to be executed based on the output from the comparator and a state of the state latch; and analog-to-digital conversion (ADC) memory operatively coupled to the read/write control circuit and a read/write data bus.

E2. The ASIC active pixel of embodiment E1, wherein: the ADC memory comprises a word line and a plurality of bit lines; and the read/write control circuit is configured to control the word line based on the output from the comparator.

E3. The ASIC active pixel of any one of embodiments E1-E2, wherein, during initialization of the ASIC active pixel: a reset signal is used to initialize a state of the state latch to zero; and a word line is configured to couple the ADC memory to a word line write connection, the word line write connection having a value based on the output from the comparator.

E4. The ASIC active pixel of any one of embodiments E1-E3, wherein, during each analog-to-digital conversion (ADC) operation, a comparator check signal is applied to the output of the comparator to determine whether the comparator flipped from a value of one to a value of zero or from a value of zero to a value of one.

E5. The ASIC active pixel of any one of embodiments E1-E4, wherein for the comparator flipping during a first analog-to digital conversion (ADC) operation: a comparator check signal having a value of one is applied to the read/write control circuit at an end of a first ADC operation, a value of a state of the state latch is one; and a word line of the ADC memory is connected to a word line read connection such that data is not overwritten in the ADC memory.

E6. The ASIC active pixel of any one of embodiments E1-E5, wherein: the comparator does not flips during a first analog-to digital conversion (ADC) operation, a value of a state of the state latch is kept at zero; and a word line of the ADC memory is connected to a word line write connection such that data is written to the ADC memory during a second ADC operation.

E7. The ASIC active pixel of any one of embodiments E1-E6, wherein the ADC memory comprises a five bit memory having one flag bit and four bit ADC data.

E8. The ASIC active pixel of any one of embodiments E1-E7, wherein, for three ADC operations, the ADC memory comprises 1.5 flag bits.

E9. The ASIC active pixel of embodiment E8, wherein: a flag bit for a first ADC operation of the three ADC operations is assigned a value of 00; a flag bit for a second ADC operation of the three ADC operations is assigned a value of 01; a flag bit for a third ADC operation of the three ADC operations is assigned a value of 1; the ADC memory comprises N−2 bits of ADC data for the first ADC operation and the second ADC operation; and the ADC memory comprises N−1 bits of ADC data for the third ADC operation.

E10. The ASIC active pixel of any one of embodiments E1-E7, wherein, for four ADC operations, the ADC memory comprises 2 flag bits and N−2 bits of ADC data for each of the four ADC operations.

E11. The ASIC active pixel of any one of embodiments E1-E7, wherein, for four ADC operations, the ADC memory comprises: 3 flag bits and N−3 bits of ADC data for a first ADC operation and a second ADC operation; 2 flag bits and N−2 bits of ADC data for a third ADC operation; and 1 flag bit and N−1 bits of ADC data for a fourth ADC operation.

E12. The ASIC active pixel of any one of embodiments E1-E11, wherein: data provided by the read/write data bus is synchronized with a waveform of a ramp function provided as input to the comparator; and the data is stored in the ADC memory based on the output of the comparator flipping.

E13. The ASIC active pixel of any one of embodiments E1-E12, wherein ADC data is stored in the ADC memory, the ADC data comprising one or more flag bits configured to be used as an identifier for each ADC operation performed.

E14. The ASIC active pixel of any one of embodiments E1-E13, wherein the ASIC active pixel is operatively coupled to a system on chip (SOC) active pixel comprising one or more photodiodes.

E15. An imaging system, comprising the ASIC active pixel of any one of embodiments E1-E14.

E16. An analog-to-digital conversion (ADC) circuit, comprising the ASIC active pixel of any one of embodiments E1-E14.

E17. A digital pixel sensing (DPS) imaging system, comprising the ASIC active pixel of any one of embodiments E1-E14.

F1. An imaging system, comprising: an active pixel comprising a photodiode; a comparator operatively coupled to the active pixel and configured to receive an output of the photodiode; a read/write control circuit operatively coupled to the comparator and comprising a state latch, the read/write control circuit being configured to receive an output from the comparator; and analog-to-digital conversion (ADC) memory operatively coupled to the read/write control circuit, wherein a data structure is stored in the ADC memory, the data structure being configured to store one or more flag bits for identifying each ADC operation performed and one or more ADC data bits.

F2. The imaging system of embodiment F1, wherein the state latch is configured to operate independently of the ADC memory and control operations of the comparator.

F3. The imaging system of any one of embodiments F1-F2, wherein: a write operation to write data to the ADC memory is activated for a state of the state latch having a value of zero; and the data is written to the ADC memory responsive to the output of the comparator flipping.

F4. The imaging system of any one of embodiments F1-F3, wherein a write operation is disabled for a state of the state latch having a value of one.

F5. The imaging system of any one of embodiments F1-F4, wherein the one or more flag bits and the one or more ADC data bits are flexibly arranged such that different amounts of flag bits and ADC data bits are capable of being stored by the data structure.

F6. The imaging system of any one of embodiments F1-F5, wherein: a most significant bit of the one or more flag bits is used as a state signal for the state latch; and for the most significant bit of a last ADC operation having a value of one, the most significant bit of each other ADC operation has a value of zero.

F7. The imaging system of any one of embodiments F1-F6, wherein the read/write control circuit is further configured to: determine whether a read operation or a write operation is to be executed based on the output from the comparator and a state of the state latch.

F8. The imaging system of any one of embodiments F1-F7, wherein the ADC memory comprises a five bit memory, the one or more flag bits comprise one flag bit and the one or more ADC data bits comprise four ADC data bits.

F9. The imaging system of any one of embodiments F1-F8, wherein, for three ADC operations, the one or more flag bits comprise 1.5 flag bits.

F10. The imaging system of embodiment F9, wherein: a flag bit for a first ADC operation of the three ADC operations is assigned a value of 00; a flag bit for a second ADC operation of the three ADC operations is assigned a value of 01; a flag bit for a third ADC operation of the three ADC operations is assigned a value of 1; the one or more ADC data bits comprise: N−2 bits of ADC data for the first ADC operation and the second ADC operation; and N−1 bits of ADC data for the third ADC operation.

F11. The imaging system of any one of embodiments F1-F8, wherein, for four ADC operations, the one or more flag bits comprise 2 flag bits and the one or more ADC data bits comprise N−2 bits of ADC data for each of the four ADC operations.

F12. The imaging system of any one of embodiments F1-F8, wherein: for a first ADC operation and a second ADC operation of four ADC operations, the one or more flag bits comprise 3 flag bits and the one or more ADC data bits comprise N−3 bits of ADC data; for a third ADC operation of the four ADC operations, the one or more flag bits comprise 2 flag bits and the one or more ADC data bits comprise N−2 bits of ADC data; and for a fourth ADC operation of the four ADC operations, the one or more flag bits comprise 1 flag bit and the one or more ADC data bits comprise N−1 bits of ADC data.

G1. An analog-to-digital conversion (ADC) circuit, comprising: a read/write control circuit comprising a state latch, the read/write control circuit being configured to receive an output from a comparator; and analog-to-digital conversion (ADC) memory operatively coupled to the read/write control circuit, wherein a data structure is stored in the ADC memory, the data structure being configured to store one or more flag bits for identifying each ADC operation performed and one or more ADC data bits.

G2. The back-end ADC and memory circuit of embodiment G1, further comprising: the comparator configured to receive an output of a photodiode, wherein the output of the comparator is based on the output of the photodiode.

G3. The back-end ADC and memory circuit of any one of embodiments G1-G2, wherein: a write operation to write data to the ADC memory is activated for a state of the state latch having a value of zero; and the data is written to the ADC memory responsive to the output of the comparator flipping.

G4. The back-end ADC and memory circuit of any one of embodiments G1-G3, wherein a write operation is disabled for a state of the state latch having a value of one.

G5. The back-end ADC and memory circuit of any one of embodiments G1-G4, wherein: a most significant bit of the one or more flag bits is used as a state signal for the state latch; and for the most significant bit of a last ADC operation having a value of one, the most significant bit of each other ADC operation has a value of zero.

G6. The back-end ADC and memory circuit of any one of embodiments G1-G5, wherein the ADC memory comprises a five bit memory, the one or more flag bits comprise one flag bit and the one or more ADC data bits comprise four ADC data bits.

G7. The back-end ADC and memory circuit of any one of embodiments G1-G5, wherein, for three ADC operations: the one or more flag bits comprise 1.5 flag bits; a flag bit for a first ADC operation of the three ADC operations is assigned a value of 00; a flag bit for a second ADC operation of the three ADC operations is assigned a value of 01; a flag bit for a third ADC operation of the three ADC operations is assigned a value of 1; the one or more ADC data bits comprise: N−2 bits of ADC data for the first ADC operation and the second ADC operation; and N−1 bits of ADC data for the third ADC operation.

G8. The back-end ADC and memory circuit of any one of embodiments G1-G5, wherein, for four ADC operations, the one or more flag bits comprise 2 flag bits and the one or more ADC data bits comprise N−2 bits of ADC data for each of four ADC operations.

G9. The back-end ADC and memory circuit of any one of embodiments G1-G5, wherein: for a first ADC operation and a second ADC operation of four ADC operations, the one or more flag bits comprise 3 flag bits and the one or more ADC data bits comprise N−3 bits of ADC data; for a third ADC operation of the four ADC operations, the one or more flag bits comprise 2 flag bits and the one or more ADC data bits comprise N−2 bits of ADC data; and for a fourth ADC operation of the four ADC operations, the one or more flag bits comprise 1 flag bit and the one or more ADC data bits comprise N−1 bits of ADC data.

What is claimed is:

1. An imaging system, comprising:
an active pixel comprising a photodiode and a plurality of transistors;
a comparator operatively coupled to the active pixel and configured to receive an output of the active pixel;
a write control circuit operatively coupled to the comparator, the write control circuit being configured to receive an output from the comparator; and
analog-to-digital conversion (ADC) memory operatively coupled to the write control circuit, wherein a data structure is stored in the ADC memory, the data structure being configured to store at least a first data string, wherein the first data string includes a set of flag bits for identifying each ADC operation performed and a set of ADC data bits;
wherein a write operation to write data to the ADC memory is activated based on a most significant bit of the first data string and
wherein the data is written to the ADC memory responsive to the output of the comparator flipping.

2. The imaging system of claim 1, wherein the most significant bit of the first data string is assigned a first value, the ADC memory is configured to hold an ADC code in response to the output of the comparator flipping.

3. The imaging system of claim 1, wherein the data written to the ADC memory comprises a time code written to the ADC memory during an ADC operation.

4. An imaging system, comprising:
an active pixel comprising a photodiode and a plurality of transistors;

a comparator operatively coupled to the active pixel and configured to receive an output of the active pixel;
a write control circuit operatively coupled to the comparator, the write control circuit being configured to receive an output from the comparator; and
analog-to-digital conversion (ADC) memory operatively coupled to the write control circuit, wherein a data structure is stored in the ADC memory, the data structure being configured to store at least a first data string, wherein the first data string includes a set of flag bits for identifying each ADC operation performed and a set of ADC data bits;
wherein the data structure is further configured to store a second data string corresponding to a time code written to memory during an ADC operation;
wherein the second data string includes a set of flag bits for identifying each ADC operation performed and a set of ADC data bits; and
wherein a flag bit of the set of flag bits of the second data string includes a most significant bit of a time code to be written to the ADC memory.

5. The imaging system of claim 4, wherein the write control circuit comprises:
a positive feedback circuit, an ADC code is not held by the second data string by the positive feedback circuit being held at a locked state.

6. The imaging system of claim 5, wherein the ADC operation comprises a final ADC operation of an ADC cycle, the ADC code written to the ADC memory is not overwritten in response to the comparator flipping.

7. The imaging system of claim 2, wherein the ADC memory comprises a memory array including a memory arrangement having a most significant bit coupled to the write control circuit.

8. An imaging system, comprising:
an active pixel comprising a photodiode and a plurality of transistors;
a comparator operatively coupled to the active pixel and configured to receive an output of the active pixel;
a write control circuit operatively coupled to the comparator, the write control circuit being configured to receive an output from the comparator; and
analog-to-digital conversion (ADC) memory operatively coupled to the write control circuit, wherein a data structure is stored in the ADC memory, the data structure being configured to store at least a first data string, wherein the first data string includes a set of flag bits for identifying each ADC operation performed and a set of ADC data bits;
wherein the data structure comprises the first data string and at least a second data string;
wherein the first data string corresponds to a first ADC operation and the second data string corresponds to a second ADC operation that is performed after the first ADC operation;
wherein the second data string includes an additional set of flag bits and an additional set of ADC data bits; and
wherein a number of ADC data bits included in the additional set of ADC data bits of the second data string is greater than a number of ADC data bits included in the set of ADC data bits of the first data string.

9. The imaging system of claim 2, wherein the set of flag bits and the set of ADC data bits are flexibly arranged such that different amounts of flag bits and ADC data bits are capable of being stored by the data structure.

10. An imaging system, comprising:
an active pixel comprising a photodiode and a plurality of transistors;
a comparator operatively coupled to the active pixel and configured to receive an output of the active pixel;
a write control circuit operatively coupled to the comparator, the write control circuit being configured to receive an output from the comparator; and
analog-to-digital conversion (ADC) memory operatively coupled to the write control circuit, wherein a data structure is stored in the ADC memory, the data structure being configured to store at least a first data string, wherein the first data string includes a set of flag bits for identifying each ADC operation performed and a set of ADC data bits;
wherein a most significant bit of the set of flag bits is used as a state signal; and
wherein, for the most significant bit of a last ADC operation having a first value, the most significant bit of each other ADC operation has a second value.

11. The imaging system of claim 10, wherein:
the first value comprises a logical 1 and the second value comprises a logical 0; or
the first value comprises a logical 0 and the second value comprises a logical 1.

12. An imaging system, comprising:
an active pixel comprising a photodiode and a plurality of transistors;
a comparator operatively coupled to the active pixel and configured to receive an output of the active pixel;
a write control circuit operatively coupled to the comparator, the write control circuit being configured to receive an output from the comparator; and
analog-to-digital conversion (ADC) memory operatively coupled to the write control circuit, wherein a data structure is stored in the ADC memory, the data structure being configured to store at least a first data string, wherein the first data string includes a set of flag bits for identifying each ADC operation performed and a set of ADC data bits;
wherein the write control circuit is further configured to:
determine whether writing is enabled or disabled based on a most significant bit of an ADC code written to memory during a final ADC operation.

13. A back-end analog-to-digital conversion (ADC) and memory circuit, comprising:
a comparator operatively coupled to an active pixel and configured to receive an output of the active pixel;
a write control circuit operatively coupled to the comparator and a state latch, the write control circuit being configured to receive an output from the comparator; and
analog-to-digital conversion (ADC) memory operatively coupled to the write control circuit, wherein a data structure is stored in the ADC memory, the data structure being configured to store at least a first data string, wherein the first data string includes a set of flag bits for identifying each ADC operation performed and a set of ADC data bits,
wherein a write operation to write data to the ADC memory is activated based on a most significant bit of the first data string;
wherein the data is written to the ADC memory responsive to the output of the comparator flipping;
wherein the most significant bit of the first data string is assigned a first value, the ADC memory is configured to hold an ADC code in response to the output of the comparator flipping; and wherein the data written to the ADC memory comprises a time code written to the ADC memory during an ADC operation.

14. A back-end analog-to-digital conversion (ADC) and memory circuit, comprising:
a comparator operatively coupled to an active pixel and configured to receive an output of the active pixel;
a write control circuit operatively coupled to the comparator and a state latch, the write control circuit being configured to receive an output from the comparator; and
analog-to-digital conversion (ADC) memory operatively coupled to the write control circuit, wherein a data structure is stored in the ADC memory, the data structure being configured to store at least a first data string, wherein the first data string includes a set of flag bits for identifying each ADC operation performed and a set of ADC data bits,
wherein the write control circuit further comprises:
a positive feedback circuit,
wherein the data structure is further configured to store a second data string corresponding to a time code written to memory during an ADC operation;
wherein the second data string includes a set of flag bits for identifying each ADC operation performed and a set of ADC data bits;
wherein a flag bit of the set of flag bits of the second data string includes a most significant bit of a time code to be written to the ADC memory;
wherein an ADC code is not held by the second data string by the positive feedback circuit being held at a locked state; and
wherein the ADC operation comprises a final ADC operation of an ADC cycle, the ADC code written to the ADC memory is not overwritten in response to the comparator flipping.

15. A back-end analog-to-digital conversion (ADC) and memory circuit, comprising:
a comparator operatively coupled to an active pixel and configured to receive an output of the active pixel;
a write control circuit operatively coupled to the comparator and a state latch, the write control circuit being configured to receive an output from the comparator; and
analog-to-digital conversion (ADC) memory operatively coupled to the write control circuit, wherein a data structure is stored in the ADC memory, the data structure being configured to store at least a first data string, wherein the first data string includes a set of flag bits for identifying each ADC operation performed and a set of ADC data bits,
wherein the data structure comprises the first data string and at least a second data string;
wherein the first data string corresponds to a first ADC operation and the second data string corresponds to a second ADC operation that is performed after the first ADC operation;
wherein the second data string includes an additional set of flag bits and an additional set of ADC data bits; and
wherein a number of ADC data bits included in the additional set of ADC data bits of the second data string is greater than a number of ADC data bits included in the set of ADC data bits of the first data string.

16. The back-end ADC and memory circuit of claim 15, wherein the set of flag bits and the set of ADC data bits are flexibly arranged such that different amounts of flag bits and ADC data bits are capable of being stored by the data structure.

17. A back-end analog-to-digital conversion (ADC) and memory circuit, comprising:
a comparator operatively coupled to an active pixel and configured to receive an output of the active pixel;
a write control circuit operatively coupled to the comparator and a state latch, the write control circuit being configured to receive an output from the comparator; and
analog-to-digital conversion (ADC) memory operatively coupled to the write control circuit, wherein a data structure is stored in the ADC memory, the data structure being configured to store at least a first data string, wherein the first data string includes a set of flag bits for identifying each ADC operation performed and a set of ADC data bits,
wherein a most significant bit of the set of flag bits is used as a state signal for the state latch;
wherein for the most significant bit of a last ADC operation having a first value, the most significant bit of each other ADC operation has a second value; and
wherein:
the first value comprises a logical 1 and the second value comprises a logical 0; or
the first value comprises a logical 0 and the second value comprises a logical 1.

18. A back-end analog-to-digital conversion (ADC) and memory circuit, comprising:
a comparator operatively coupled to an active pixel and configured to receive an output of the active pixel;
a write control circuit operatively coupled to the comparator and a state latch, the write control circuit being configured to receive an output from the comparator; and
analog-to-digital conversion (ADC) memory operatively coupled to the write control circuit, wherein a data structure is stored in the ADC memory, the data structure being configured to store at least a first data string, wherein the first data string includes a set of flag bits for identifying each ADC operation performed and a set of ADC data bits,
wherein the write control circuit is further configured to:
determine writing is enabled or disabled based on a most significant bit of an ADC code written to memory during a final ADC operation.

* * * * *